United States Patent
Creigh

(10) Patent No.: US 8,266,480 B2
(45) Date of Patent: *Sep. 11, 2012

(54) PHYSICAL CODING SUBLAYER FOR A MULTI-PAIR GIGABIT TRANSCEIVER

(75) Inventor: John L. Creigh, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 262 days.

This patent is subject to a terminal disclaimer.

(21) Appl. No.: 12/582,435

(22) Filed: Oct. 20, 2009

(65) Prior Publication Data

US 2010/0042865 A1 Feb. 18, 2010

Related U.S. Application Data

(63) Continuation of application No. 10/997,598, filed on Nov. 23, 2004, now Pat. No. 7,607,052, which is a continuation of application No. 09/556,549, filed on Apr. 24, 2000, now Pat. No. 6,823,483.

(60) Provisional application No. 60/130,616, filed on Apr. 22, 1999.

(51) Int. Cl.
*G06F 11/00* (2006.01)

(52) U.S. Cl. ........ 714/701; 714/746; 375/219; 375/341; 375/346

(58) Field of Classification Search ................... 714/701, 714/746; 375/219, 341, 348
See application file for complete search history.

(56) References Cited

U.S. PATENT DOCUMENTS

| | | |
|---|---|---|
| 3,963,990 A | 6/1976 | DiFonzo |
| 4,412,207 A | 10/1983 | Sinclair |
| 4,682,358 A | 7/1987 | Werner |
| 5,204,880 A | 4/1993 | Wurster et al. |
| 5,267,269 A | 11/1993 | Shih et al. |
| 5,305,353 A | 4/1994 | Weerackody |
| 5,325,400 A | 6/1994 | Co et al. |
| 5,399,996 A | 3/1995 | Yates et al. |
| 5,519,737 A | 5/1996 | Brun et al. |
| 5,604,741 A | 2/1997 | Samueli et al. |
| 5,640,605 A | 6/1997 | Johnson et al. |
| 5,651,029 A | 7/1997 | Yang et al. |
| 5,663,990 A | 9/1997 | Bolgiano et al. |
| 5,745,564 A | 4/1998 | Meek |
| 5,757,319 A | 5/1998 | Loo et al. |
| 5,774,498 A | 6/1998 | Oya et al. |
| 5,798,661 A | 8/1998 | Runaldue et al. |
| 5,914,673 A | 6/1999 | Jennings et al. |
| 5,917,340 A | 6/1999 | Manohar et al. |

(Continued)

OTHER PUBLICATIONS

Hatamian et al., "Design Considerations for Gigabit Ethernet 1000Base-T Twisted Pair Transceivers", IEEE, pp. 335-342, May 1998.

*Primary Examiner* — Guy Lamarre
(74) *Attorney, Agent, or Firm* — Thomas, Kayden, Horstemeyer & Risley, LLP

(57) ABSTRACT

A physical coding sublayer (PCS) transmitter circuit generates a plurality of encoded symbols according to a transmission standard. A symbol skewer skews the plurality of encoded symbols within a symbol clock time. A physical coding sublayer (PCS) receiver core circuit decodes a plurality of symbols based on encoding parameters. The symbols are transmitted using the encoding parameters according to a transmission standard. The received symbols are skewed within a symbol clock time by respective skew intervals. A PCS receiver encoder generator generates the encoding parameters.

27 Claims, 33 Drawing Sheets

U.S. PATENT DOCUMENTS

| | | |
|---|---|---|
| 5,930,683 A | 7/1999 | Plocher |
| 6,035,218 A | 3/2000 | Oh et al. |
| 6,144,400 A | 11/2000 | Ebisawa |
| 6,178,198 B1 | 1/2001 | Samueli et al. |
| 6,201,796 B1 | 3/2001 | Agazzi et al. |
| 6,259,745 B1 | 7/2001 | Chan |
| 6,377,640 B2 * | 4/2002 | Trans ............................ 375/354 |
| 6,594,304 B2 | 7/2003 | Chan |
| 6,804,304 B1 | 10/2004 | Chan |
| 6,931,073 B2 | 8/2005 | Chan |
| 7,180,951 B2 | 2/2007 | Chan |
| 7,607,052 B2 * | 10/2009 | Creigh ........................ 714/701 |

* cited by examiner

| Error Values | 1D Distance$^2$ Values |
|---|---|
| 00.00 | 0.00 |
| 00.01 / 11.11 | 0.00 |
| 00.10 / 11.10 | 0.01 |
| 00.11 / 11.01 | 0.10 |
| 01.00 / 11.00 | 1.00 |

FIG. 17

| Viterbi Input | Decision X | Error X | Rounded Error X | Error X2 | Decision Y | Error Y | Rounded Error Y | Error Y2 |
|---|---|---|---|---|---|---|---|---|
| 01.111 | 001 | 00.111 | 01.00 | 1.00 | 010 | 11.111 | 00.00 | 0.00 |
| 01.110 | 001 | 00.110 | 00.11 | 0.10 | 010 | 11.110 | 11.11 | 0.00 |
| 01.101 | 001 | 00.101 | 00.11 | 0.10 | 010 | 11.101 | 11.11 | 0.00 |
| 01.100 | 001 | 00.100 | 00.10 | 0.01 | 010 | 11.100 | 11.10 | 0.01 |
| 01.011 | 001 | 00.011 | 00.10 | 0.01 | 010 | 11.011 | 11.10 | 0.01 |
| 01.010 | 001 | 00.010 | 00.01 | 0.00 | 010 | 11.010 | 11.01 | 0.10 |
| 01.001 | 001 | 00.001 | 00.01 | 0.00 | 010 | 11.001 | 11.01 | 0.10 |
| 01.000 | 001 | 00.000 | 00.00 | 0.00 | 010 | 11.000 | 11.00 | 1.00 |
| 00.111 | 001 | 11.111 | 11.11 | 0.00 | 000 | 00.111 | 01.00 | 1.00 |
| 00.110 | 001 | 11.110 | 11.11 | 0.00 | 000 | 00.110 | 00.11 | 0.10 |
| 00.101 | 001 | 11.101 | 11.10 | 0.01 | 000 | 00.101 | 00.11 | 0.10 |
| 00.100 | 001 | 11.100 | 11.10 | 0.01 | 000 | 00.100 | 00.10 | 0.01 |
| 00.011 | 001 | 11.011 | 11.01 | 0.10 | 000 | 00.011 | 00.10 | 0.01 |
| 00.010 | 001 | 11.010 | 11.01 | 0.10 | 000 | 00.010 | 00.01 | 0.00 |
| 00.001 | 001 | 11.001 | 11.00 | 1.00 | 000 | 00.001 | 00.01 | 0.00 |
| 00.000 | 001 | 11.000 | 11.00 | 1.00 | 000 | 00.000 | 00.00 | 0.00 |

FIG. 18A

| Viterbi Input | Decision X | Error X | Rounded Error X | Error X2 | Decision Y | Error Y | Rounded Error Y | Error Y2 |
|---|---|---|---|---|---|---|---|---|
| 11.111 | 111 | 00.111 | 01.00 | 1.00 | 000 | 11.111 | 00.00 | 0.00 |
| 11.110 | 111 | 00.110 | 00.11 | 0.10 | 000 | 11.110 | 11.11 | 0.00 |
| 11.101 | 111 | 00.101 | 00.11 | 0.10 | 000 | 11.101 | 11.11 | 0.00 |
| 11.100 | 111 | 00.100 | 00.10 | 0.01 | 000 | 11.100 | 11.10 | 0.01 |
| 11.011 | 111 | 00.011 | 00.10 | 0.01 | 000 | 11.011 | 11.10 | 0.01 |
| 11.010 | 111 | 00.010 | 00.01 | 0.00 | 000 | 11.010 | 11.01 | 0.10 |
| 11.001 | 111 | 00.001 | 00.01 | 0.00 | 000 | 11.001 | 11.01 | 0.10 |
| 11.000 | 111 | 00.000 | 00.00 | 0.00 | 000 | 11.000 | 11.00 | 1.00 |
| 10.111 | 111 | 11.111 | 00.00 | 0.00 | 110 | 00.111 | 01.00 | 1.00 |
| 10.110 | 111 | 11.110 | 11.11 | 0.00 | 110 | 00.110 | 00.11 | 0.10 |
| 10.101 | 111 | 11.101 | 11.11 | 0.00 | 110 | 00.101 | 00.11 | 0.10 |
| 10.100 | 111 | 11.100 | 11.10 | 0.01 | 110 | 00.100 | 00.10 | 0.01 |
| 10.011 | 111 | 11.011 | 11.10 | 0.01 | 110 | 00.011 | 00.10 | 0.01 |
| 10.010 | 111 | 11.010 | 11.01 | 0.10 | 110 | 00.010 | 00.01 | 0.00 |
| 10.001 | 111 | 11.001 | 11.01 | 0.10 | 110 | 00.001 | 00.01 | 0.00 |
| 10.000 | 111 | 11.000 | 11.00 | 1.00 | 110 | 00.000 | 00.00 | 0.00 |

FIG. 18B

PHYSICAL CODING SUBLAYER FOR A MULTI-PAIR GIGABIT TRANSCEIVER

CROSS-REFERENCE TO RELATED APPLICATIONS

The present application is a continuation of U.S. patent application Ser. No. 10/997,598, filed Nov. 23, 2004, which is a continuation of U.S. patent application Ser. No. 09/556,549, filed Apr. 24, 2000, entitled, PHYSICAL CODING SUBLAYER FOR A MULTI-PAIR GIGABIT TRANSCEIVER, which claims priority on the basis of the following provisional application: Ser. No. 60/130,616, entitled PHYSICAL CODING SUBLAYER FOR A MULTI-PAIR GIGABIT TRANSCEIVER, filed Apr. 22, 1999.

The present invention is related to the co-pending patent application Ser. No. 09/557,274 entitled "PHY Control for a Multi-Pair Gigabit Transceiver" filed on Apr. 24, 2000, commonly owned by the assignee of the present application, the contents of which are herein incorporated b reference.

BACKGROUND OF THE INVENTION

1. Field of the Invention

The present invention relates generally to Physical Coding Sublayers in a high-speed multi-pair communication system. More particularly, the invention relates to a Physical Coding Sublayer that operates in accordance with the IEEE 802.3ab standard for Gigabit Ethernet (also called 1000BASE-T standard).

2. Description of Related Art

In recent years, local area network (LAN) applications have become more and more prevalent as a means for providing local interconnect between personal computer systems, work stations and servers. Because of the breadth of its installed base, the 10BASE-T implementation of Ethernet remains the most pervasive if not the dominant, network technology for LANs. However, as the need to exchange information becomes more and more imperative, and as the scope and size of the information being exchanged increases, higher and higher speeds (greater bandwidth) are required from network interconnect technologies. Among the high-speed LAN technologies currently available, fast Ethernet, commonly termed 100BASE-T, has emerged as the clear technological choice. Fast Ethernet technology provides a smooth, non-disruptive evolution from the 10 megabit per second (Mbps) performance of 10BASE-T applications to the 100 Mbps performance of 100BASE-T. The growing use of 100BASE-T interconnections between servers and desktops is creating a definite need for an even higher speed network technology at the backbone and server level.

One of the more suitable solutions to this need has been proposed in the IEEE 802.3ab standard for gigabit Ethernet, also termed 1000BASE-T. Gigabit Ethernet is defined as able to provide 1 gigabit per second (Gbps) bandwidth in combination with the simplicity of an Ethernet architecture, at a lower cost than other technologies of comparable speed. Moreover, gigabit Ethernet offers a smooth, seamless upgrade path for present 10BASE-T or 100BASE-T Ethernet installations.

In order to obtain the requisite gigabit performance levels, gigabit Ethernet transceivers are interconnected with a multi-pair transmission channel architecture In particular, transceivers are interconnected using four separate pairs of twisted Category-5 copper wires. Gigabit communication, in practice, involves the simultaneous, parallel transmission of information signals, with each signal conveying information at a rate of 250 megabits per second b/s). Simultaneous, parallel transmission of four information signals over four twisted wire pairs poses substantial challenges to bidirectional communication transceivers, even though the data rate on any one wire pair is "only" 250 Mbps.

In particular, the Gigabit Ethernet standard requires that digital information being processed for transmission be symbolically represented in accordance with a five-level pulse amplitude modulation scheme (PAM-5) and encoded in accordance with an 8-state Trellis coding methodology. Coded information is then communicated over a multi-dimensional parallel transmission channel to a designated receiver, where the original information must be extracted (demodulated) from a multi-level signal. In Gigabit Ethernet, it is important to note that it is the concatenation of signal samples received simultaneously on all four twisted pair lines of the channel that defines a symbol. Thus, demodulator/decoder architectures must be implemented with a degree of computational complexity that allows them to accommodate not only the "state width" of Trellis coded signals, but also the "dimensional depth" represented by the transmission channel.

Computational complexity is not the only challenge presented to modern gigabit capable communication devices. Perhaps, a greater challenge is that the complex computations required to process "deep" and "wide" signal representations must be performed in an extremely short period of time. For example, in gigabit applications, each of the four-dimensional signal samples, formed by the four signals received simultaneously over the four twisted wire pairs, must be efficiently decoded within a particular allocated symbol time window of about 8 nanoseconds.

The trellis code constrains the sequences of symbols that can be generated, so that valid sequences are only those that correspond to a possible path in the trellis diagram of FIG. 5. The code only constrains the sequence of 4-dimensional code-subsets that can be transmitted, but not the specific symbols from the code-subsets that are actually transmitted. The IEEE 802.3ab Draft Standard specifies the exact encoding riles for all possible combinations of transmitted bits.

One important observation is that this trellis code does not tolerate pair swaps. If, in a certain sequence of symbols generated by a transmitter operating according to the specifications of the 1000BASE-T standard, two or more wire pairs are interchanged in the connection between transmitter and receiver (this would occur if the order of the pairs is not properly maintained in the connection), the sequence of symbols received by the decoder will not, in general, be a valid sequence for this code. In this case, it will not be possible to properly decode the sequence. Thus, compensation for a pair swap is a necessity in a gigabit Ethernet transceiver.

SUMMARY OF THE INVENTION

A physical coding sublayer (PCS) transmitter circuit generates a plurality of encoded symbols according to a transmission standard. A symbol skewer skews the plurality of encoded symbols within a symbol clock time. A physical coding sublayer (PCS) receiver core circuit decodes a plurality of symbols based on encoding parameters The symbols are transmitted using the encoding parameters according to a transmission standard. The received symbols are skewed within a symbol clock time by respective skew intervals. A PCS receiver encoder generator generates the encoding parameters.

BRIEF DESCRIPTION OF THE DRAWINGS

These and other features, aspects and advantages of the present invention will be more fully understood when considered with respect to the following detailed description, appended claims and accompanying drawings, wherein:

FIG. 17 shows an exemplary lookup table suitable for use in computing squared one-dimensional error terms.

FIGS. 18A and 18B are an exemplary look-up table which describes the computation of the decisions and squared errors for both the X and Y subsets directly from one component of the 4D Viterbi input of the 1D slicers of FIG. 7.

DETAILED DESCRIPTION OF THE INVENTION

Figure 1:
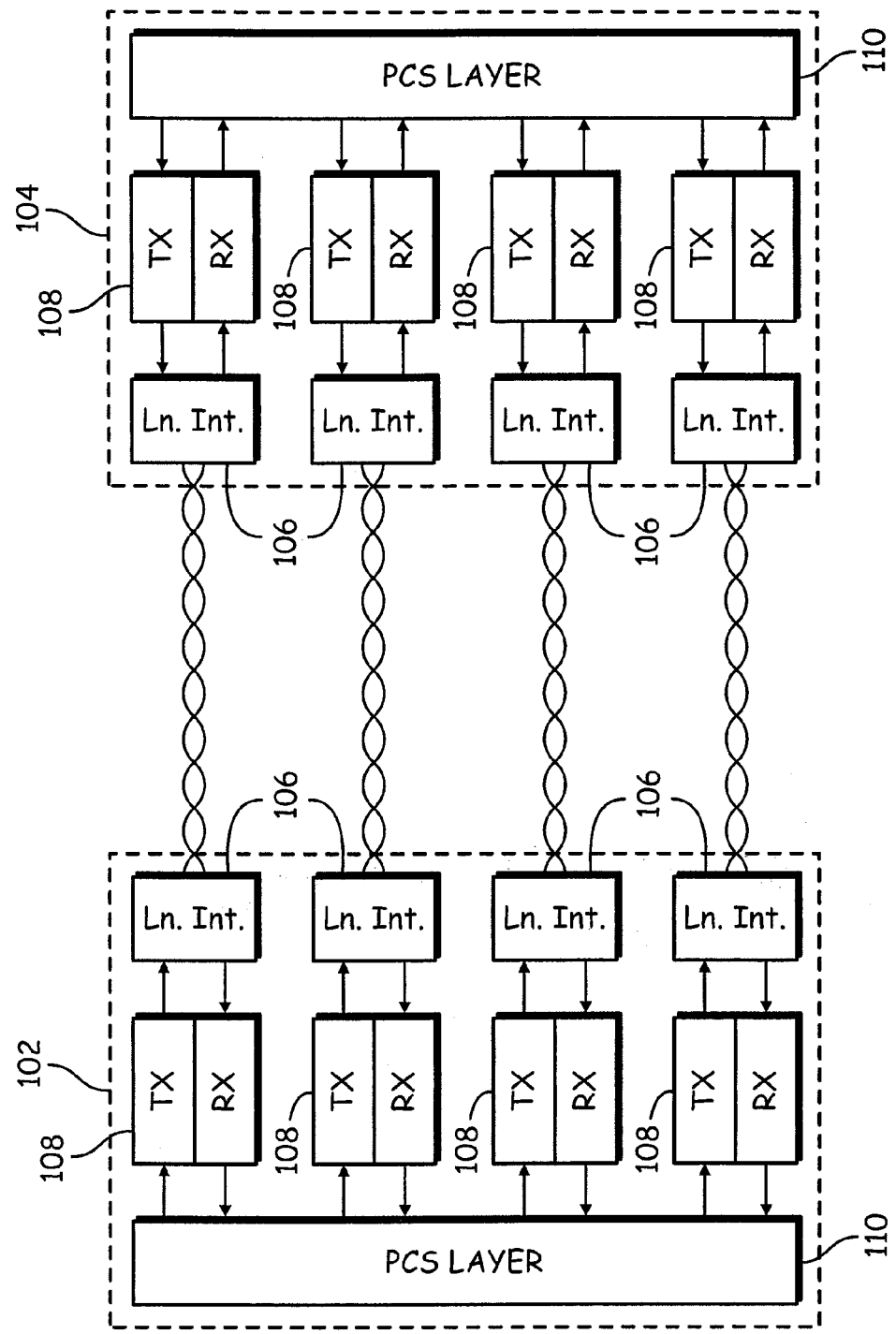
FIG. 1 is a simplified block diagram of a high-speed bidirectional communication system exemplified by two transceivers configured to communicate over multiple twisted-pair wiring channels.

In the context of an exemplary integrated circuit-type bidirectional communication system, the present invention may be characterized as a system and method for compensating pair swap to facilitate high-speed decoding of signal samples encoded according to the trellis code specified in the IEEE 802.3ab standard (also termed 1000BASE-T standard).

As will be understood by one having skill in the art, high-speed data transmission is often limited by the ability of decoder systems to quickly, accurately and effectively process a transmitted symbol within a given time period. In a 1000BASE-T application (aptly termed gigabit) for example, the symbol decode period is typically taken to be approximately 8 nanoseconds. Pertinent to any discussion of symbol decoding is the realization that 1000BASE-T systems are layered to simultaneously receive four one-dimensional (1D) signals representing a 4-dimensional (4D) signal (each 1D signal corresponding to a respective one of four twisted pairs of cable) with each of the 1D signals represented by five analog levels. Accordingly, the decoder circuitry portions of transceiver demodulation blocks require a multiplicity of operational steps to be taken in order to effectively decode each symbol. Such a multiplicity of operations is computationally complex and often pushes the switching speeds of integrated circuit transistors which make up the computational blocks to their fundamental limits.

The transceiver decoder of the present invention is able to substantially reduce the computational complexity of symbol decoding, and thus avoid substantial amounts of propagation delay (i.e., increase operational speed), by making use of truncated (or partial) representations of various quantities that make up the decoding/ISI compensation process.

Sample slicing is performed in a manner such that one-dimensional (1D) square error terms are developed in a representation having, at most, three bits if the terms signify a Euclidian distance, and one bit if the terms signify a Hamming distance. Truncated 1D error term representation significantly reduces subsequent error processing complexity because of the fewer number of bits.

Likewise, ISI compensation of sample signals, prior to Viterbi decoding, is performed in a DFE, operatively responsive to tentative decisions made by the Viterbi. Use of tentative decisions, instead of a Viterbi's final decision, reduces system latency by a factor directly related to the path memory sequence distance between the tentative decision used, and the final decision, i.e., if there are N steps in the path memory from input to final decision output, and latency is a function of N, forcing the DFE with a tentative decision at step N-6 causes latency to become a function of N-6. A trade-off between accuracy and latency reduction may be made by choosing a tentative decision step either closer to the final decision point or closer to the initial point.

Computations associated with removing impairments due to intersymbol interference (ISI) are substantially simplified, in accordance with the present invention, by a combination of techniques that involves the recognition that intersymbol interference results from two primary causes, a partial response pulse shaping filter in a transmitter and from the characteristics of an unshielded twisted pair transmission channel. During the initial start-up, ISI impairments are processed in independent portions of electronic circuitry, with ISI caused by a partial response pulse shaping filter being compensated in an inverse partial response filter in a feedforward equalizer (FFE) at system startup, and ISI caused by transmission channel characteristics compensated by a decision feedback equalizer (DFE) operating in conjunction with a multiple decision feedback equalizer (MDFE) stage to provide ISI pre-compensated signals (representing a symbol) to a decoder stage for symbolic decoding. Performing the computations necessary for ISI cancellation in a bifurcated manner allows for fast DFE convergence as well as assists a transceiver in achieving fast acquisition in a robust and reliable manner. After the start-up, all ISI is compensated by the combination of the DFE and MDFE.

In order to appreciate the advantages of the present invention, it will be beneficial to describe the invention in the context of an exemplary bidirectional communication device, such as a gigabit Ethernet transceiver. The particular exemplary implementation chosen is depicted in FIG. 1, which is a simplified block diagram of a multi-pair communication system operating in conformance with the IEEE 802.3ab standard for one gigabit (Gb/s) Ethernet full-duplex communication over four twisted pairs of Category-5 copper wires.

The communication system illustrated in FIG. 1 is represented as a point-to-point system, in order to simplify the explanation, and includes two main transceiver blocks 102 and 104, coupled together with four twisted-pair cables. Each of the wire pairs is coupled between the transceiver blocks through a respective one of four line interface circuits 106 and communicate information developed by respective ones of four transmitter/receiver circuits (constituent transceivers) 108 coupled between respective interface circuits and a physical coding sublayer (PCS) block 110. Four constituent transceivers 108 are capable of operating simultaneously at 250 megabits per second (Mb/s), and are coupled through respective interface circuits to facilitate full-duplex bidirectional operation. Thus, one Gb/s communication throughput of each of the transceiver blocks 102 and 104 is achieved by using four 250 Mb/s (125 megabaud at 2 bits per symbol) constituent transceivers 108 for each of the transceiver blocks and four twisted pairs of copper cables to connect the two transceivers together.

Figure 2:
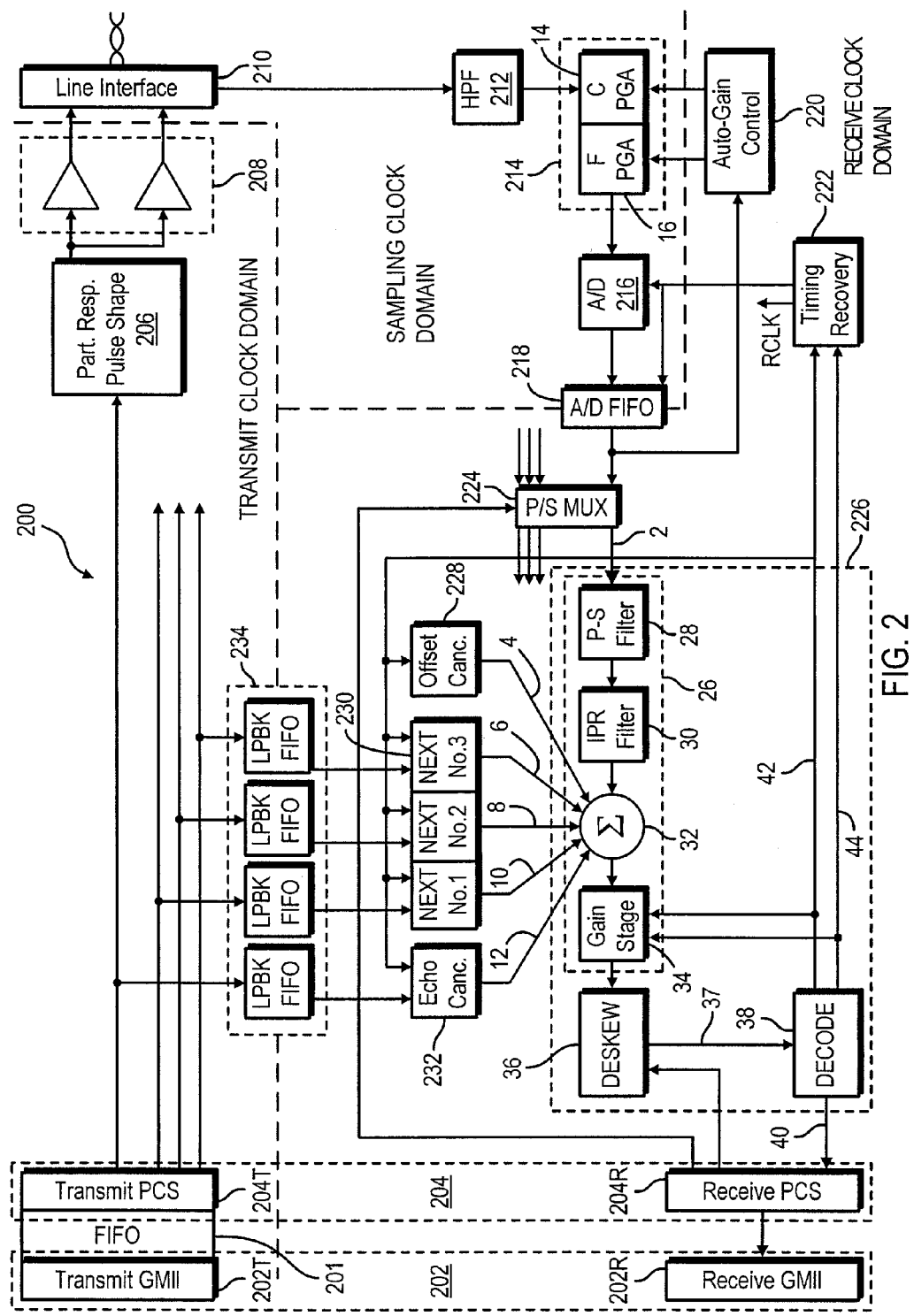
FIG. 2 is a simplified block diagram of a bidirectional communication transceiver system.

FIG. 2 is a simplified block diagram of the functional architecture and internal construction of an exemplary transceiver block, indicated generally at 200, such as transceiver 102 of FIG. 1. Since the illustrated transceiver application relates to gigabit Ethernet transmission, the transceiver will be referred to as the "gigabit transceivers". For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks in the signal lines in the exemplary embodiment of FIG. 2 perform and carry 4-dimensional (4-D) functions and 4-D signals, respectively. By 4-D, it is meant that the data from the four constituent transceivers are used simultaneously. In order to clarify signal relationships in FIG. 2, thin lines correspond to 1-dimensional functions or signals (i.e., relating to only a single transceiver), and thick lines correspond to 4-D functions or signals (relating to all four transceivers).

With reference to FIG. 2, the gigabit transceiver 200 includes a Gigabit Medium Independent Interface (GMII) block 202, a Physical Coding Sublayer (PCS) block 204, a pulse shaping filter 206, a digital-to-analog (DA) converter 208, a line interface block 210, a highpass filter 212, a programmable gain amplifier (PGA) 214, an analog-to-digital (A/D) converter 216, an automatic gain control block 220, a timing recovery block 222, a pair-swap multiplexer block 224, a demodulator 226, an offset canceller 228, a near-end crosstalk (NEXT) canceler block 230 having three NEXT cancelers, and an echo canceler 232. The gigabit transceiver 200 also includes an A/D first-in-first-out buffer (FIFO) 218 to facilitate proper transfer of data from the analog clock region to the receive clock region, and a FIFO block 234 to facilitate proper transfer of data from the transmit clock region to the receive clock region. The gigabit transceiver 200 can optionally include a filter to cancel far-end crosstalk noise (FEXT canceler).

On the transmit path, the transmit section 202T of the GMII block 202 receives data from a Media Access Control (MAC) module (not shown in FIG. 2) and passes the digital data to the transmit section 204T of the PCS block 204 via a FIFO 201 in byte-wide format at the rate of 125 MHz. The FIFO 201 is essentially a synchronization buffer device and is provided to ensure proper data transfer from the MAC layer to the Physical Coding (PHY) layer, since the transmit clock of the PHY layer is not necessarily synchronized with the clock of the MAC layer. This small FIFO 201 can be constructed with from three to five memory cells to accommodate the elasticity requirement which is a function of frame size and frequency offset.

The transmit section 204T of the PCS block 204 performs scrambling and coding of the data and other control functions. Transmit section 204T of the PCS block 204 generates four 1D symbols, one for each of the four constituent transceivers. The 1D symbol generated for the constituent transceiver depicted in FIG. 2 is filtered by a partial response pulse shaping filter 206 so that the radiated emission of the output of the transceiver may fall within the EMI requirements of the Federal Communications Commission. The pulse shaping filter 206 is constructed with a transfer function 0.75+0.25 $z^{-1}$, such that the power spectrum of the output of the transceiver falls below the power spectrum of a 100Base-Tx signal. The 100Base-Tx is a widely used and accepted Fast Ethernet standard for 100 Mb/s operation on two pairs of category-5 twisted pair cables. The output of the pulse shaping filter 206 is converted to an analog signal by the D/A converter 208 operating at 125 MHz. The analog signal passes through the line interface block 210, and is placed on the corresponding twisted pair cable for communication to a remote receiver.

On the receive path, the line interface block 210 receives an analog signal from the twisted pair cable. The received analog signal is preconditioned by a highpass filter 212 and a programmable gain amplifier (PGA) 214 before being converted to a digital signal by the A/D converter 216 operating at a sampling rate of 125 MHz. Sample timing of the A/D converter 216 is controlled by the output of a timing recovery block 222 controlled, in turn, by decision and error signals from a demodulator 226. The resulting digital signal is properly transferred from the analog clock region to the receive clock region by an A/D FIFO 218, an output of which is also used by an automatic gain control circuit 220 to control the operation of the PGA 214*b*.

The output of the A/D FIFO 218, along with the outputs from the A/D FIFOs of the other three constituent transceivers are inputted to a pair-swap multiplexer block 224. The pair-swap multiplexer block 224 is operatively responsive to a 4D pair-swap control signal, asserted by the receive section 204R of PCS block 204, to sort out the 4 input signals and send the correct signals to the respective demodulators of the 4 constituent transceivers. Since the coding scheme used for the gigabit transceivers 102, 104 (referring to FIG. 1) is based on the fact that each twisted pair of wire corresponds to a 1D constellation, and that the four twisted pairs, collectively, form a 4D constellation, for symbol decoding to function properly, each of the four twisted pairs must be uniquely identified with one of the four dimensions. Any undetected swapping of the four pairs would necessarily result in erroneous decoding.

Demodulator 226 receives the particular received signal 2 intended for it from the pair-swap multiplexer block 224, and functions to demodulate and decode the signal prior to directing the decoded symbols to the PCS layer 204 for transfer to the MAC. The demodulator 226 includes a feedforward equalizer (FFE) 26, a de-skew memory circuit 36 and a trellis decoder 38. The FFE 26 includes a pulse shaping filter 28, a programmable inverse partial response (IPR) filter 30, a summing device 32, and an adaptive gain stage 34. Functionally, the FFE 26 may be characterized as a least-mean-squares (LMS) type adaptive filter which performs channel equalization as described in the following.

Pulse shaping filter 28 is coupled to receive an input signal 2 from the pair swap MUX 224 and functions to generate a precursor to the input signal 2. Used for timing recovery, the precursor might be described as a zero-crossing indicator inserted at a precursor position of the signal. Such a zero-crossing assists a timing recovery circuit in determining phase relationships between signals, by giving the timing recovery circuit an accurately determinable signal transition point for use as a reference. The pulse shaping filter 28 can be placed anywhere before the decoder block 38. In the exemplary embodiment of FIG. 2, the pulse shaping filter 28 is positioned at the input of the FFE 26.

The pulse shaping filter 28 transfer function may be represented by a function of the form $-\gamma+z^{-1}$, with $\gamma$ equal to $\frac{1}{16}$ for short cables (less than 80 meters) and $\frac{1}{8}$ for long cables (more than 80 m). The determination of the length of a cable is based on the gain of the coarse PGA section 14 of the PGA 214. The PGA 214 of FIG. 2 also includes a fine PGA section 16.

A programmable inverse partial response (IPR) filter 30 is coupled to receive the output of the pulse shaping filter 28, and functions to compensate the ISI introduced by the partial response pulse shaping in the transmitter section of the remote transceiver which transmitted the analog equivalent of the digital signal 2. The IPR filter 30 transfer function may be represented by a function of the form $1/(1+Kz^{-1})$ and may also be described as dynamic. In particular, the filter's K value is dynamically varied from an initial non-zero setting, valid at system start-up, to a final setting. K may take any positive value strictly less than 1. In the illustrated embodiment, K might take on a value of about 0.484375 during startup, and be dynamically ramped down to zero after convergence of the decision feedback equalizer included inside the trellis decoder 38.

The foregoing is particularly advantageous in high-speed data recovery systems, since by compensating the transmitter induced ISI at start-up, prior to decoding, it reduces the amount of processing required by the decoder to that required only for compensating transmission channel induced ISI. This "bifurcated" or divided ISI compensation process allows for fast acquisition in a robust and reliable manner. After DFE convergence, noise enhancement in the feedforward equalizer 26 is avoided by dynamically ramping the feedback gain factor K of the IPR filter 30 to zero, effectively removing the filter from the active computational path.

A summing device 32 subtracts from the output of the IPR filter 30 the signals 4, 6-10, and 12 received from the offset canceler 228, the NEXT cancelers 230, and the echo canceler 232. The offset canceler 228 is an adaptive filter which generates an estimate of the offset introduced at the analog front end which includes the PGA 214 and the A/D converter 216. Likewise, the three NEXT cancelers 230 are adaptive filters used for modeling the NEXT impairments in the received signal caused by the symbols sent by the three local transmitters of the other three constituent transceivers. The impairments are due to a near-end crosstalk mechanism between the pairs of cables. Since each receiver has access to the data transmitted by the other three local transmitters, it is possible to nearly replicate the NEXT impairments through filtering. Referring to FIG. 2, the three NEXT cancelers 230 filter the signals sent by the PCS block 204 to the other three local transmitters and produce three signals 6, 8, and 10 replicating the respective NEXT impairments. By subtracting these three signals 6, 8, and 10 from the output of the IPR filter 30, the NEXT impairments are approximately canceled.

Due to the bi-directional nature of the channel, each local transmitter causes an echo impairment on the received signal of the local receiver with which it is paired to form a constituent transceiver. The echo canceler 232 is an adaptive filter used for modeling the echo impairment. The echo canceler 232 filters the signal sent by the PCS block 204 to the local transmitter associated with the receiver, and produces a replica of the echo impairment. By subtracting this replica signal 12 from the output of the IPR filter 30, the echo impairment is approximately canceled.

Following NEXT, echo and offset cancellation, the signal is coupled to an adaptive gain stage 34 which functions to fine tune the gain of the signal path using a zero-forcing LMS algorithm. Since this adaptive gain stage 34 trains on the basis of errors of the adaptive offset, NEXT and echo cancellation filters 228, 230 and 232 respectively, it provides a more accurate signal gain than the PGA 214.

The output of the adaptive gain stage 34, which is also the output of the FFE 26, is inputted to a de-skew memory 36. The de-skew memory 36 is a four-dimensional function block, i.e., it also receives the outputs of the three FFEs of the other three constituent transceivers as well as the output of FFE 26 illustrated in FIG. 2. There may be a relative skew in the outputs of the 4 FFEs, which are the 4 signal samples representing the 4 symbols to be decoded. This relative skew can be up to 50 nanoseconds, and is due to the variations in the way the copper wire pairs are twisted. In order to correctly decode the four symbols, the four signal samples must be properly aligned. The de-skew memory is responsive to a 4D de-skew control signal asserted by the PCS block 204 to de-skew and align the four signal samples received from the four FFEs. The four de-skewed signal samples 37 are then directed to the trellis decoder 38 for decoding.

Data received at the local transceiver was encoded, prior to transmission by a remote transceiver, using an 8-state four-dimensional trellis code. In the absence of inter-symbol interference (ISI), a proper 8-state Viterbi decoder would provide optimal decoding of this code. However, in the case of Gigabit Ethernet, the Category-5 twisted pair cable introduces a significant amount of ISI. In addition, as was described above in connection with the FFE stage 26, the partial response falter of the remote transmitter on the other end of the communication channel also contributes a certain component of ISI. Therefore, during nominal operation, the trellis decoder 38 must decode both the trellis code and compensate for at least transmission channel induced ISI, at a substantially high computational rate, corresponding to a symbol rate of about 125 MHz.

In the illustrated embodiment of the gigabit transceiver of FIG. 2, the trellis decoder 38 suitably includes an 8-state Viterbi decoder for symbol decoding, and incorporates circuitry which implements a decision-feedback sequence estimation approach in order to compensate the ISI components perturbing the signal which represents transmitted symbols. The 4D output 40 of the trellis decoder 38 is provided to the receive section 204R of the PCS block. The receive section 204R of PCS block de-scrambles and further decodes the symbol stream and then passes the decoded packets and idle stream to the receive section of the GMII block 202 for transfer to the MAC module.

The 4D outputs 42 and 44, which represent the error and tentative decision signals defined by the decoder, respectively, are provided to the timing recovery block 222, whose output controls the sampling time of the A/D converter 216. One of the four components of the error 42 and one of the four components of the tentative decision 44 correspond to the signal stream pertinent to the particular receiver section, illustrated in FIG. 2, and are provided to the adaptive gain stage 34 to adjust the gain of the signal path.

The component of the 4D error 42, which corresponds to the receiver shown in FIG. 2, is further provided to the adaptation circuitry of each of the adaptive offset, NEXT and echo cancellation filters 228, 230, 232. During startup, adaptation circuitry uses the error component to train the filter coefficients. During normal operation, adaptation circuitry uses the error component to periodically update the filter coefficients.

The programmable IPE filter 30 compensates the ISI introduced by the partial response pulse shaping filter (identical to filter 206 of FIG. 2) in the transmitter of the remote transceiver which transmitted the analog equivalent of the digital signal 2. The IPR filter 30 is preferably a infinite impulse response filter having a transfer function of the form $1/(1+Kz^{-1})$. In one embodiment, K is 0.484375 during the startup of the constituent transceiver, and is slowly ramped down to zero after convergence of the decision feedback equalizer (DFE) 612 (FIGS. 6 and 15) which resides inside the trellis decoder 38 (FIG. 2). K may be any positive number strictly less than 1. The transfer function $1/(1+Kz^{-1})$ is approximately the inverse of the transfer function of the partial response pulse shaping filter 206 (FIG. 2) which is $0.75+0.25 z^{-1}$ to compensate the ISI introduced by the partial response pulse shaping filter (identical to the filter 206 of FIG. 2) included in the transmitter of the remote transceiver.

During the startup of the local constituent transceiver, the DFE 612 (FIGS. 6 and 15) must be trained until its coefficients converge. The training process may be performed with a least mean squares (LMS) algorithm. Conventionally, the LMS algorithm is used with a known sequence for training. However, in one embodiment of the gigabit Ethernet transceiver depicted in FIG. 2, the DFE 612 is not trained with a known sequence, but with an unknown sequence of decisions outputted from the decoder block 1502 (FIG. 15) of the trellis decoder 38 (FIG. 2). In order to converge, the DFE 612 must correctly output an estimate of the ISI present in the incoming signal samples based on the sequence of past decisions. This ISI represents interference from past data symbols, and is commonly termed postcursor ISI. After convergence of the DFE 612, the DFE 612 can accurately estimate the postcursor ISI.

It is noted that the twisted pair cable response is close to at minimum-phase response. It is well-known in the art that when the channel has minimum phase response, there is no precursor ISI, i.e., interference from future symbols. Thus, in the case of the gigabit Ethernet communication system, the precursor ISI is negligible. Therefore, there is no need to compensate for the precursor ISI.

At startup, without the programmable IPR filter 30, the DFE would have to compensate for both the postcursor ISI and the ISI introduced by the partial response pulse shaping filter in the remote transmitter. This would cause slow and difficult convergence for the DFE 612. Thus, by compensating for the ISI introduced by the partial response pulse shaping filter in the remote transmitter, the programmable IPR filter 30 helps speed up the convergence of the DFE 612. However, the programmable IPR filter 30 may introduce noise enhancement if it is kept active for a long time. "Noise enhancement" means that noise is amplified more than the signal, resulting in a decrease of the signal-to-noise ratio. To prevent noise enhancement, after startup, the programmable IPR filter 30 is slowly deactivated by gradually changing the transfer function from $1/(1+Kz^{-1})$ to 1. This is done by slowly ramping K down to zero. This does not affect the function of the DFE 612) since, after convergence, the DEE 612 can easily compensate for both the postcursor ISI and the ISI introduced by the partial response pulse shaping filter.

As implemented in the exemplary Ethernet gigabit transceiver, the trellis decoder 38 functions to decode symbols that have been encoded in accordance with the trellis code specified in the IEEE 802.5ab standard (1000BASE-T, or gigabit). As mentioned above, information signals are communicated between transceivers at a symbol rate of about 125 MHz, on each of the pairs of twisted copper cables that make up the transmission channel. In accordance with established Ethernet communication protocols, information signals are modulated for transmission in accordance with a 5-level Pulse Amplitude Modulation (PAM-5) modulation scheme. Thus, since five amplitude levels represent information signals, it is understood that symbols can be expressed in a three bit representation on each twisted wire pair.

Figures 4A, 4B:
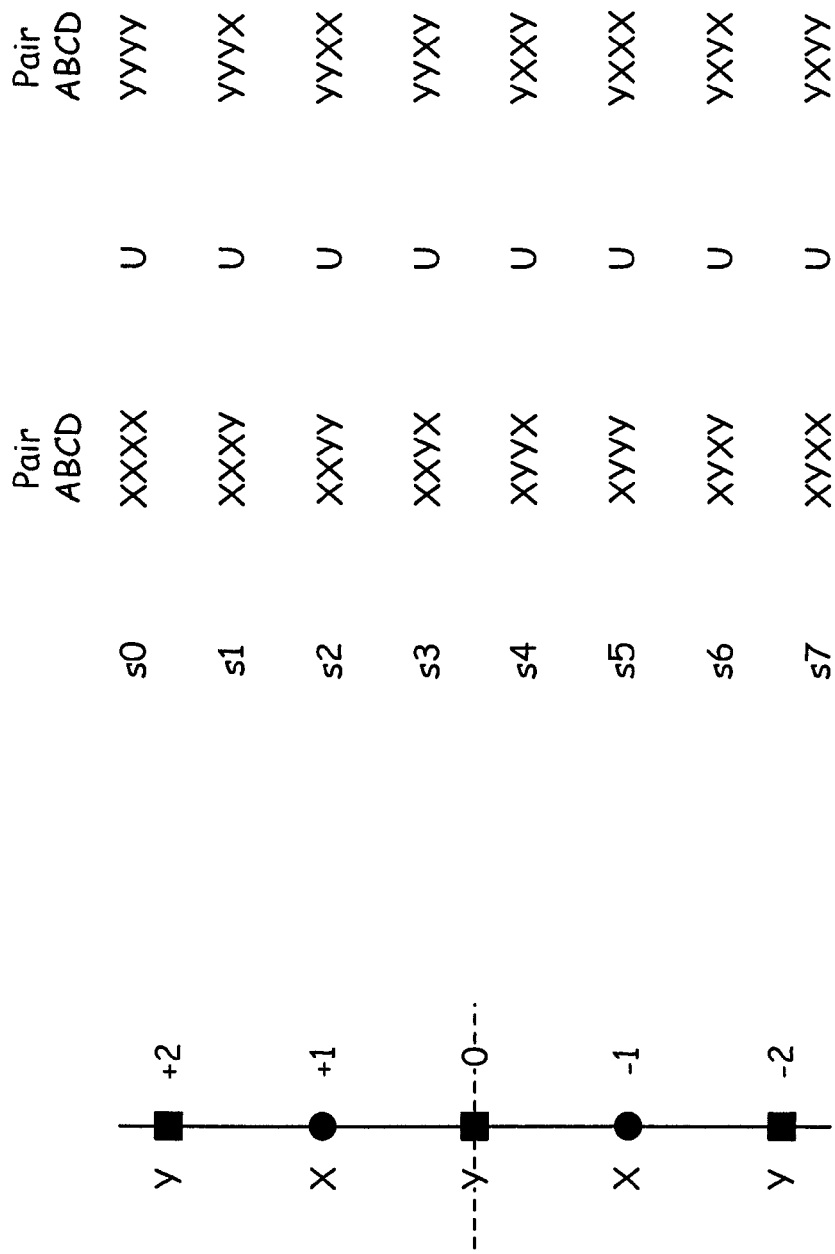
FIG. 4A illustrates an exemplary PAM-5 constellation and the one-dimensional symbol-subset partitioning.
FIG. 4B illustrates the eight 4D code-subsets constructed from the one-dimensional symbol-subset partitioning of the constellation of FIG. 4A.

FIG. 4A depicts an exemplary PAM-5 constellation and the one-dimensional symbol subset partitioning within the PAM-5 constellation. As illustrated in FIG. 4A, the constellation is a representation of five amplitude levels, +2, +1, 0, −1, −2, in decreasing order. Symbol subset partitioning occurs by dividing the five levels into two 1D subsets, X and Y, and assigning X and Y subset designations to the five levels on an alternating basis. This +2, 0 and −2 are assigned to the Y subset; +1 and −1 are assigned to the X subset. The partitioning could, of course, be reversed, with +1 and −1 being assigned a Y designation.

It should be recognized that although the X and Y subsets represent different absolute amplitude levels, the vector distance between neighboring amplitudes within the subsets are the same, i.e., two (2). The X subset therefore includes amplitude level designations which differ by a value of two, (−1, +1), as does the Y subset (−2, 0, +2). This partitioning offers certain advantages to slicer circuitry in a decoder, as will be developed further below.

In FIG. 4B, the 1D subsets have been combined into 4D subsets representing the four twisted pairs of the transmission channel. Since 1D subset definition is binary (X:Y) and there are four wire pairs, there are sixteen possible combinations of 4D subsets. These sixteen possible combinations are assigned into eight 4D subsets, s0 to s7 inclusive, in accordance with a trellis coding scheme. Each of the 4D subsets (also termed code subsets) are constructed of a union of two complementary 4D sub-subsets, e.g., code-subset three (identified as s3) is the union of sub-subset X:X:Y:X and its complementary image Y:Y:X:Y.

Figure 3:
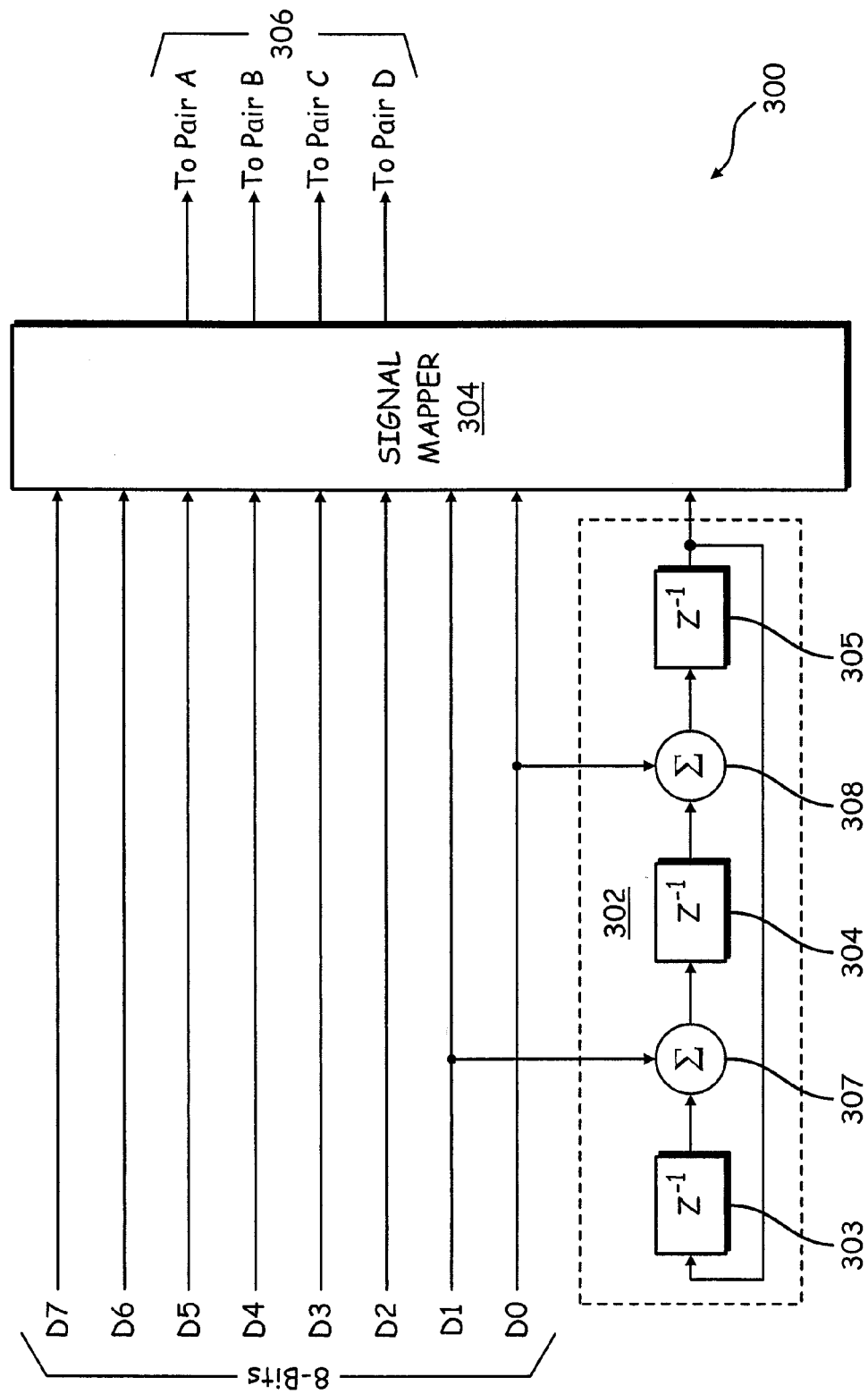
FIG. 3 is a simplified block diagram of an exemplary trellis encoder

Data being processed for transmission is encoded using the above described 4-dimensional (4D) 8-state trellis code, in an encoder circuit, such as illustrated in the exemplary block diagram of FIG. 3, according to an encoding algorithm specified in the 1000BASE-T standard.

FIG. 3 illustrates an exemplary encoder 300, which is commonly provided in the transmit PCS portion of a gigabit transceiver. The encoder 300 is represented in simplified form as a convolutional encoder 302 in combination with a signal mapper 304. Data received by the transmit PCS from the MAC module via the transmit gigabit medium independent interface are encoded with control data and scrambled, resulting in an eight bit data word represented by input bits $D_0$ through $D_7$ which are introduced to the signal mapper 304 of the encoder 300 at a data rate of about 125 MHz. The two least significant bits, $D_0$ and $D_1$, are also inputted, in parallel fashion, into a convolutional encoder 302, implemented as a linear feedback shift register, in order to generate a redundancy bit C which is a necessary condition for the provision of the coding gain of the code.

As described above, the convolutional encoder 302 is a linear feedback shift register, constructed of three delay elements 303, 304 and 305 (conventionally denoted by $z^{-1}$) interspersed with and separated by two summing circuits 307 and 308 which function to combine the two least significant bits (LSBs), $D_0$ and $D_1$, of the input word with the output of the first and second delay elements, 303 and 304 respectively. The two time sequences formed by the streams of the two LSBs are convolved with the coefficients of the linear feedback shift register to produce the time sequence of the redundancy bit C. Thus, the convolutional encoder might be viewed as a state machine.

The signal mapper 304 maps the 9 bits ($D_0$-$D_7$ and C) into a particular 4-dimensional constellation point 306. Each of the four dimensions uniquely corresponds to one of the four twisted wire pairs. In each dimension, the possible symbols are from the symbol set $\{-2, -1, 0, +1, +2\}$. The symbol set is partitioned into two disjoint symbol subsets X and Y, with X=$\{-1, +1\}$ and Y=$\{-2, 0, +2\}$, as described above and shown in FIG. 4A.

Referring to FIG. 4B, the eight code subsets s0 through s7 define the constellation of the code in the signal space. Each of the code subsets is formed by the union of two code sub-subsets, each of the code sub-subsets being formed by 4D patterns obtained from concatenation of symbols taken from the symbol subsets X and Y. For example, the code subset s0 is formed by the union of the 4D patterns from the 4D code sub-subsets XXXX and YYYY. It should be noted that the distance between any two arbitrary even (respectively, odd) code-subsets is a $\sqrt{2}$. It should be farther noted that each of the code subsets is able to define at least 72 constellation points. However, only 64 constellation points in each code subset are recognized as codewords of the trellis code specified in the 1000BASE-T standard.

This reduced constellation is termed the pruned constellation. Hereinafter, the term "codeword" is used to indicate a 4D symbol that belongs to the pruned constellation. A valid codeword is part of a valid path in the trellis diagram.

Referring now to FIG. 3 and with reference to FIGS. 4A and 4B, in operation, the signal mapper 304 uses the 3 bits $D_1$, $D_0$ and C to select one of the code subsets s0-s7, and uses the 6 MSB bits of the input signal, $D_2$-$D_7$ to select one of 64 particular points in the selected code subset. These 64 particular points of the selected coded subset correspond to codewords of the trellis code. The signal mapper 304 outputs the selected 4D constellation point 306 which will be placed on the four twisted wire pairs after pulse shape filtering and digital-to-analog conversion.

Figure 5:
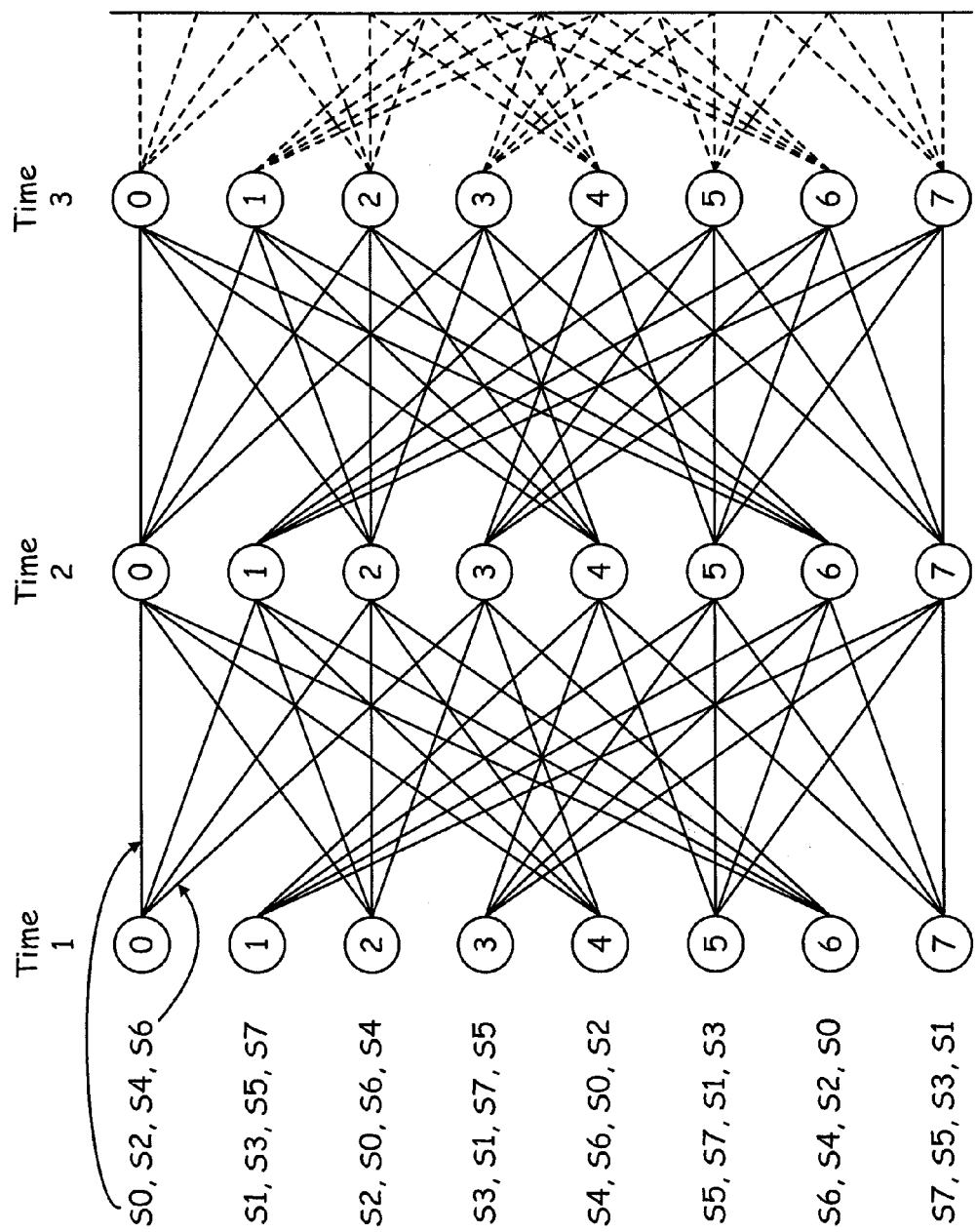
FIG. 5 illustrates the trellis diagram for the code.

FIG. 5 shows the trellis diagram for the trellis code specified in the 1000BASE-T standard. In the trellis diagram, each vertical column of nodes represents the possible states that the encoder 300 (FIG. 3) can assume at a point in time. It is noted that the states of the encoder 300 are dictated by the states of the convolutional encoder 302 (FIG. 3). Since the convolutional encoder 302 has three delay elements, there are eight distinct states. Successive columns of nodes represent the possible states that might be defined by the convolutional encoder state machine at successive points in time.

Referring to FIG. 5, the eight distinct states of the encoder 300 are identified by numerals 0 through 7, inclusive. From any given current state, each subsequent transmitted 4D symbol must correspond to a transition of the encoder 300 from the given state to a permissible successor state. For example, from the current state 0 (respectively, from current states 2, 4, 6), a transmitted 4D symbol taken from the code subset s0 corresponds to a transition to the successor state 0 (respectively, to successor states 1, 2 or 3). Similarly, from current state 0, a transmitted 4D symbol taken from code subset s2 (respectively, code subsets s4, s6) corresponds to a transition to successor state 1 (respectively, successor states 2, 3).

Familiarity with the trellis diagram of FIG. 5, illustrates that from any even state (i.e., states 0, 2, 4 or 6), valid transitions can only be made to certain ones of the successor states, i.e., states 0, 1, 2 or 3. From any odd state (states 1, 3, 5 or 7), valid transitions can only be made to the remaking successor states, i.e., states 4, 5, 6 or 7. Each transition in the trellis diagram, also called a branch, may be thought of as being characterized by the predecessor state (the state it leaves), the successor state (the state it enters) and the corresponding transmitted 4D symbol. A valid sequence of states is represented by a path through the trellis which follows the above noted rules. A valid sequence of states corresponds to a valid sequence of transmitted 4D symbols.

At the receiving end of the communication channel, the trellis decoder 38 uses the methodology represented by the trellis diagram of FIG. 5 to decode a sequence of received signal samples into their symbolic representation, in accordance with the well known Viterbi algorithm. A traditional Viterbi decoder processes information signals iteratively, on an information frame by information frame basis (in the Gigabit Ethernet case, each information frame is a 4D received signal sample corresponding to a 4D symbol), tracing through a trellis diagram corresponding to the one used by the encoder, in an attempt to emulate the encoder's behavior. At any particular frame time, the decoder is not instantaneously aware of which node (or state) the encoder has reached, thus, it does not try to decode the node at that particular frame time. Instead, given the received sequence of signal samples, the decoder calculates the most likely path to every node and determines the distance between each of such paths and the received sequence in order to determine a quantity called the path metric.

In the next frame time, the decoder determines the most likely path to each of the new nodes of that frame time. To get to any one of the new nodes, a path must pass through one of the old nodes. Possible paths to each new node are obtained by extending to this new node each of the old paths that are allowed to be thus extended, as specified by the trellis diagram. In the trellis diagram of FIG. 5, there are four possible paths to each new node. For each new node, the extended path with the smallest path metric is selected as the most likely path to this new node.

By continuing the above path-extending process, the decoder determines a set of surviving paths to the set of nodes at the nth frame time. If all of the paths pass through the same node at the first frame time, then the traditional decoder knows which most likely node the encoder entered at the first frame time, regardless of which node the encoder entered at the nth frame time. In other words, the decoder knows how to decode the received information associated with the first frame time, even though it has not yet made a decision for the received information associated with the nth frame time. At the nth frame time, the traditional decoder examines all surviving paths to see if they pass through the same first branch in the first frame time. If they do, then the valid symbol associated with this first branch is outputted by the decoder as the decoded information frame for the first frame time. Then, the decoder drops the first frame and takes in a new frame for the next iteration. Again, if all surviving paths pass through the same node of the oldest surviving frame, then this information frame is decoded. The decoder continues this frame-by-frame decoding process indefinitely so long as information is received.

The number of symbols that the decoder can store is called the decoding-window width. The decoder must have a decoding window width large enough to ensure that a well-defined decision will almost always be made at a frame time. As discussed later in connection with FIGS. 13 and 14, the decoding window width of the trellis decoder 38 of FIG. 2 is 10 symbols. This length of the decoding window is selected based on results of computer simulation of the trellis decoder 38.

A decoding failure occurs when not all of the surviving paths to the set of nodes at frame time n pass through a common first branch at frame time 0. In such a case, the traditional decoder would defer making a decision and would continue tracing deeper in the trellis. This would cause unacceptable latency for a high-speed system such as the gigabit Ethernet transceiver. Unlike the traditional decoder, the trellis decoder 38 of the present invention does not check whether the surviving paths pass through a common first branch. Rather, the trellis decoder, in accordance with the invention, makes an assumption that the surviving paths at frame time n pass through such a branch, and outputs a decision for frame time 0 on the basis of that assumption. If this decision is incorrect, the trellis decoder 38 will necessarily output a few additional incorrect decisions based on the initial perturbation, but will soon recover due to the nature of the particular relationship between the code and the characteristics of the transmission channel. It should, further, be noted that this potential error introduction source is relatively trivial in actual practice, since the assumption made by the trellis decoder 38 that all the surviving paths at frame time n pass through a common first branch at frame time 0 is a correct one to a very high statistical probability.

Figure 6:
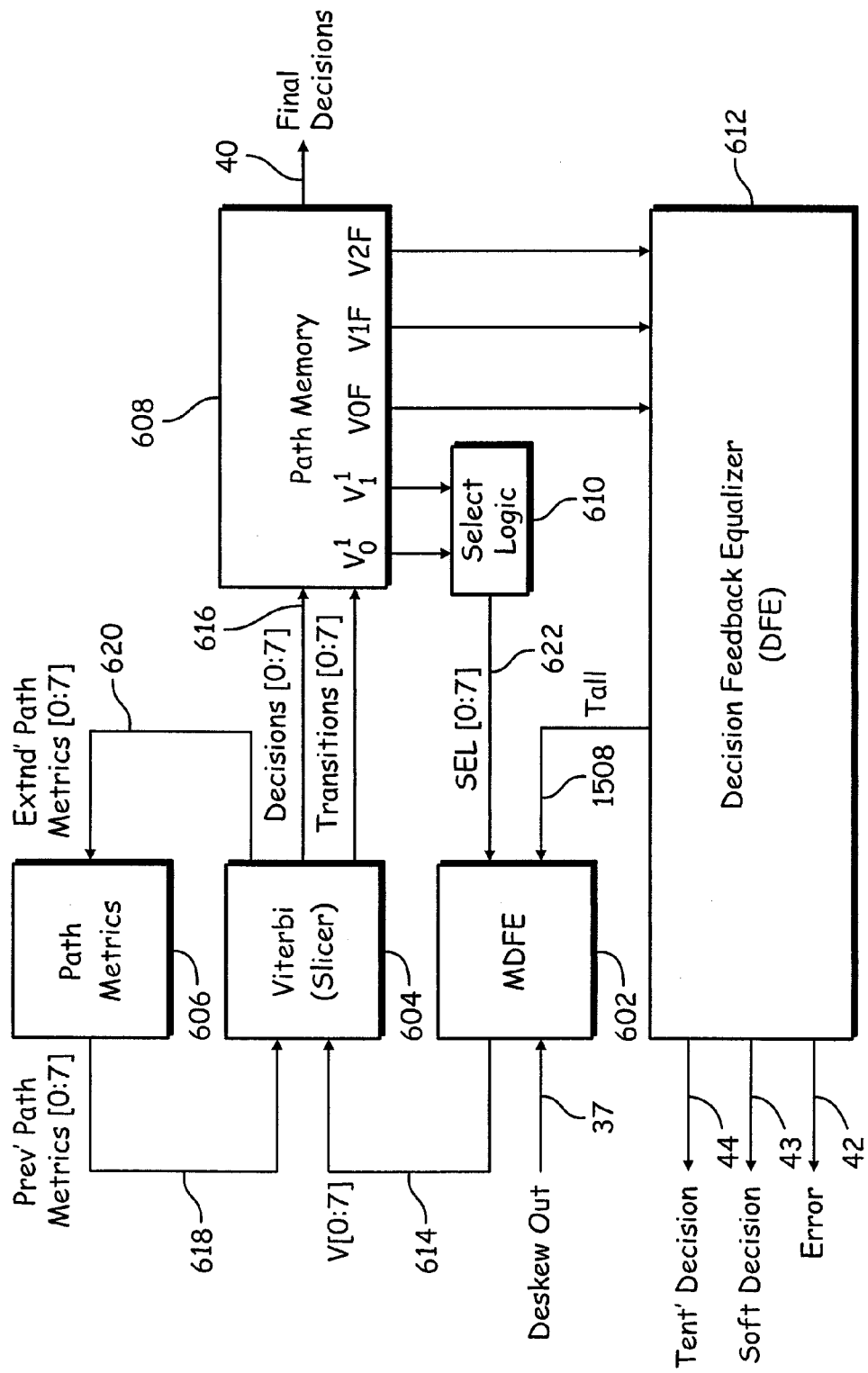
FIG. 6 is a simplified block diagram of an exemplary trellis decoder, including a Viterbi decoders in accordance with the invention, suitable for decoding signals coded by the exemplary trellis encoder of FIG. 3.

FIG. 6 is a simplified block diagram of the construction details of an exemplary trellis decoder such as described in connection with FIG. 2. The exemplary trellis decoder (again indicated generally at 38) is constructed to include a multiple decision feedback equalizer (MDFE) 602, Viterbi decoder circuitry 604, a path metrics module 606, a path memory module 608, a select logic 610, and a decision feedback equalizer 612. In general, a Viterbi decoder is often thought of as including the path metrics module 606 and the path memory module. However, because of the unique arrangement and functional operation of the elements of the exemplary trellis decoder 38, the functional element 604 which performs the slicing operation will be referred to herein as Viterbi decoder circuitry, a Viterbi decoder, or colloquially a Viterbi.

The Viterbi decoder circuitry 604 performs 4D slicing of signals received at the Viterbi inputs 614, and computes the branch metrics. A branch metric, as the term is used herein, is well known and refers to an elemental path between neighboring Trellis nodes. A plurality of branch metrics will thus be understood to make up a path metric. An extended path metric will be understood to refer to a path metric, which is extended by a next branch metric to thereby form an extension to the path. Based on the branch metrics and the previous path metrics information 618 received from the path metrics module 606, the Viterbi decoder 604 extends the paths and computes the extended path metrics 620 which are returned to the path metrics module 606. The Viterbi decoder 604 selects the best path incoming to each of the eight states, updates the path memory stored in the path memory module 608 and the path metrics stored in the path metrics module 606.

In the traditional Viterbi decoding algorithm, the inputs to a decoder are the same for all the states of the code. Thus, a traditional Viterbi decoder would have only one 4D input for a 4D 8-state code. In contrast, and in accordance with the present invention, the inputs 614 to the Viterbi decoder 604 are different for each of the eight states. This is the result of the fact the Viterbi inputs 614 are defined by feedback signals generated by the MDFE 602 and are different for each of the eight paths (one path per state) of the Viterbi decoder 604, as will be discussed later.

There are eight Viterbi inputs 614 and eight Viterbi decisions 616, each corresponding to a respective one of the eight states of the code. Each of the eight Viterbi inputs 614, and each of the decision outputs 618, is a 4-dimensional vector whose four components are the Viterbi inputs and decision outputs for the four constituent transceivers, respectively. In other words, the four components of each of the eight Viterbi inputs 614 are associated with the four pairs of the Category-5 cable. The four components are a received word that corresponds to a valid codeword. From the foregoing, it should be understood that detection (decoding, demodulation, and the like) of information signals in a gigabit system is inherently computationally intensive. When it is further realized that received information must be detected at a very high speed and in the presence of ISI channel impairments, the difficulty in achieving robust and reliable signal detection will become apparent.

In accordance with the present invention, the Viterbi decoder 604 detects a non-binary word by first producing a set of one-dimensional (1D) decisions and a corresponding set of 1D errors from the 4D inputs. By combining the 1D decisions with the 1D errors, the decoder produces a set of 4D decisions and a corresponding set of 4D errors. Hereinafter, this generation of 4D decisions and errors from the 4D inputs is referred to as 4D slicing. Each of the 1D errors represents the distance metric between one 1D component of the eight 4D-inputs and a symbol in one of the two disjoint symbol-subsets X, Y. Each of the 4D errors is the distance between the received word and the corresponding 4D decision which is a codeword nearest to the received word with respect to one of the code-subsets si, where i=0, . . . , 7.

4D errors may also be characterized as the branch metrics in the Viterbi algorithm. The branch metrics are added to the previous values of path metrics 618 received from the path metrics module 606 to form the extended path metrics 620 which are then stored in the path metrics module 606, replacing the previous path metrics. For any one given state of the eight states of the code, there are four incoming paths. For a given state, the Viterbi decoder 604 selects the best path, i.e., the path having the lowest metric of the four paths incoming to that state, and discards the other three paths. The best path is saved in the path memory module 608. The metric associated with the best path is stored in the path metrics module 606, replacing the previous value of the path metric stored in that module.

In the following, the 4D slicing function of the Viterbi decoder 604 will be described in detail. 4D slicing may be described as being performed in three sequential steps. In a first step, a set of 1D decisions and corresponding 1D errors are generated from the 4D Viterbi inputs. Next, the 1D decisions and 1D errors are combined to form a set of 2D decisions and corresponding 2D errors. Finally, the 2D decisions and 2D errors are combined to form 4D decisions and corresponding 4D errors.

Figure 7:
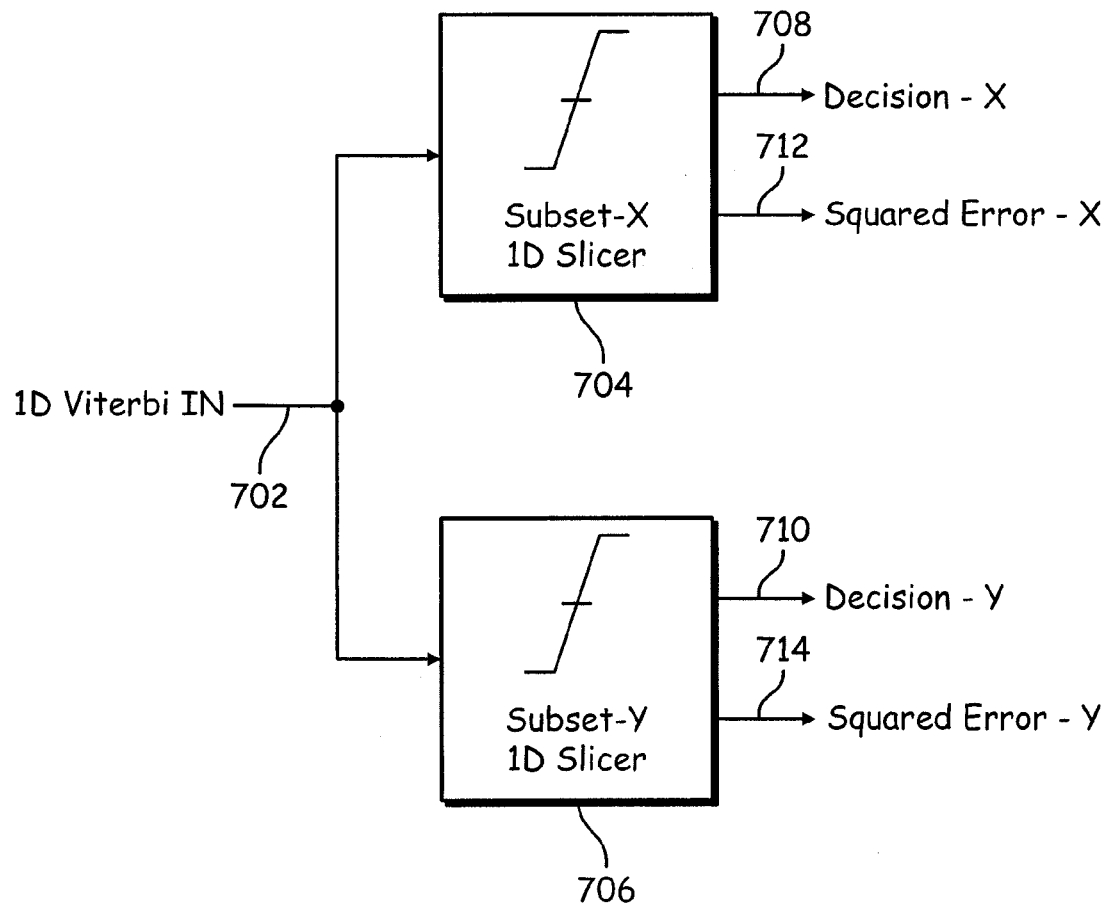
FIG. 7 is a simplified block diagram of a first exemplary embodiment of a structural analog of a 1D slicing function as may be implemented in the Viterbi decoder of FIG. 6.

FIG. 7 is a simplified, conceptual block diagram of a first exemplary embodiment of a 1D slicing function such as might be implemented by the Viterbi decoder 604 of FIG. 6. Referring to FIG. 7, a 1D component 702 of the eight 4D Viterbi inputs (614 of FIG. 6) is sliced, i.e., detected, in parallel fashion, by a pair of 1D slicers 704 and 706 with respect to the X and Y symbol-subsets. Each slicer 704 and 706 outputs a respective 1D decision 708 and 710 with respect to the appropriate respective symbol-subset X, Y and an associated squared error value 712 and 714. Each 1D decision 708 or 710 is the symbol which is closest to the 1D input 702 in the appropriate symbol-subset X and Y, respectively. The squared error values 712 and 714 each represent the square of the difference between the 1D input 702 and their respective 1D decisions 708 and 710.

The 1D slicing function shown in FIG. 7 is performed for all four constituent transceivers and for all eight states of the trellis code in order to produce one pair of 1D decisions per transceiver and per state. Thus, the Viterbi decoder 604 has a total of 32 pairs of 1D slicers disposed in a manner identical to the pair of slicers 704, 706 illustrated in FIG. 7.

Figure 8:
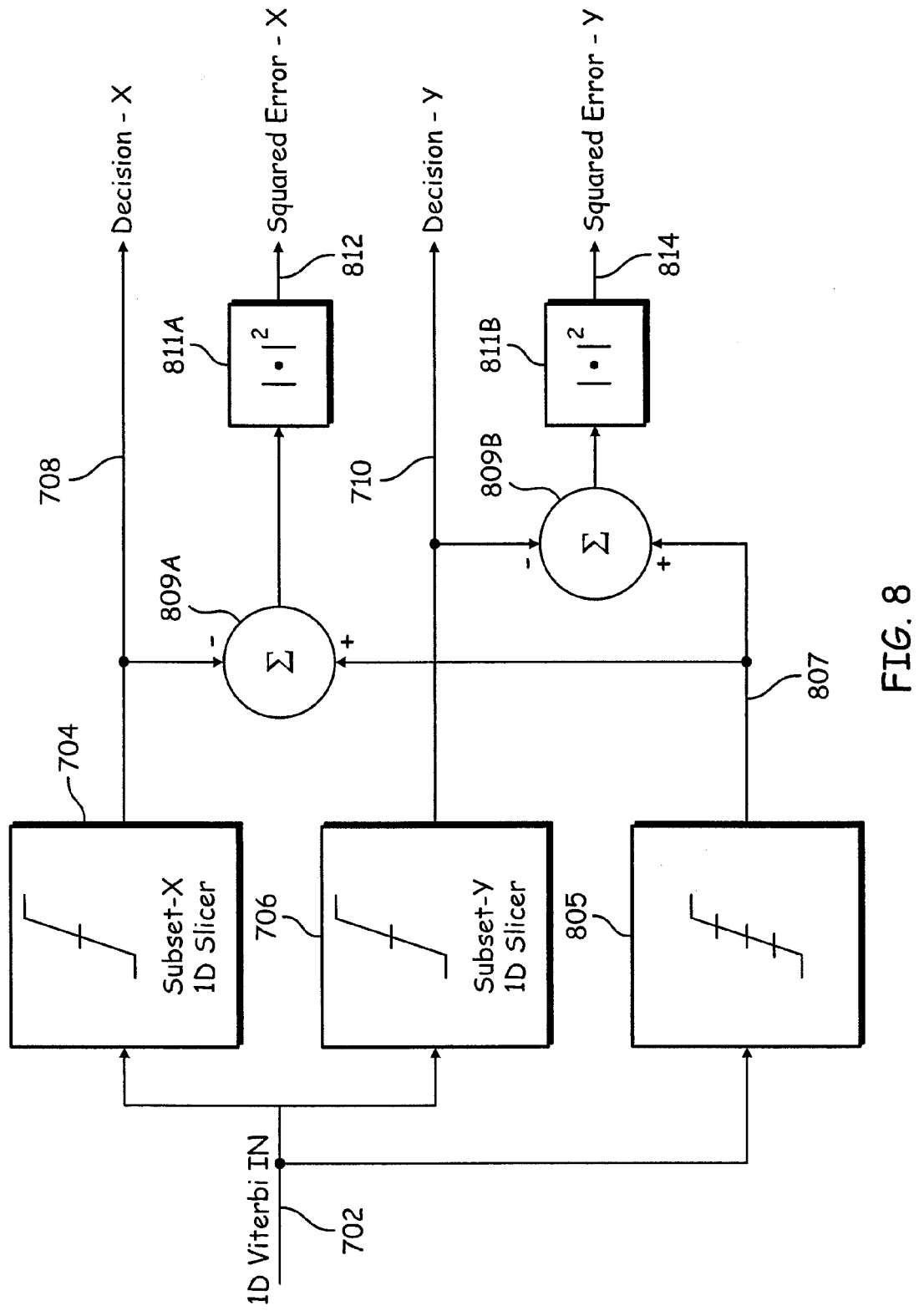
FIG. 8 is a simplified block diagram of a second exemplary embodiment of a structural analog of a 1D slicing function as may be implemented in the Viterbi decoder of FIG. 6.

FIG. 8 is a simplified block diagram of a second exemplary embodiment of circuitry capable of implementing a 1D slicing function suitable for incorporation in the Viterbi decoder 604 of FIG. 5. Referring to FIG. 8, the 1 in component 702 of the eight 4D Viterbi inputs is sliced, i.e., detected, by a first pair of 1D slicers 704 and 706, with respect to the X and Y symbol-subsets, and also by a 5-level slicer 805 with respect to the symbol set which represents the five levels (+2, +1, 0, −1, −2) of the constellation, i.e., a union of the X and Y symbol-subsets. As in the previous case described in connection with FIG. 7, the slicers 704 and 706 output 1D decisions 708 and 710. The 1D decision 708 is the symbol which is nearest the 1D input 702 in the symbol-subset X, while 1D decision 710 corresponds to the symbol which is nearest the 1D input 702 in the symbol-subset Y. The output 807 of the 5-level slicer 805 corresponds to the particular one of the five constellation symbols which is determined to be closest to the 1D input 702.

The difference between each decision 708 and 710 and the 5-level slicer output 807 is processed, in a manner to be described in greater detail below, to generate respective quasi-squared error terms 812 and 814. In contrast to the 1D error terms 712, 714 obtained with the first exemplary embodiment of a 1D slicer depicted in FIG. 7, the 1D error terms 812, 814 generated by the exemplary embodiment of FIG. 8 are more easily adapted to discerning relative differences between a 1D decision and a 1D Viterbi input.

In particular, the slicer embodiment of FIG. 7 may be viewed as performing a "soft decode", with 1D error terms 712 and 714 represented by Euclidian metrics. The slicer embodiment depicted in FIG. 8 may be viewed as performing a "hard decode", with its respective 1D error terms 812 and 814 expressed in Hamming metrics (i.e., 1 or 0). Thus, there is less ambiguity as to whether the 1D Viterbi input is closer to the X symbol subset or to the Y symbol subset. Furthermore, Hamming metrics can be expressed in a fewer number of bits, than Euclidian metrics, resulting in a system that is substantially less computationally complex and substantially faster.

In the exemplary embodiment of FIG. 8, error terms are generated by combining the output of the five level slicer 805 with the outputs of the 1D slicers 704 and 706 in respective adder circuits 809A and 809B. The outputs of the adders are directed to respective squared magnitude blocks 811A and 811B which generate the binary squared error terms 812 and 814, respectively.

Implementation of squared error terms by use of circuit elements such as adders 809A, 809B and the magnitude squared blocks 811A, 811B is done for descriptive convenience and conceptual illustration purposes only. In practice, squared error term definition is implemented with a look-up table that contains possible values for error-X and error-Y for a given set of decision-X, decision-Y and Viterbi input values. The look-up table can be implemented with a read-only-memory device or alternatively, a random logic device or PLA. Examples of look-up tables, suitable for use in practice of the present invention, are illustrated in FIGS. 17, 18A and 18B.

The 1D slicing function exemplified in FIG. 8 is performed for all four constituent transceivers and for all eight states of the trellis code in order to produce one pair of 1D decisions per transceiver and per state. Thus, the Viterbi decoder 604 has a total of thirty two pairs of 1D slicers that correspond to the pair of slicers 704, 706, and thirty two 5-level slicers that correspond to the 5-level slicer 805 of FIG. 8.

Each of the 1D errors is represented by substantially fewer bits than each 1D component of the 4D inputs. For example, in the embodiment of FIG. 7, the 1D component of the 4D Viterbi input is represented by 5 bits, while the 1D error is represented by 2 or 3 bits. Traditionally, proper soft decision decoding of such a trellis code would require that the distance metric (Euclidean distance) be represented by 6 to 8 bits. One advantageous feature of the present invention is that only 2 or 3 bits are required for the distance metric in soft decision decoding of this trellis code.

In the embodiment of FIG. 8, the 1D error can be represented by just 1 bit. It is noted that, since the 1D error is represented by 1 bit, the distance metric used in this trellis decoding is no longer the Euclidean distance, which is usually associated with trellis decoding, but is instead the Hamming distance, which is usually associated with hard decision decoding of binary codewords. This is another particularly advantageous feature of the present invention.

Figure 9:
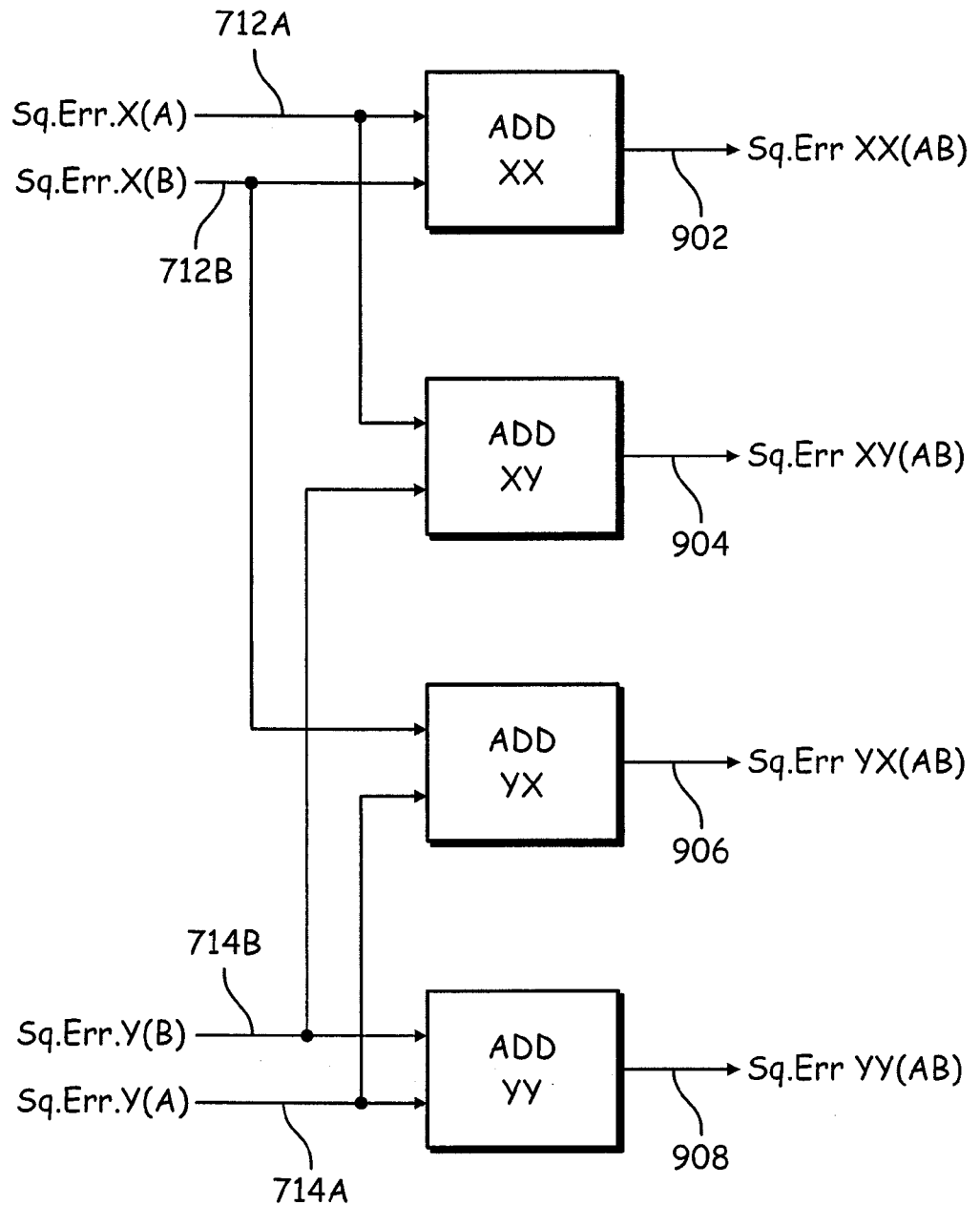
FIG. 9 is a simplified block diagram of a 2D error term generation module, illustrating the generation of 2D square error terms from the 1D square error terms developed by the exemplary slicers of FIG. 7 or 8.

FIG. 9 is a block diagram illustrating the generation of the 2D errors from the 1D errors for twisted pairs A and B (corresponding to constituent transceivers A and B). Since the generation of errors is similar for twisted pairs C and D, this discussion will only concern itself with the A:B 2D cage. It will be understood that the discussion is equally applicable to the C:D 2D case with the appropriate change in notation. Referring to FIG. 9, 1D error signals 712A, 712B, 714A, 714B might be produced by the exemplary 1D slicing functional blocks shown in FIG. 7 or 8. The 1D error term signal 712A (or respectively, 712B) is obtained by slicing, with respect to symbol-subset X, the 1D component of the 4D Viterbi input, which corresponds to pair A (or respectively, pair B). The 1D error term 714A (respectively, 714B) is obtained by slicing, with respect to symbol-subset Y, the 1D component of the 4D Viterbi input, which corresponds to pair A (respectively, B). The 1D errors 712A, 712B, 714A, 714B are added according to all possible combinations (Et, XY, YX and E) to produce 2D error terms 902(AB), 904(AB), 906(AB), 908(AB) for pairs A and B. Similarly, the 1D errors 712C, 712D, 714C, 714D (not shown) are added according to the four different symbol-subset combinations XX, Y, MYX and YY to produce corresponding 2D error terms for wire pairs C and D.

Figure 10:
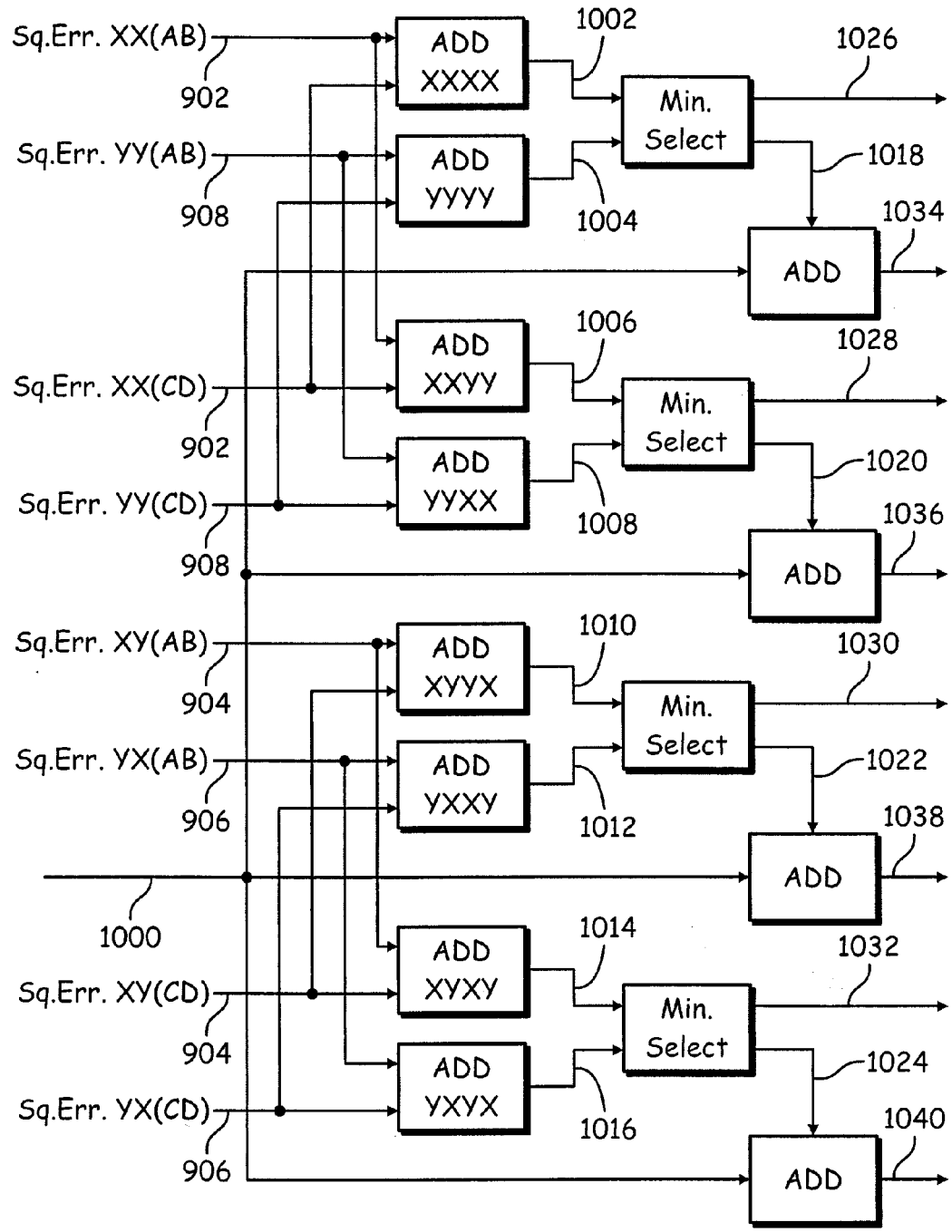
FIG. 10 is a simplified block diagram of a 4D error term generation module, illustrating the generation of 4D square error terms and the generation of extended path metrics for the 4 extended paths outgoing from state 0.

FIG. 10 is a block diagram illustrating the generation of the 4D errors and extended path metrics for the four extended paths outgoing from state 0. Referring to FIG. 10, the 2D errors 902(AB), 902(CD), 904(AB), 904(CD), 906(AB), 906(CD), 908(AB), 908(CD) are added in pairs according to eight different combinations to produce eight intermediate 4D errors 1002, 1004, 1006, 1008, 1010, 1012, 1014, 1016. For example, the 2D error 902(AB), which is the squared error with respect to XX from pairs A and B, is added to the 2D error 902(CD), which is the squared error with respect to XX from pairs C and D, to form the intermediate 4D error 1002 which is the squared error with respect to sub-subset XXXX for pairs A, B, C and D. Similarly, the intermediate 4D error 1004 which corresponds to the squared error with respect to sub-subset YYYY is formed from the 2D errors 908(AB) and 908(CD).

The eight intermediate 4D errors are grouped in pairs to correspond to the code subsets s0, s2, s4 and s6 represented in FIG. 4B. For example, the intermediate 4D errors 1002 and 1004 are grouped together to correspond to the code subset s0 which is formed by the union of the XXXX and YYYY sub-subsets. From each pair of intermediate 4D errors, the one with the lowest value is selected (the other one being discarded) in order to provide the branch metric of a transition in the trellis diagram from state 0 to a subsequent state. It is noted that, according to the trellis diagram, transitions from an even state (i.e., 0, 2, 4 and 6) are only allowed to be to the states 0, 1, 2 and 3, and transitions from an odd state (i.e., 1, 3, 5 and 7) are only allowed to be to the states 4, 5, 6 and 7. Each of the index signals 1026, 1028, 1030, 1032 indicates which of the 2 sub-subsets the selected intermediate 4D error corresponds to. The branch metrics 1018, 1020, 1022, 1024 are the branch metrics for the transitions in the trellis diagram of FIG. 5 associated with code-subsets s0, s2, s4 and s6 respectively, from state 0 to states 0, 1, 2 and 3, respectively. The branch metrics are added to the previous path metric 1000 for state 0 in order to produce the extended path metrics 1034, 1036, 1038, 1040 of the four extended paths outgoing from state 0 to states 0, 1, 2 and 3, respectively.

Associated with the eight intermediate 4D errors 1002, 1004, 1006, 1008, 1010, 1012, 1014, 1016 are the 4D decisions which are formed from the 1D decisions made by one of the exemplary slicer embodiments of FIG. 7 or 8. Associated with the branch metrics 1018, 1020, 1022, 1024 are the 4D symbols derived by selecting the 4D decisions using the index outputs 1026, 1028, 1030, 1032.

Figure 11:
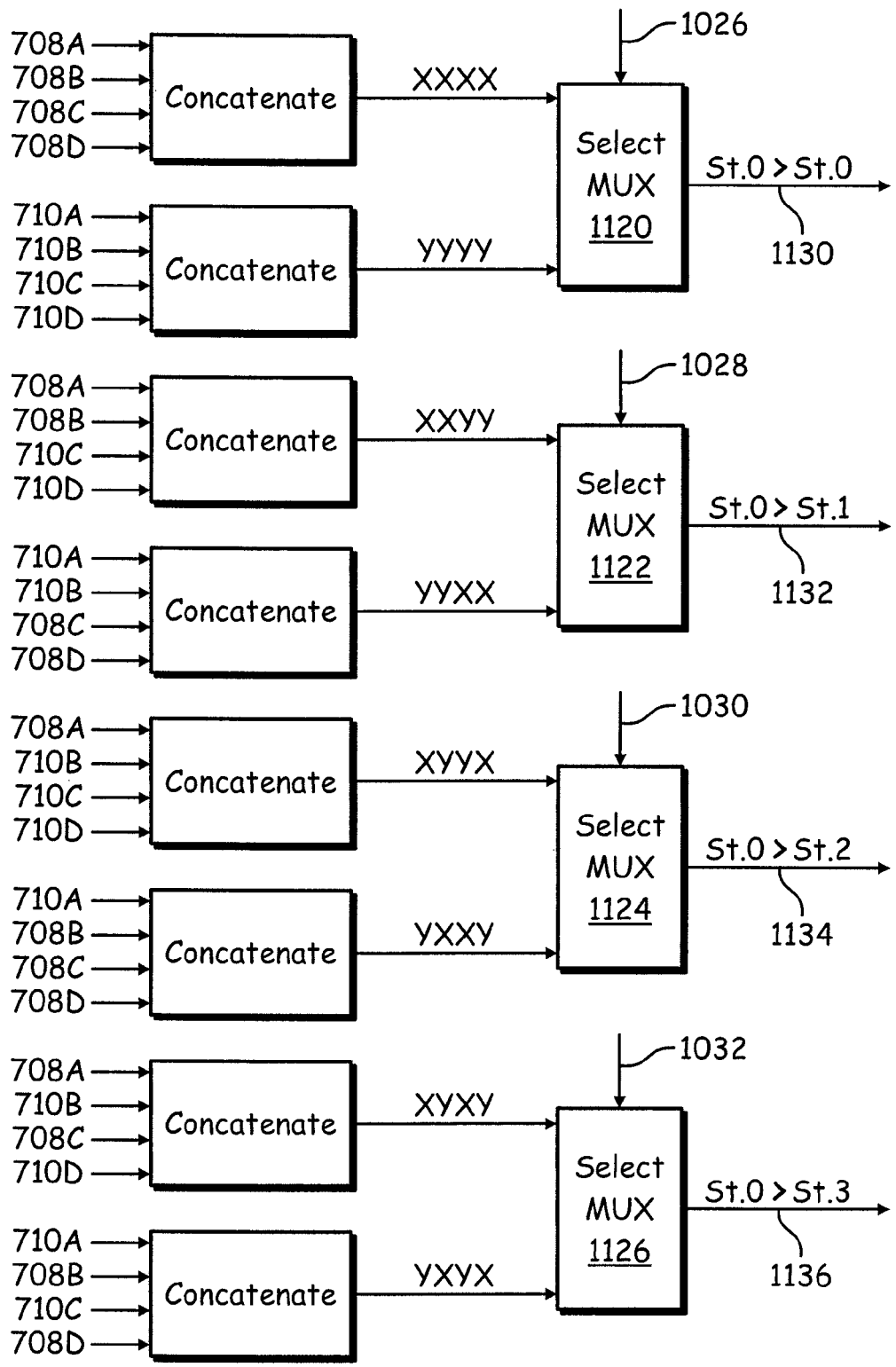
FIG. 11 is a simplified block diagram of a 4D symbol generation module.

FIG. 11 shows the generation of the 4D symbols associated with the branch metrics 1018, 1020, 1022, and 1024. Referring to FIG. 11, the 1D decisions 708A, 708B, 708C, and 708D are the 1D decisions with respect to symbol-subset X (as shown in FIG. 7) for constituent transceivers A, B, C, and D, respectively, and the 1D decisions 710A, 710B, 710C, and 710D are the 1D decisions with respect to symbol-subset Y for constituent transceivers A, B, C, and D, respectively. The 1D decisions are concatenated according to the combinations which correspond to a left or right hand portion of the code subsets s0, s2, s4 and s6, as depicted in FIG. 4B. For example, the 1D decisions 708A, 70813, 708C, and 708D are concatenated to correspond to the left hand portion, XXXX, of the code subset s0. The 4D decisions are grouped in pairs to correspond to the union of symbol-subset portions making up the code subsets s0, s2, s4 and s6. In particular, the 4D decisions are grouped together to correspond to the code subset s0 which is formed by the union of the XXXX and YYYY subset portions.

Referring to FIG. 11, the pairs of 4D decisions are inputted to the multiplexers 1120, 1122, 1124, 1126 which receive the index signals 1026, 1028, 1030, 1032 (FIG. 10) as select signals. Each of the multiplexers selects from a pair of the 4D decisions, the 4D decision which corresponds to the sub-subset indicated by the corresponding index signal and outputs the selected 4D decision as the 4D symbol for the branch whose branch metric is associated with the index signal. The 4D symbols 1130, 1132, 1134, 1136 correspond to the transitions in the trellis diagram of FIG. 5 associated with code-subsets s0, s2, s4 and s6 respectively, from state 0 to states 0, 1, 2 and 3, respectively. Each of the 4D symbols 1130, 1132, 1134, 1136 is the codeword in the corresponding code-subset (s0, s2, s4 and s6) which is closest to the 4D Viterbi input for state 0 (there is a 4D Viterbi input for each state). The associated branch metric (FIG. 10) is the 4D squared distance between the codeword and the 4D Viterbi input for state 0.

Figure 12:
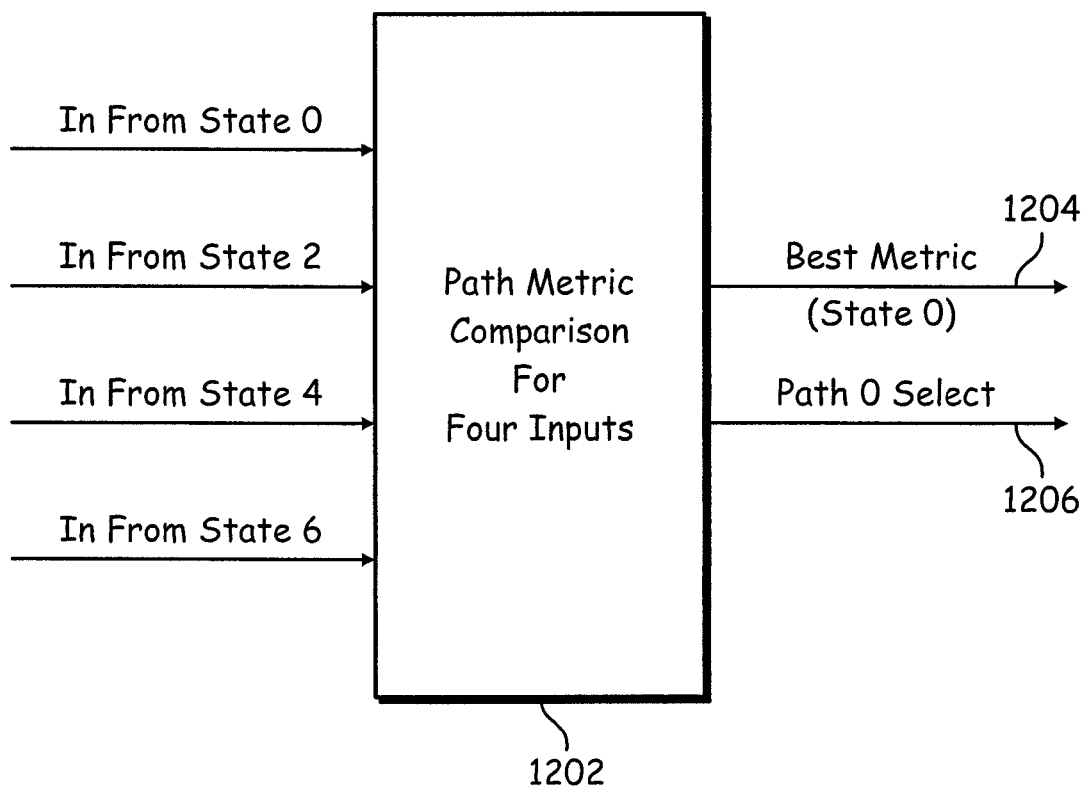
FIG. 12 illustrates the selection of the best path incoming to state 0.

FIG. 12 illustrates the selection of the best path incoming to state 0. The extended path metrics of the four paths incoming to state 0 from states 0, 2, 4 and 6 are inputted to the comparator module 1202 which selects the best path, i.e., the path with the lowest path metric, and outputs the Path 0 Select signal 1206 as an indicator of this path selection, and the associated path metric 1204.

The procedure described above for processing a 4D Viterbi input for state 0 of the code to obtain four branch metrics, four extended path metrics, and four corresponding 4D symbols is similar for the other states. For each of the other states, the selection of the best path from the four incoming paths to that state is also similar to the procedure described in connection with FIG. 12.

The above discussion of the computation of the branch metrics, illustrated by FIG. 7 through 11, is an exemplary application of the method for slicing (detecting) a received L-dimensional word and for computing the distance of the received L-dimensional word from a codeword, for the particular case where L is equal to 4.

In general terms, i.e., for any value of L greater than 2, the method can be described as follows. The codewords of the trellis code are constellation points chosen from $2^{L-1}$ code-subsets. A codeword is a concatenation of L symbols selected from two disjoint symbol-subsets and is a constellation point belonging to one of the $2^{L-1}$ code-subsets. At the receiver, L inputs are received, each of the L inputs uniquely corresponding to one of the L dimensions. The received word is formed by the L inputs. To detect the received word, $2^{L-1}$ identical input sets are formed by assigning the same L inputs to each of the $2^{L-1}$ input sets. Each of the L inputs of each of the $2^{L-1}$ input sets is sliced with respect to each of the two disjoint symbol-subsets to produce an error set of 2L one-dimensional errors for each of the 2-1 code-subsets. For the particular case of the trellis code of the type described by the trellis diagram of FIG. 5, the one-dimensional errors are combined within each of the $2^{L-1}$ error sets to produce $2^{L-2}$ L-dimensional errors for the corresponding code-subset such that each of the $2^{L-2}$ L-dimensional errors is a distance between the received word and one of the codewords in the corresponding code-subset.

One embodiment of this combining operation can be described as follows. First, the 2L one-dimensional errors are combined to produce 2L two-dimensional errors FIG. 9). Then, the 2L two-dimensional errors are combined to produce 2L intermediate f-dimensional errors which are arranged into $2^{L-1}$ pairs of errors such that these pairs of errors correspond one-to-one to the $2^{L-1}$ code-subsets (FIG. 10, signals 1002 through 1016). A minimum is selected for each of the $2^{L-1}$ pairs of errors (FIG. 10, signals 1026, 1028, 1030, 1032). These minima are the $2^{L-1}$ L-dimensional errors. Due to the constraints on transitions from one state to a successor state, as shown in the trellis diagram of FIG. 5, only half of the $2^{L-2}$ L-dimensional errors correspond to allowed transitions in the trellis diagram. These $2^{L-2}$ L-dimensional errors are associated with $2^{L-2}$ dimensional decisions. Each of the $2^{L-2}$ L-dimensional decisions is a codeword closest in distance to the received word (the distance being represented by one of the $2^{L-2}$ L-dimensional errors), the codeword being in one of half of the $2^{L-1}$ code-subsets, i.e., in one of $2^{L-2}$ code-subsets of the $2^{L-1}$ code-subsets (due to the particular constraint of the trellis code described by the trellis diagram of FIG. 5).

It is important to note that the details of the combining operation on the 2L one-dimensional errors to produce the final L-dimensional errors and the number of the final L-dimensional errors are functions of a particular trellis code. In other words, they vary depending on the particular trellis code.

Figure 13:
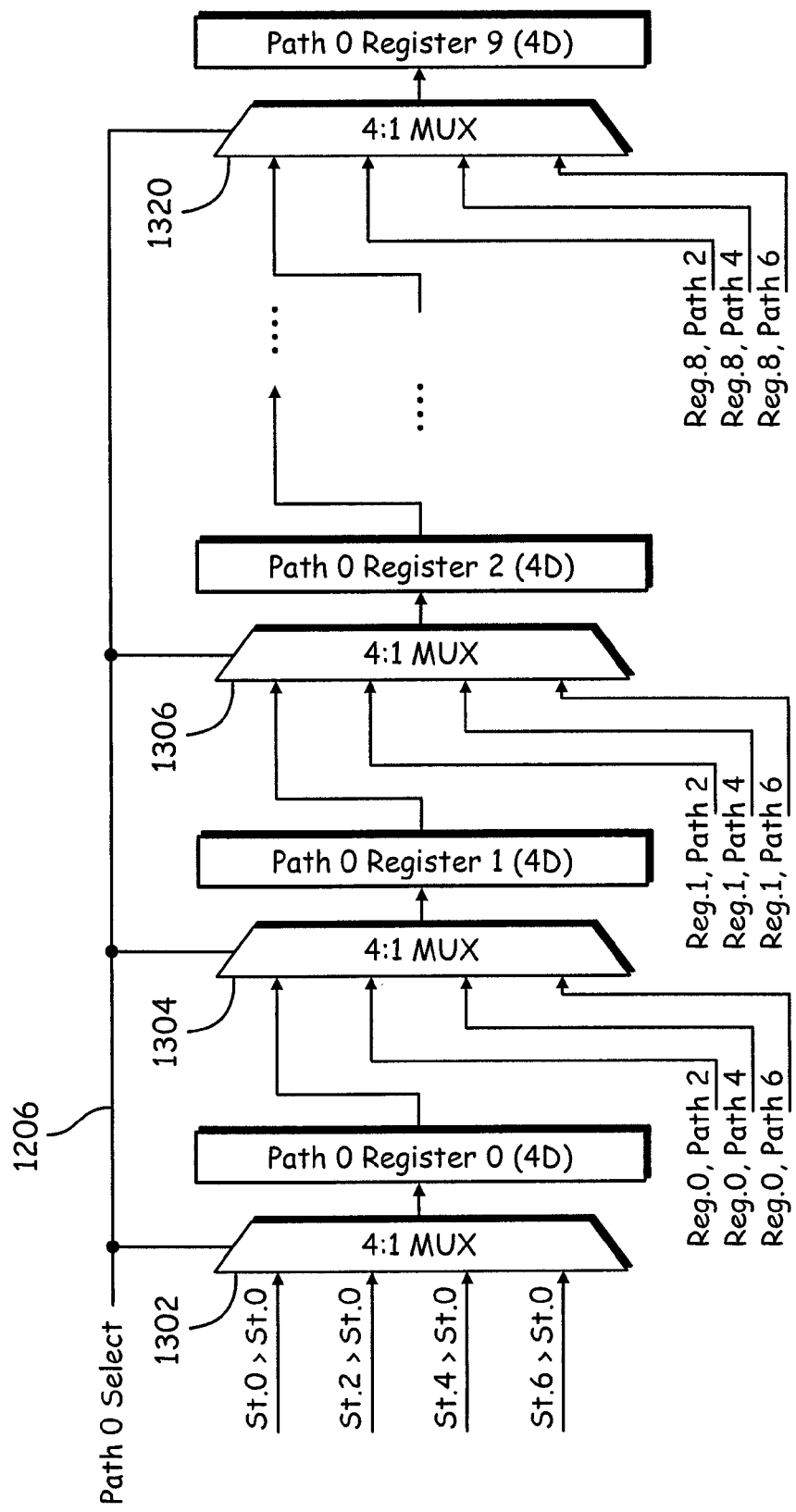
FIG. 13 is a semi-schematic block diagram illustrating the internal arrangement of a portion of the path memory module of FIG. 6.

FIG. 13 illustrates the construction of the path memory module 608 as implemented in the embodiment of FIG. 6. The path memory module 608 includes a path memory for each of the eight paths. In the illustrated embodiment of the invention, the path memory for each path is implemented as a register stack, ten levels in depth. At each level, a 4D symbol is stored in a register. The number of path memory levels is chosen as a tradeoff between receiver latency and detection accuracy. FIG. 13 only shows the path memory for path 0 and continues with the example discussed in FIGS. 7-12. FIG. 13 illustrates how the 4D decision for the path 0 is stored in the path memory module 608, and how the Path 0 Select signal, i.e., the information about which one of the four incoming extended paths to state 0 was selected, is used in the corresponding path memory to force merging of the paths at all depth levels (levels 0 through 9) in the path memory.

Referring to FIG. 13, each of the ten levels of the path memory includes a 4-to-1 multiplexer (4:1 MUX) and a register to store a 4D decision. The registers are numbered according to their depth levels. For example, register 0 is at depth level 0. The Path 0 Select signal 1206 (FIG. 12) is used as the select input for the 4:1 MUXes 1302, 1304, 1306, ..., 1320. The 4D decisions 1130, 1132, 1134, 1136 (FIG. 11) are inputted to the 4:1 MUX 1302 which selects one of the four 4D decisions based on the Path 0 select signal 1206 and stores it in the register 0 of path 0. One symbol period later, the register 0 of path 0 outputs the selected 4D decision to the 4:1 MUX 1304. The other three 4D decisions inputted to the 4:1 MUX 1304 are from the registers 0 of paths 2, 4, and 6. Based on the Path 0 Select signal 1206, the 4:1 MUX 1304 selects one of the four 4D decisions and stores it in the register 1 of path 0. One symbol period later, the register 1 of path 0 outputs the selected 4D decision to the 4:1 MUX 1306. The other three 4D decisions inputted to the 4:1 MUX 1306 are from the registers 1 of paths 2, 4, and 6. Based on the Path 0 Select signal 1206, the 4:1 MUX 1306 selects one of the four 4D decisions and stores it in the register 2 of path 0. This procedure continues for levels 3 through 9 of the path memory for path 0. During continuous operation, ten 4D symbols representing path 0 are stored in registers 0 through 9 of the path memory for path 0.

Similarly to path 0, each of the paths 1 though 7 is stored as ten 4D symbols in the registers of the corresponding path memory. The connections between the MUX of one path and registers of different paths follows the trellis diagram of FIG. 2. For example, the MUX at level k for path 1 receives as inputs the outputs of the registers at level k-1 for paths 1, 3, 5, 7, and the MUX at level k for path 2 receives as inputs the outputs of the registers at level k-1 for paths 0, 2, 4, 6.

Figure 14:
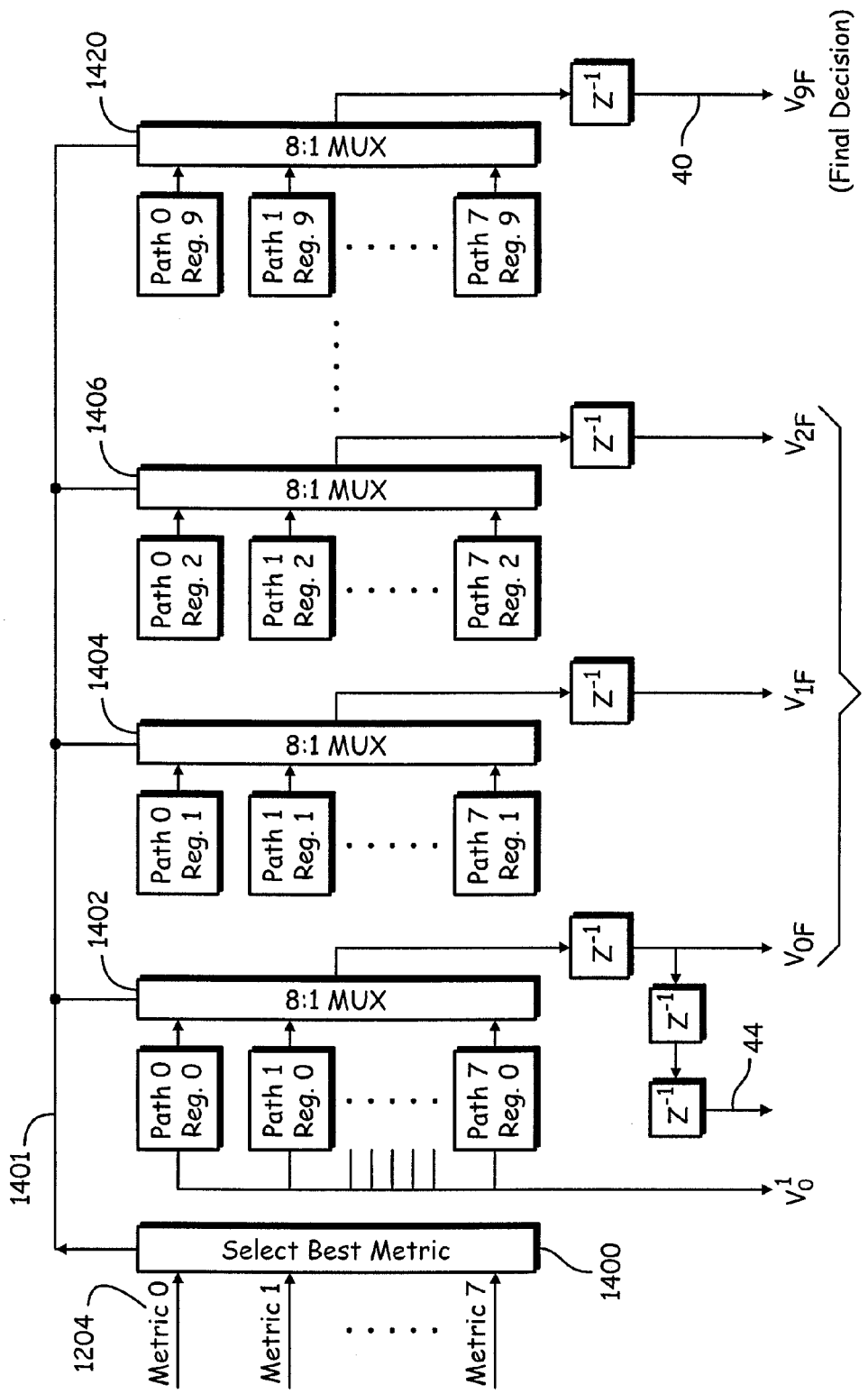
FIG. 14 is a block diagram illustrating the computation of the final decision and the tentative decisions in the path memory module based on the 4D symbols stored in the path memory for each state.

FIG. 14 is a block diagram illustrating the computation of the final decision and the tentative decisions in the path memory module 608 based on the 4D symbols stored in the path memory for each state. At each iteration of the Viterbi algorithm, the best of the eight states, i.e., the one associated with the path having the lowest path metric, is selected, and the 4D symbol from the associated path stored at the last level of the path memory is selected as the final decision 40 (FIG. 6). Symbols at lower depth levels are selected as tentative decisions, which are used to feed the delay line of the DFE 612 (FIG. 6).

Referring to FIG. 14, the path metrics 1204 of the eight states, obtained from the procedure of FIG. 12, are inputted to the comparator module 1400 which selects the one with the lowest value and provides an indicator 1401 of this selection to the select inputs of the 8-to-1 multiplexers (8:1 MUXes) 1402, 1404, 1406, ..., 1420, which are located at path memory depth levels 0 through 9, respectively. Each of the 8:1 MUXes receives eight 4D symbols outputted from corresponding registers for the eight paths, the corresponding registers being located at the same depth level as the MUX, and selects one of the eight 4D symbols to output, based on the select signal 1401. The outputs of the 8:1 MUXes located at depth levels 0 through 9 are $V_0, V_1, V_2, \ldots, V_9$, respectively.

In the illustrated embodiment, one set of eight signals, output by the first register set (the register 0 set) to the first MUX 1402, is also taken off as a set of eight outputs, denoted $V_{0^i}$ and provided to the MDFE (602 of FIG. 6) as a select signal which is used in a manner to be described below. Although only the first register set is illustrated as providing outputs to the DFE, the invention contemplates the second, or even higher order, register sets also providing similar outputs. In cases where multiple register sets provide outputs, these are identified by the register set depth order as a subscript, as in $V_{1^i}$, and the like.

In the illustrated embodiment, the MUX outputs $V_0, V_1, V_2$ are delayed by one unit of time, and are then provided as the tentative decisions $V_{0F}, V_{1F}, V_{2F}$ to the DFE 612. The number of the outputs $V_i$ to be used as tentative decisions depends on the required accuracy and speed of decoding operation. After further delay, the output $V_0$ of the first MUX 1402 is also provided as the 4D tentative decision 44 (FIG. 2) to the Feedforward Equalizers 26 of the four constituent transceivers and the timing recovery block 222 (FIG. 2). The 4D symbol $V_{9F}$, which is the output $V_9$ of the 8:1 MUX 1420 delayed by one time unit, is provided as the final decision 40 to the receive section of the PCS 204R (FIG. 2).

The following is the discussion on how outputs $V_{0^i}$, $V_{1^i}$, $V_{0F}, V_{1F}, V_{2F}$ of the path memory module 608 might be used in the select logic 610, the MDFE 602, and the DFE 612 (FIG. 6).

Figure 15:
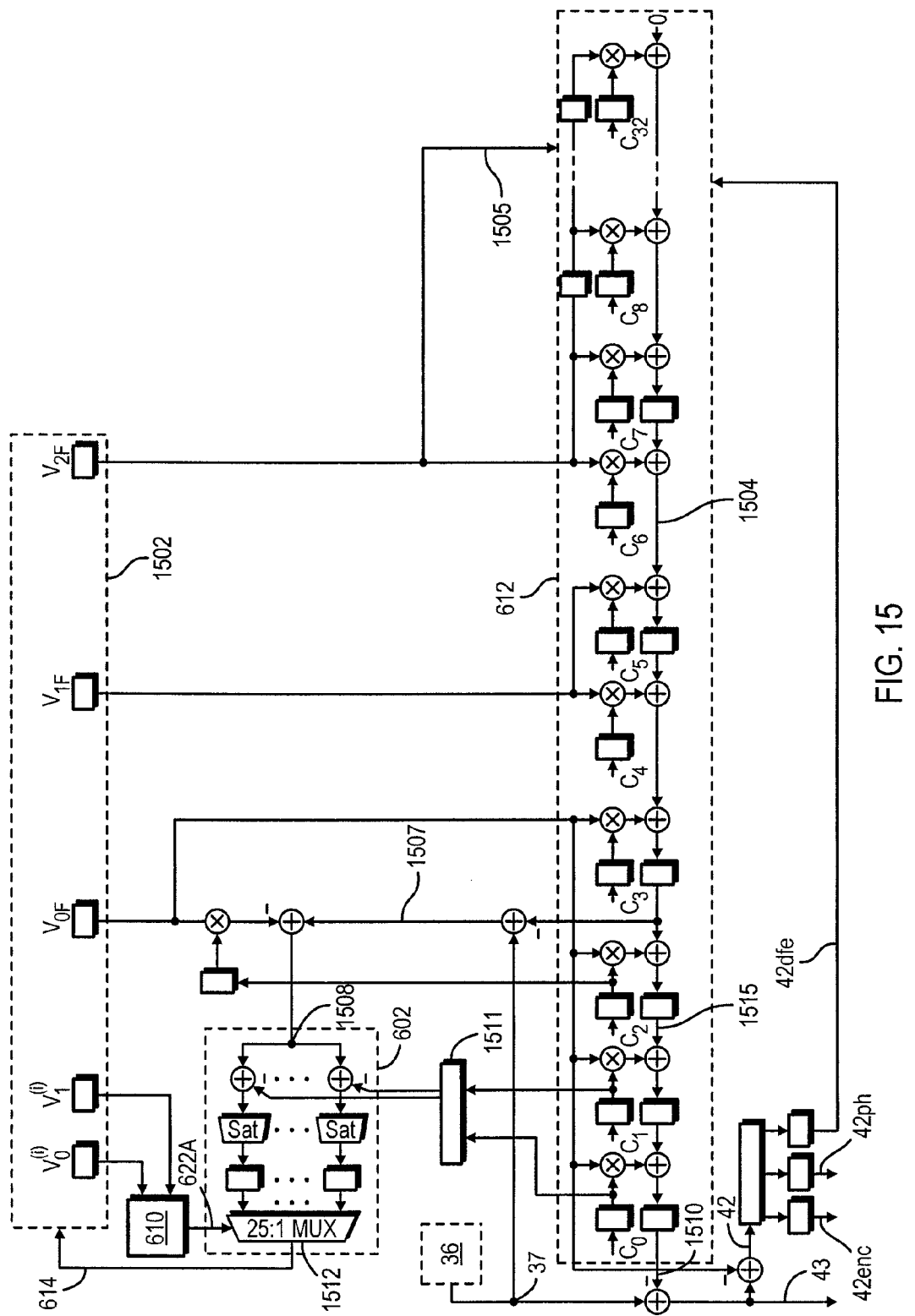
FIG. 15 is a detailed diagram illustrating the processing of the outputs $V_0^{(i)}$, $V_f^{(i)}$, with i=0, . . . , 7, and $V_{0F}$, $V_{1F}$, $V_{2F}$ of the path memory module of FIG. 6.

FIG. 15 is a block level diagram of the ISI compensation portion of the decoder, including construction and operational details of the DFE and MDFE circuitry (612 and 602 of FIG. 6, respectively). The ISI compensation embodiment depicted in FIG. 15 is adapted to receive signal samples from the deskew memory (36 of FIG. 2) and provide ISI compensated signal samples to the Viterbi (slicer) for decoding. The embodiment illustrated in FIG. 15 includes the Viterbi block 1502 (which includes the Viterbi decoder 604, the path metrics module 606 and the path memory module 608), the select logic 610, the MDFE 602 and the DFE 612.

The MDFE 602 computes an independent feedback signal for each of the paths stored in the path memory module 608. These feedback signals represent different hypotheses for the intersymbol interference component present in the input 37 (FIGS. 2 and 6) to the trellis decoder 38. The different hypotheses for the intersymbol interference component correspond to the different hypotheses about the previous symbols which are represented by the different paths of the Viterbi decoder.

The Viterbi algorithm tests these hypotheses and identifies the most likely one. It is an essential aspect of the Viterbi algorithm to postpone this identifying decision until there is enough information to minimize the probability of error in the decision. In the meantime, all the possibilities are kept open. Ideally, the MDFE block would use the entire path memory to compute the different feedback signals using the entire length of the path memory. In practice, this is not possible because this would lead to unacceptable complexity. By "unacceptable", it is meant requiring a very large number of components and an extremely complex interconnection pattern.

Therefore, in the exemplary embodiment, the part of the feedback signal computation that is performed on a per-path basis is limited to the two most recent symbols stored in register set 0 and register set 1 of an paths in the path memory module 608, namely $V_{0^i}$ and $V_{1^i}$ with i=0, ..., 7, indicating the path. For symbols older than two periods, a hard decision is forced, and only one replica of a "tail" component of the intersymbol interference is computed. This results in some marginal loss of performance, but is more than adequately compensated for by a simpler system implementation.

The DFE 612 computes this "tail" component of the intersymbol interference, based on the tentative decisions $V_{0F}$, $V_{1F}$, and $V_{2F}$. The reason for using three different tentative decisions is that the reliability of the decisions increases with the increasing depth into the path memory. For example, $V_{1F}$ is a more reliable version of $V_{0F}$ delayed by one symbol period. In the absence of errors, $V_{1F}$ would be always equal to a delayed version of $V_{0F}$. In the presence of errors, $V_{1F}$ is different from $V_{0F}$, and the probability of $V_{1F}$ being in error is lower than the probability of $V_{0F}$ being in error. Similarly, $V_{2F}$ is a more reliable delayed version of $V_{1F}$.

Referring to FIG. 15, the DFE 612 is a filter having 33 coefficients $c_0$ through $c_{32}$ corresponding to 33 taps and a delay line 1504. The delay line is constructed of sequentially disposed summing junctions and delay elements, such as registers, as is well understood in the art of filter design. In the illustrated embodiment, the coefficients of the DFE 612 are updated once every four symbol periods, i.e., 32 nanoseconds, in well known fashion, using the well known Least Mean Squares algorithm, based on a decision input 1505 from the Viterbi block and an error input 42*dfe*.

The symbols $V_{0F}$, $V_{1F}$, and $V_{2F}$ are "jammed", meaning inputted at various locations, into the delay line 1504 of the DFE 612. Based on these symbols, the DFE 612 produces an intersymbol interference (ISI) replica portion associated with all previous symbols except the two most recent (since it was derived without using the first two taps of the DFE 612). The ISI replica portion is subtracted from the output 37 of the deskew memory block 36 to produce the signal 1508 which is then fed to the MDFE block. The signal 1508 is denoted as the "tail" component in FIG. 6. In the illustrated embodiment, the DFE 612 has 33 taps, numbered from 0 through 32, and the tail component 1508 is associated with taps 2 through 32. As shown in FIG. 15, due to a circuit layout reason, the tail component 1508 is obtained in two steps. First, the ISI replica associated with taps 3 through 32 is subtracted from the deskew memory output 37 to produce an intermediate signal 1507. Then, the ISI replica associated with the tap 2 is subtracted from the intermediate signal 1507 to produce the tail component 1508.

The DFE 612 also computes the ISI replica 1510 associated with the two most recent symbols, based on tentative decisions $V_{0F}$, $V_{1F}$, and $V_{2F}$. This ISI replica 1510 is subtracted from a delayed version of the output 37 of the deskew memory block 36 to provide a soft decision 43. The tentative decision $V_{0F}$ is subtracted from the soft decision 43 in order to provide an error signal 42. Error signal 42 is further processed into several additional representations, identified as 42*enc*, 42*ph* and 42*dfe*. The error 42*enc* is provided to the echo cancelers 323 (FIG. 2) and NEXT cancelers 230 (FIG. 2) of the constituent transceivers. The error 42*ph* is provided to the FFEs 26 (FIG. 2) of the four constituent transceivers and the timing recovery block 222. The error 42*dfe* is directed to the DFE 612, where it is used for the adaptive updating of the coefficients of the DFE together with the last tentative decision $V_{2F}$ from the Viterbi block 1502. The tentative decision 44 shown in FIG. 6 is a delayed version of $V_{0F}$. The soft decision 43 is outputted to a test interface for display purposes.

The DFE 612 provides the tail component 1508 and the values of the two first coefficients $C_0$ and $C_1$ to the MDFE 602. The MDFE 602 computes eight different replicas of the ISI associated with the first two coefficients of the DFE 612. Each of these ISI replicas corresponds to a different path in the path memory module 608. This computation is part of the so-called "critical path" of the trellis decoder 38, in other words, the sequence of computations that must be completed in a single symbol period. At the speed of operation of the Gigabit Ethernet transceivers, the symbol period is 8 nanoseconds. All the challenging computations for 4D slicing, branch metrics, path extensions, selection of best path, and update of path memory must be completed within one symbol period. In addition, before these computations can even begin, the MDFE 602 must have completed the computation of the eight 4D Viterbi inputs 614 (FIG. 6) which involves computing the ISI replicas and subtracting them from the output 37 of the de-skew memory block 36 (FIG. 2). This bottleneck in the computations is very difficult to resolve. The system of the present invention allows the computations to be carried out smoothly in the allocated time.

Referring to FIG. 15, the MDFE 602 provides ISI compensation to received signal samples, provided by the deskew memory (37 of FIG. 2) before providing them, in turn, to the input of the Viterbi block 1502. ISI compensation is performed by subtracting a multiplicity of derived ISI replica components from a received signal sample so as to develop a multiplicity of signals that, together, represents various expressions of ISI compensation that might be associated with any arbitrary symbol. One of the ISI compensated arbitrary symbolic representations is then chosen, based on two tentative decisions made by the Viterbi block, as the input signal sample to the Viterbi.

Since the symbols under consideration belong to a PAM-5 alphabet, they can be expressed in one of only 5 possible values (−2, −1, 0, +1, +2). Representations of these five values are stored in a convolution engine 1511, where they are combined with the values of the first two filter coefficients $C_0$ and $C_1$ of the DFE 612. Because there are two coefficient values and five level representations, the convolution engine 1511 necessarily gives a twenty five value results that might be expressed as ($a_iC_0+b_jC_1$), with $C_0$ and $C_1$ representing the coefficients, and with $a_i$ and $b_j$ representing the level expressions (with i=1, 2, 3, 4, 5 and j=1, 2, 3, 4, 5 ranging independently).

These twenty five values are negatively combined with the tail component 1508 received from the DFE 612. The tail component 1508 is a signal sample from which a partial ISI component associated with taps 2 through 32 of the DFE 612 has been subtracted. In effect, the MDFE 602 is operating on a partially ISI compensated (pre-compensated) signal sample. Each of the twenty five pre-computed values is subtracted from the partially compensated signal sample in a respective one of a stack of twenty five summing junctions. The MDFE then saturates the twenty five results to make them fit in a predetermined range. This saturation process is done to reduce the number of bits of each of the 1D components of the Viterbi input 614 in order to facilitate lookup table computations of branch metrics. The MDFE 602 then stores the resultant ISI compensated signal samples in a stack of twenty five registers, which makes the samples available to a 25:1 MUX 1512 for input sample selection. One of the contents of the twenty five registers will correspond to a component of a 4D Viterbi input with the ISI correctly cancelled, provided that there was no decision error (meaning the hard decision regarding the best path forced upon taps 2 through 32 of the DFE 612) in the computation of the tail component. In the absence of noise, this particular value will coincide with one of the ideal 5-level symbol values (i.e., $-2, -1, 0, 1, 2$). In practice, there will always be noise, so this value will be in general different than any of the ideal symbol values.

This ISI compensation scheme can be expanded to accommodate any number of symbolic levels. If signal processing were performed on PAM-7 signals, for example, the convolution engine 1511 would output forty nine values, i.e., $a_i$ and $b_j$ would range from 1 to 7. Error rate could be reduced, i.e., performance could be improved, at the expense of greater system complexity, by increasing the number of DEE coefficients inputted to the convolution engine 1511. The reason for this improvement is that the forced hard decision (regarding the best path forced upon taps 2 through 32 of the DFE 612) that goes into the "tail" computation is delayed. If $C_2$ were added to the process, and the symbols are again expressed in a PAM-5 alphabet, the convolution engine 1511 would output one hundred twenty five (125) values. Error rate is reduced by decreasing the tail component computation, but at the expense of now requiring 125 summing junctions and registers, and a 125:1 MUX.

It is important to note that, as inputs to the DFE 612, the tentative decisions $V_{0F}, V_{1F}, V_{2F}$ are time sequences, and not just instantaneous isolated symbols. If there is no error in the tentative decision sequence $V_{0F}$, then the time sequence $V_{2F}$ will be the same as the time sequence $V_{1F}$ delayed by one time unit, and the same as the time sequence $V_{0F}$ delayed by two time units. However, due to occasional decision error in the time sequence $V_{0F}$, which may have been corrected by the more reliable time sequence $V_{1F}$ or $V_{2F}$, time sequences $V_{1F}$ and $V_{2F}$ may not exactly correspond to time-shifted versions of time sequence $V_{0F}$. For this reason, instead of using just one sequence $V_{0F}$, au three sequences $V_{0F}, V_{1F}$ and $V_{2F}$ are used as inputs to the DFE 612. Although this implementation is essentially equivalent to convolving $V_{0F}$ with all the DFE's coefficients when there is no decision error in $V_{0F}$, it has the added advantage of reducing the probability of introducing a decision error into the DFE 612. It is noted that other tentative decision sequences along the depth of the path memory 608 may be used instead of the sequences $V_{0F}, V_{1F}$ and $V_{2F}$.

Tentative decisions, developed by the Viterbi, are taken from selected locations in the path memory 608 and "jammed" into the DFE 612 at various locations along its computational path. In the illustrated embodiment (FIG. 15), the tentative decision sequence $V_{0F}$ is convolved with the DFE's coefficients $C_0$ through $C_3$, the sequence $V_{1F}$ is convolved with the DFE's coefficients $C_4$ and $C_5$, and the sequence $V_{2F}$ is convolved with the DFE's coefficients $C_6$ through $C_{32}$. It is noted that, since the partial ISI component that is subtracted from the deskew memory output 37 to form the signal 1508 is essentially taken (in two steps as described above) from tap 2 of the DFE 612, this partial ISI component is associated with the DFE's coefficients $C_2$ through $C_{32}$. It is also noted that, in another embodiment instead of using the two-step computation, this partial ISI component can be directly taken from the DFE 612 at point 1515 and subtracted from signal 37 to form signal 1508.

It is noted that the sequences $V_{0F}, V_{1F}, V_{2F}$ correspond to a hard decision regarding the choice of the best path among the eight paths (path i is the path ending at state i). Thus, the partial ISI component associated with the DFE's coefficients $C_2$ through $C_{32}$ is the result of forcing a hard decision on the group of higher ordered coefficients of the DFE 612. The underlying reason for computing only one partial ISI signal instead of eight complete ISI signals for the eight states (as done conventionally) is to save in computational complexity and to avoid timing problems. In effect, the combination of the DFE and the MDFE of the present invention can be thought of as performing the functions of a group of eight different conventional DFEs having the same tap coefficients except for the first two tap coefficients.

For each state, there remains to determine which path to use for the remaining two Coefficients in a very short interval of time (about 16 nanoseconds). This is done by the use of the convolution engine 1511 and the MDFE 602. It is noted that the convolution engine 1511 can be implemented as an integral part of the MDFE 602. It is also noted that, for each constituent transceiver, i.e., for each 1D component of the Viterbi input 614 (the Viterbi input 614 is practically eight 4D Viterbi inputs), there is only one convolution engine 1511 for all the eight states but there are eight replicas of the select logic 610 and eight replicas of the MUX 1512.

The convolution engine 1511 computes all the possible values for the ISI associated with the coefficients $C_0$ and $C_1$. There are only twenty five possible values, since this ISI is a convolution of these two coefficients with a decision sequence of length 2, and each decision in the sequence can only have five values ($-2, -1, 0, +1, +2$). Only one of these twenty five values is a correct value for this ISI. These twenty five hypotheses of ISI are then provided to the MDFE 602.

In the MDFE 602, the twenty five possible values of ISI are subtracted from the partial ISI compensated signal 1508 using a set of adders connected in parallel. The resulting signals are then saturated to fit in a predetermined range, using a set of saturators. The saturated results are then stored in a set of twenty five registers. Provided that there was no decision error regarding the best path (among the eight paths) forced upon taps 2 through 32 of the DFE 612, one of the twenty five registers would contain one 1D component of the Viterbi input 614 with the ISI correctly cancelled for one of the eight states.

For each of the eight states, the generation of the Viterbi input is limited to selecting the correct value out of these 25 possible values. This is done, for each of the eight states, using a 25-to-1 multiplexer 1512 whose select input is the output of the select logic 610. The select logic 610 receives $V_0^{(i)}$ and $V_1^{(i)}$ (i=0, . . . , 7) for a particular state i from the path memory module 608 of the Viterbi block 1502. The select logic 610 uses a pre-computed lookup table to determine the value of the select signal 622A based on the values of $V_0^{(i)}$ and $V_1^{(i)}$ for the particular state i. The select signal 622A is one component of the 8-component select signal 622 shown in FIG. 6. Based on the select signal 622A, the 25-to-1 multiplexer 1512 selects one of the contents of the twenty five registers as a 1D component of the Viterbi input 614 for the corresponding state i.

FIG. 15 only shows the select logic and the 25-to-1 multiplexer for one state and for one constituent transceiver. There are identical select logics and 25-to-1 multiplexers for the eight states and for each constituent transceiver. In other words, the computation of the 25 values is done only once for all the eight states, but the 25:1 MUX and the select logic are replicated eight times, one for each state. The input 614 to the Viterbi decoder 604 is, as a practical matter, eight 4D Viterbi inputs.

In the case of the DFE 612, however, only a single DFE is needed for practice of the invention. In contrast to alternative systems where eight DFEs are required, one for each of the eight states imposed by the trellis encoding scheme, a single DFE is sufficient since the decision as to which path among the eight is the probable best was made in the Viterbi block and forced to the DFE as a tentative decision. State status is maintained at the Viterbi decoder input by controlling the MDFE output with the state specific signals developed by the 8 select logics (610 of FIG. 6) in response to the eight state specific signals $V_0^{ji}$ and $V_1^{ji}$, i=0, . . . , 7, from the path memory module (608 of FIG. 6). Although identified as a singular DEE, it will be understood that the 4D architectural requirements of the system means that the DFE is also 4D. Each of the four dimensions (twisted pairs) will exhibit their own independent contributions to ISI and these should be dealt with accordingly. Thus, the DFE is singular, with respect to state architecture, when its 4D nature is taken into account.

In the architecture of the system of the present invention, the Viterbi input computation becomes a very small part of the critical path since the multiplexers have extremely low delay due largely to the placement of the 25 registers between the 25:1 multiplexer and the saturators. If a register is placed at the input to the MDFE 602, then the 25 registers would not be needed. However, this would cause the Viterbi input computation to be a larger part of the critical path due to the delays caused by the adders and saturators. Thus, by using 25 registers at a location proximate to the MDFE output instead of using one register located at the input of the MDFE, the critical path of the MDFE and the Viterbi decoder is broken up into 2 approximately balanced components. This architecture makes it possible to meet the very demanding timing requirements of the Gigabit Ethernet transceiver.

Another advantageous factor in achieving high-speed operation for the trellis decoder 38 is the use of heavily truncated representations for the metrics of the Viterbi decoder. Although this may result in a mathematically non-zero decrease in theoretical performance, the resulting vestigial precision is nevertheless quite sufficient to support healthy error margins. Moreover, the use of heavily truncated representations for the metrics of the Viterbi decoder greatly assists in achieving the requisite high operational speeds in a gigabit environment. In addition, the reduced precision facilitates the use of random logic or simple lookup tables to compute the squared errors, i.e., the distance metrics, consequently reducing the use of valuable silicon real estate for merely ancillary circuitry.

Figure 16:
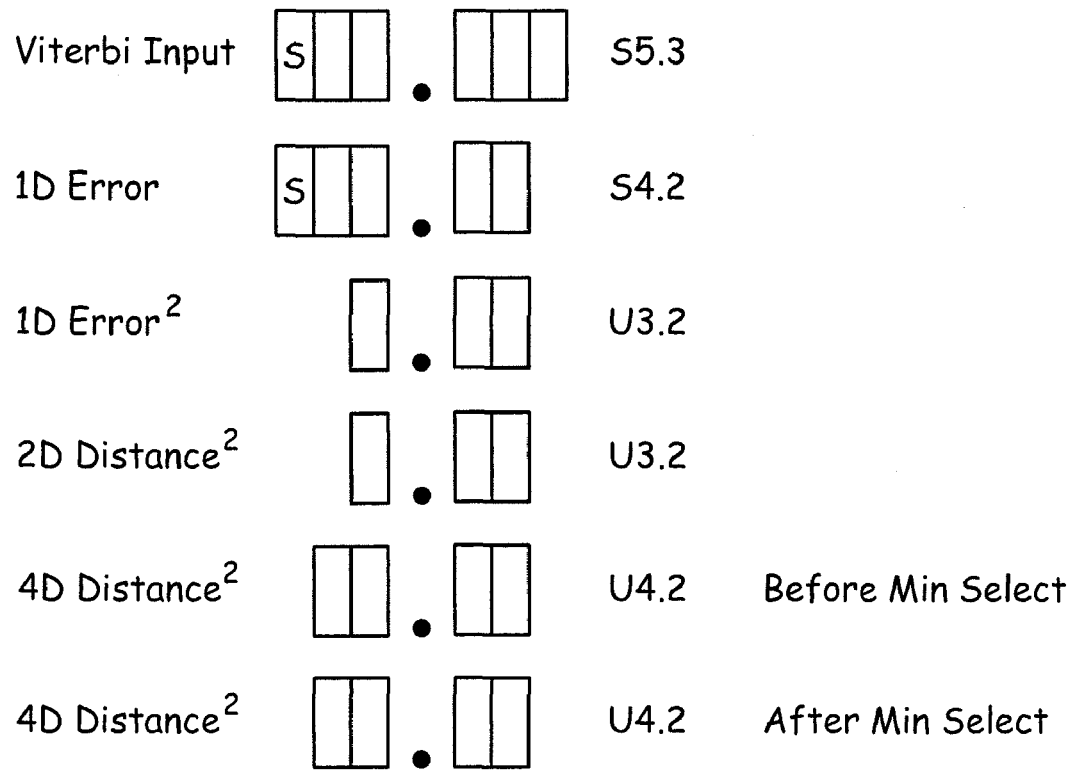
FIG. 16 shows the word lengths used in one embodiment of this invention.

FIG. 16 shows the word lengths used in one embodiment of the Viterbi decoder of this invention. In FIG. 16, the word lengths are denoted by S or U followed by two numbers separated by a period. The first number indicates the total number of bits in the word length. The second number indicates the number of bits after the decimal point. The letter S denotes a signed number, while the letter U denotes an unsigned number. For example, each 1D component of the 4D Viterbi input is a signed 5-bit number having 3 bits after the decimal point.

FIG. 17 shows an exemplary lookup table that can be used to compute the squared 1-dimensional errors. The logic function described by this table can be implemented using read-only-memory devices, random logic circuitry or PLA circuitry. Logic design techniques well known to a person of ordinary skill in the art can be used to implement the logic function described by the table of FIG. 17 in random logic.

FIGS. 18A and 18B provide a more complete table describing the computation of the decisions and squared errors for both the X and Y subsets directly from one component of the 4D Viterbi input to the 1D slicers (FIG. 7). This table completely specifies the operation of the slicers of FIG. 7.

FIG. 7 (or 8) through 14 describe the operation of the Viterbi decoder in the absence of the pair-swap compensation circuitry of the present invention.

The trellis code constrains the sequences of symbols that can be generated, so that valid sequences are only those that correspond to a possible path in the trellis diagram of FIG. 5. The code only constrains the sequence of 4-dimensional code-subsets that can be transmitted, but not the specific symbols from the code-subsets that are actually transmitted. The IEEE 802.3ab Standard specifies the exact encoding rules for all possible combinations of transmitted bits.

From the point of view of the present invention, one important observation is that this trellis code does not tolerate pair swaps. If, in a certain sequence of symbols generated by a transmitter operating according to the specifications of the 1000BASE-T standard, two or more wire pairs are interchanged in the connection between transmitter and receiver (this would occur if the order of the pairs is not properly maintained in the connection), the sequence of symbols received by the decoder will not, in general, be a valid sequence for this code. In this case, it will not be possible to properly decode the sequence.

If a pair swap has occurred in the cable connecting the transmitter to the receiver, the Physical Coding Sublayer PCS) 204R (FIG. 2) will be able to detect the situation and determine what is the correct pair permutation needed to ensure proper operation. The incorrect pair permutation can be detected because, during startup, the receiver does not use the trellis code, and therefore the four pairs are independent.

During startup, the detection of the symbols is done using a symbol-by-symbol decoder instead of the trellis decoder. To ensure that the error rate is not excessive as a result of the use of a symbol-by-symbol decoder, during startup the transmitter is only allowed to send 3-level symbols instead of the usual 5-level symbols (as specified by the 1000BASE-T standard). This increases the tolerance against noise and guarantees that the operation of the transceiver can start properly. Therefore, the PCS has access to data from which it can detect the presence of a pair swap. The pair swaps must be corrected before the start of normal operation which uses 5-level symbols, because the 5-level data must be decoded using the trellis decoder, which cannot operate properly in the presence of pair swaps. However, the pair swap cannot be easily corrected, because each one of the four pairs of cable typically has a different response, and the adaptive echo 232 (FIG. 2)

and NEXT cancellers 230 (FIG. 2), as well as the Decision Feedback Equalizers 612 (FIG. 6) used in the receiver. This means that simply reordering the 4 components of the 4-dimensional signal presented to the trellis decoder will not work.

One solution, as shown in FIG. 2 with the use of pair-swap MUX 224, is to reorder the 4 components of the signal at the input of the receiver and restart the operation from the beginning, which requires a reset and retrain of all the adaptive filters. The signals have are multiplexed at the input of the receiver. The multiplexers are shown in FIG. 2 as pair-swap MUX 224. The number of multiplexers needed is further increased by the presence of feedback loops such as the Automatic Gain Control (AGC) 220 and Timing Recovery 222 (FIG. 2). These loops typically require that not only the signals in the direct path be swapped, but also the signals in the reverse path be unswapped in order to maintain the integrity of the feedback loops. Although not explicitly shown in FIG. 2, there are multiplexers in the Timing Recovery 222 for unswapping signals in the reverse path.

Although, for four wire pairs, there are 24 possible cases of pair permutations, in practice, it is not necessary for the receiver to compensate for all these 24 cases because most of these cases would cause the Auto-Negotiation function to fail (Auto-Negotiation is described in detail in the IEEE 802.3 standard). Since the gigabit Ethernet operation can only start after the Auto-Negotiation function has completed, the 1000BASE-T transceiver only needs to deal with those cases of pair permutations that would allow Auto-Negotiation to complete.

Figure 19:
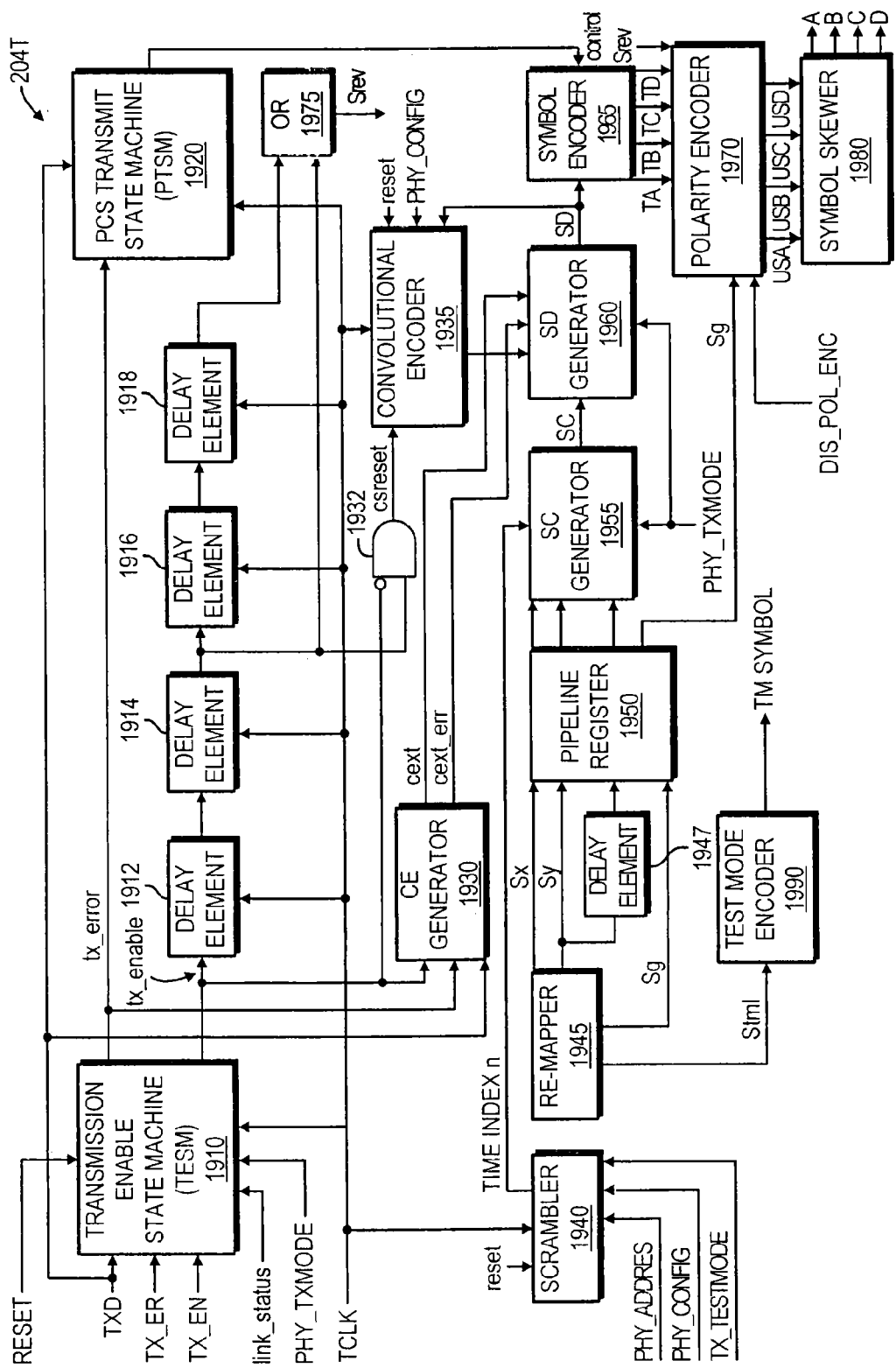
FIG. 19 shows a block diagram of the PCS transmitter.

FIG. 19 shows a block diagram of the PCS transmitter 204T shown in FIG. 2. The PCS transmitter 204T includes a transmission enable state machine (TESM) 1910, a PCS transmit state machine (PTSM) 1920, four delay elements 1912, 1914, 1916, and 1918, a carrier extension generator (CEG) 1930, a cs reset element 1932, a convolutional encoder 1935, a scrambler 1940, a remapper 1945, a delay element 1947, a pipeline register 1950, an SC generator 1955, and SD generator 1960, a symbol encoder 1965, a polarity encoder 1970, a logic element 1975, a symbol skewer 1980, and a test mode encoder 1990.

The TESM 1910 receives the transmitter data (TXD), a transmitter error (TX_ER) signal, a transmitter enable (TX_EN) signal, a link status signal, a transmitter clock (TCLK) signal, a physical transmission mode (PHY_TX-MODE) signal, and a reset (RST signal. The TESM generates a state machine transmitter error (SMTX_ER) signal, a state machine transmitter enable (SMTX_EN) signal. The TESM 1910 uses the TCLK signal to synchronize and delay the TX_ER and TX_EN signals to generate the SMTX_ER and SMTX_EN signals. The SMTX_EN signal represents the variable tx_enable$_n$ as described in the IEEE standard. The TESM 1910 checks the link status signal to determine if the link is functional or not. If the link is operational, the TESM 1910 proceeds to generate the SMTX_ER and SMTX_EN signals. If the link is down or not operational, the TESM 1910 de-asserts the signals SMTX_ER and SMTX_EN to block any attempt to transmit data. The TESM 1910 is reset upon receipt of the RST signal.

The four delay elements 1912, 1914, 1916, and 1918 delay the SMTX_EN to provide the delay tx_enable$_{n-2}$ and tx_enable$_{n-4}$ to be used in generating the csreset$_n$ and the Srev$_n$ signals. In one embodiment, the four delay elements 1912, 1914, 1916, and 1918 are implemented as flip-flops or in a shift register clocked by the TCLK signal.

The PTSM 1920 is a state machine that generates control signals to various elements in the PCS transmitter 204T The PTSM 1920 receives the transmit data TXD, the SMTX_ER signal from the TESM 1910, the TCLK signal, and the RST signal.

The CEG 1930 generates the carrier extension (cext) and carrier extension error (cext_err) signals using the TXD, the SMTX_ER and the SMTX_EN signals. In one embodiment, the cext signal is set equal to the SMTX_ER signal when the SMTX_EN signal is de-asserted and the TXD is equal to 0x0F; otherwise, cext signal is zero. The cext_err signal is equal to the SMTX_ER signal when the SMTX_EN signal is de-asserted and the TXD is equal to 0x0F; otherwise, the cext_err signal is equal to zero. The cext and cext_err signals are used by the SD generator 1960 in generating the Sd data.

The cs_reset element 1932 provides the csreset signal to the convolutional encoder 1935 and the CEG 1930. The csreset signal corresponds to the csreset$_0$ variable described in the IEEE standard. In one embodiment, the cs_reset element 1932 is a logic circuit that implements the function:

$$\text{csreset}_n = (\text{tx\_enable}_{n-2}) \text{ AND } (\text{NOT tx\_enable}_n)$$

The convolutional encoder 1935 receives the SD data from the SD generator 1960, the TCLK signal, and the RST signal to generate the cs$_n$ signal.

The scrambler 1940 performs the side-stream scrambling as described in the IEEE standard. The scrambler 1940 receives a physical address (PHY_ADDRESS) signal, a physical configuration (PHY_CONFIG) signal, and a transmitter test mode (TX_TESTMODE) signal, the RST signal, the TCLK signal to generate a time index n signal and thirtthree bits SCR signal. In one embodiment, the scrambler 1940 includes a linear shift register with feedback having thirty three taps. Depending on whether the PHY_CONFIG signal indicates if the PCS is a master or slave, the feedback exit point may be at tap 12 or tap 19. When the TX_TESTMODE signal is asserted indicating the PCS transmitter is in test mode, the scrambler 1940 generates some predetermined test data for testing purposes.

The remapper 1945 generates Sxn, Syn and Sgn signals from the thirty-three SCR signal provided by the scrambler 1940. In addition, the remapper 1945 generates Stm1 signal for testing purposes when the TX_TESTMODE signal is asserted. In one embodiment, the remapper 1945 includes exclusive OR (XOR) gates to generate the 4-bit Sxn, Syn and Sgn signals in accordance to the PCS encoding rules defined by the IEEE standard.

The delay element 1947 delays the Sy$_n$ signal by one clock time to generate the Sy$_{n-1}$ signal to be used in the SC generator 1950. The delay element 1947 may be implemented by a 4-bit register clocked by the TCLK signal. The pipeline register 1950 delays the 4-bit Sx$_n$, Sy$_n$, Sy$_{n-1}$ and Sg$_n$ signals to synchronize the data at appropriate time instants.

The SC generator 1955 receives the synchronized Sx$_n$, Sy$_n$, Sy$_{n-1}$, the time index n and PHY_TXMODE signals to generate an 8-bit Sc signal according to the IEEE standard. The SD generator 1960 receives the Sc signal from the SC generator 1955, the cext and cext_err signals from the CEG 1930, and the cs signals provided by the convolutional encoder 1935 to generate a 9-bit Sd signal according to the IEEE standard.

The symbol encoder 1965 receives the 9-bit Sd signal and the control signals from the PTSM 1920 to generate quinary TA, TB, TC, and TD symbols. In one embodiment, the symbol encoder 1965 is implemented as a look up table (LUT) having entries corresponding to the bit-to-symbol mapping described by the IEEE standard.

The logic element 1975 generates a sign reversal (Srev$_n$) signal using the delay tx_enable$_{n-2}$ and tx_enable$_{n-4}$ as provided by the delay elements 1914 and 1918, respectively. In one embodiment, the logic element 1975 is an OR gate.

The symbol polarity encoder 1970 receives the TA, TB, TC, and TD symbols from the symbol encoder 1965, the Sg signal from the pipeline register 1950, and a disable polarity encode (DIS_POL_ENC) signal to generate 3-bit USA, USB, USC, and USD output signals.

The symbol skewer 1980 receives the USA, USB, USC and USD signals from the polarity encoder 1970 and four PTCLK signals to generate the 3-bit An, Bn, Cn, and Dn signals to be transmitted. The symbol skewer 1980 skews the An, En, On, and Dn by an amount of approximately one-quarter of the TCLK signal period. The symbol skewer 1980 provides a means to distribute the fast transitions of data over one TCLK signal period to reduce peak power consumption and reduce radiated emission which helps satisfy the Federal Communications Commission requirements on limitation of radiated emissions.

The test mode encoder 1990 receives the Stm1 signal from the remapper 1945 to generate test mode symbol for testing purposes.

Figure 20:
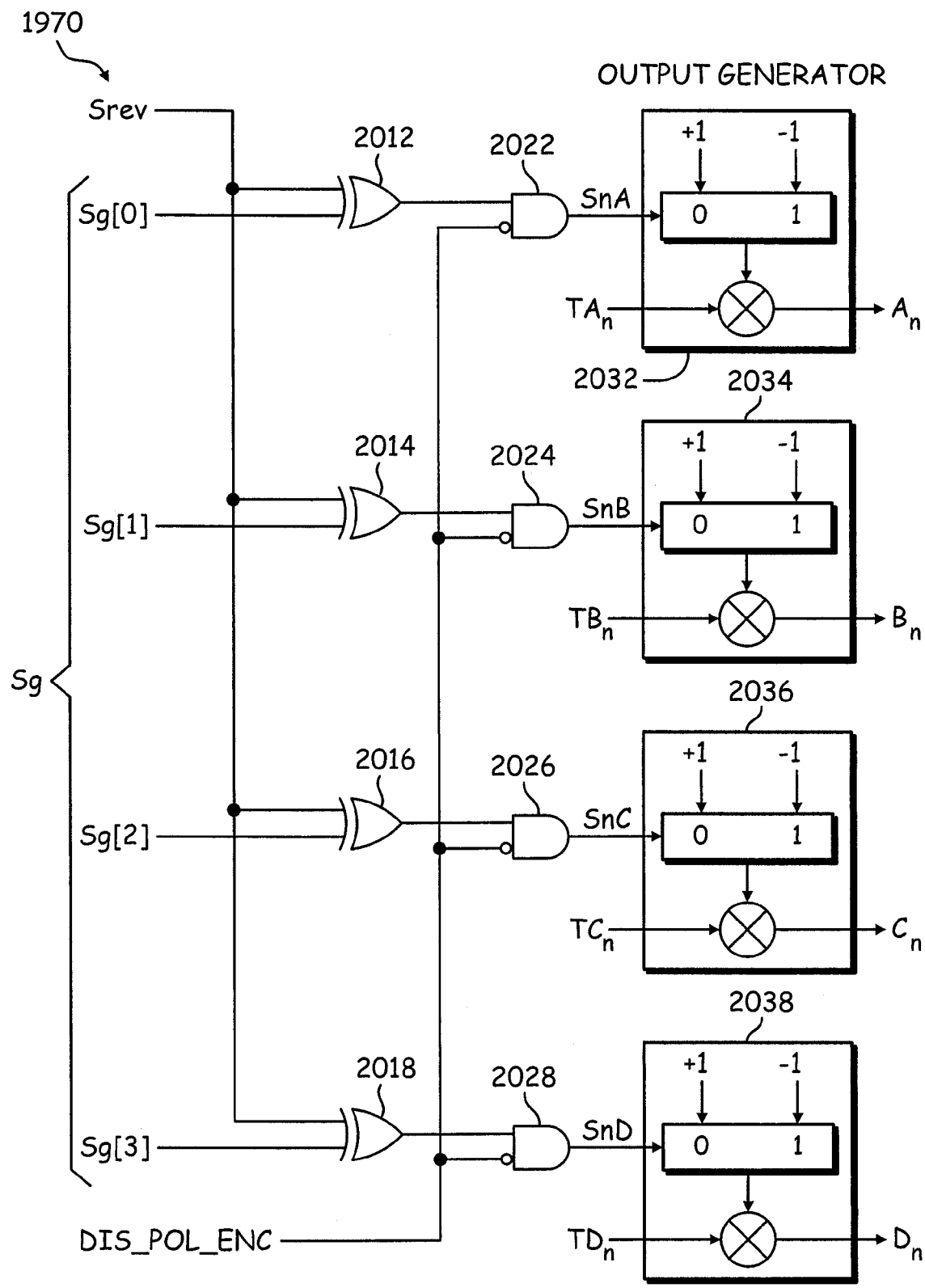
FIG. 20 shows a circuit to encode symbol polarity.

FIG. 20 shows the symbol polarity encoder 1970 as shown in FIG. 19. The symbol polarity encoder 1970 includes four exclusive OR (XOR) gates 2012, 2014, 2016, and 2018, four AND gates 2022, 2024, 2026, and 2028, and four output generators 2032, 2034, 2036, and 2038.

The four XOR gates 2012, 2014, 2016, and 2018 perform exclusive OR function between the Srevn signal and each of the 4 bits of the Sgn, respectively. The four AND gates 2022, 2024, 2026, and 2028 gate the results of the XOR gates 2012, 2014, 2016, and 2018 with the DIS_POL_ENC signal. If the DIS_POL_ENC signal is asserted indicating no polarity encoding is desired, the four AND gates 2022, 2024, 2026, and 2028 generate all zeros. Otherwise, the four AND gates let the results of the four XOR gates 2012, 2014, 2016, and 2018 pass through to become four sign bits SnA, SnB, SnC, and SnD.

Each of the output generators 2032, 2034, 2036, and 2038 generates the output symbols USA, USB, USC, and USD corresponding to the unskewed data to be transmitted. The four output generators 2032, 2034, 2036, and 2038 multiply the TA, TB, TC, and TD signals by +1 or −1 depending on the sign bits SnA, SnB, SnC, and SnD. In one embodiment, each of the output generators include a selector to select −1 or +1 based on the corresponding sign bit Sir/A, SnB, SnC, or SnD, and a multiplier to multiply the 3-bit TA, TB, TC, and TD with the selected +1 or −1. There is a number of ways to implement the output generators 2032, 2034, 2036, and 2038. One way is to use a look-up table having 16 entries where each entry corresponds to the product of the 3-bit TA, TB, TC, or TD with the sign bit. For example, if the selected sign bit is +1 (corresponding to SnA, SnB, SnC, or SnD=0), then the entry is the same as the corresponding TA, TB, TC, or TD If the selected sign bit is −1 (corresponding to SnA, SnB, SnC, or SnD=1), then the entry is the negative of the corresponding TA, TB, TC, or TD Another way is to use logic circuit to realize the logic function of the multiplication with +1 or −1. Since there are only 4 variables (the sign bit and the 3-bit TA, TB, TC, or TD), the logic circuit can be realized with simple logic gates.

Figure 21:
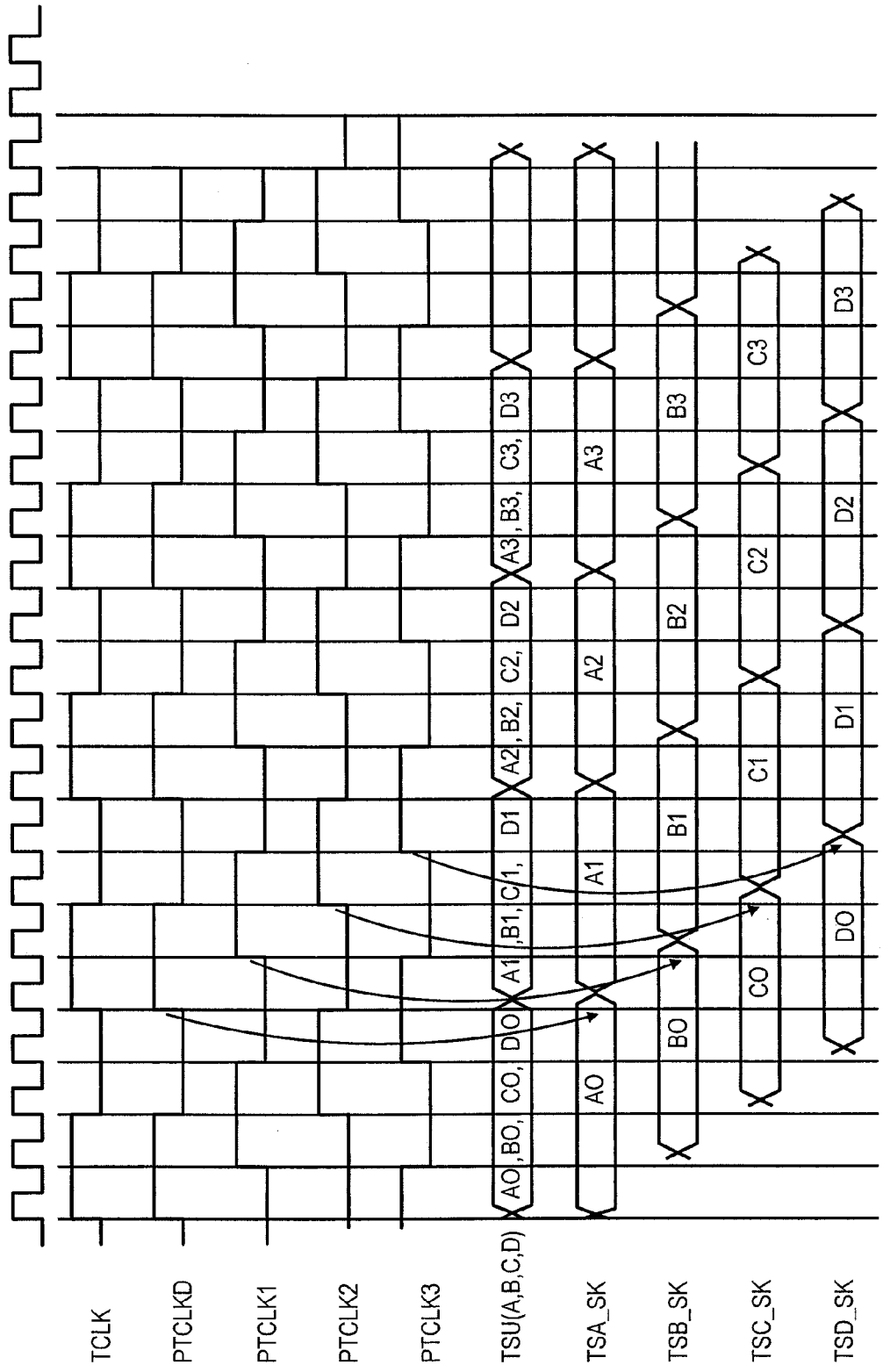
FIG. 21 shows a timing diagram for the symbol skewer.

FIG. 21 shows a timing diagram for the symbol skewer. The timing diagram illustrates the distribution of the TSA, TSB, TSC, and TSD data with respect to the four phases of the TCLK signal. The timing diagram 2600 includes waveforms PTCLK0, PTCLK1, PTCK2, PTCLK3, TSU, TSA_SK, TSB_SK, TSC_SK, and TSD_SK.

The PTCLK0, PTCLK1, PTCK2, and PTCLK3 waveforms are derived from the TCLK signal using the master clock MCLK. Essentially the TCLK, PTCLK0, PTCLK1, PTCK2, and PTCLK3 signals are all divide-by-4 signals from the MCLK with appropriate delay and phase differences. For example, the PTCLK0 may be in phase with the TCLK signal with some delay to satisfy the set up time (or alternatively, the PTCLK0 may be the TCLK), the PTCK1 is delayed by one-quarter clock period from the PTCLK0, the PTCLK2 is delayed by one-quarter clock period from the PTCLK1, and the PTCLK3 is delayed by one-quarter clock period from the PTCLK2.

The TSU waveform represents the unskewed signals TA, TB, TC, and TD, e.g., TSUA, TSUB, TSUC, and TSUD, respectively. The TSU is the result of clocking the TA, TB, TC, and TD signals by the TCLK signal. The TSUA is the same as the TA, or the same as TSA_SK. Then the TSUB, TSUC, and TSUD are clocked by the PTCLK1, PTCLK2, and PTCLK3, respectively, to provide the TSB_SK, TSC_SK, and TSD_SK, respectively. The result of this clocking scheme is that the four signals TA, TB, TC, and TD are skewed by one-quarter clock period with respect to each other.

Figure 22:
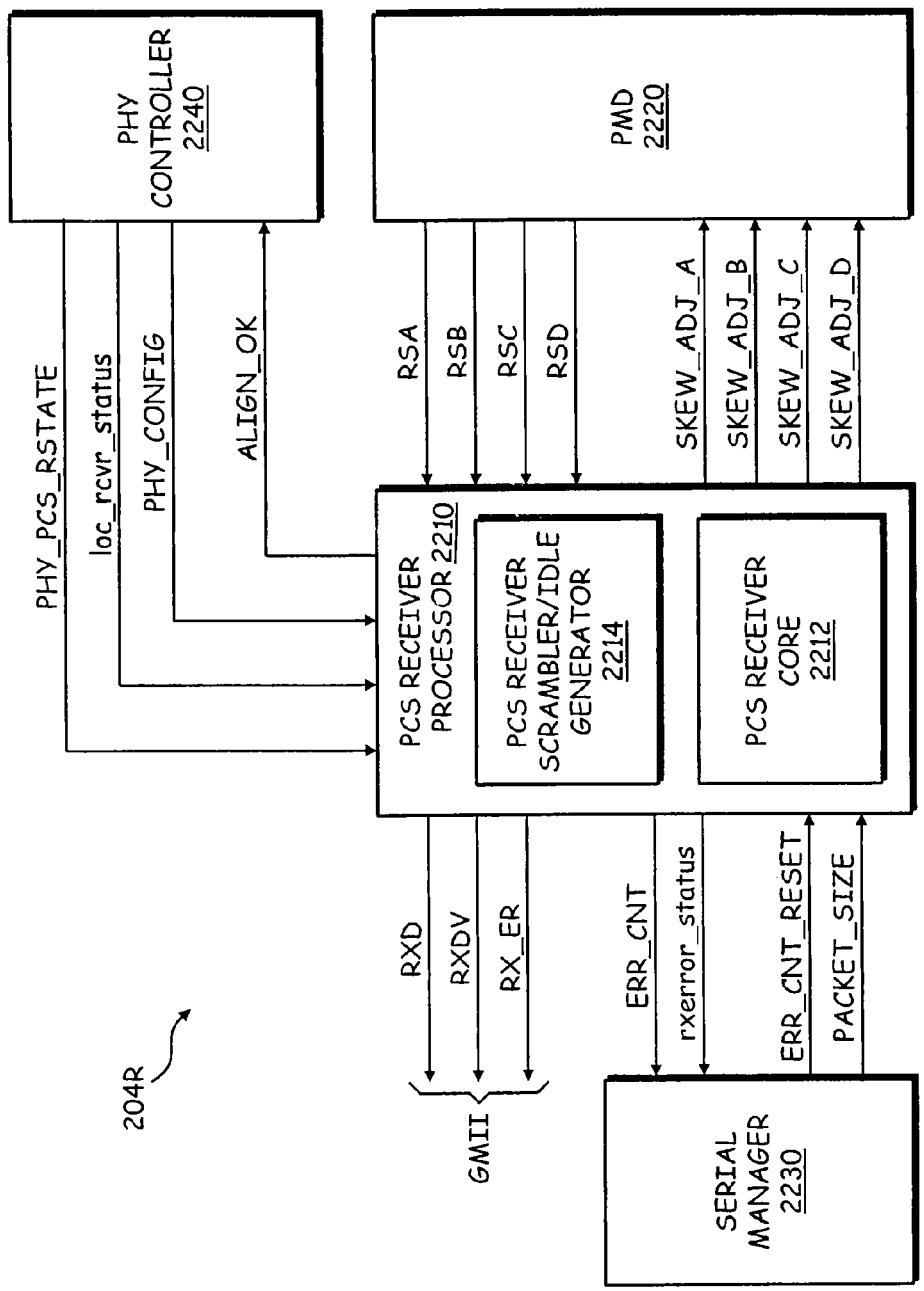
FIG. 22 shows the interface between the PCS receiver and other functional blocks.

FIG. 22 shows the interface between the PCS receiver and other functional blocks of the gigabit transceiver. The PCS receiver 204R includes a PCS receiver processor 2210 and a PMD 2220. Other functional blocks include a serial manager 2230, and a PHY control module 2240.

The PCS receiver processor 2210 performs the processing tasks for receiving the data. These processing tasks include: acquisition of the scrambler state, pair polarity correction, pair swapping correction, pair deskewing, idle and data detection, idle error measurement, sync loss detection, received data generation, idle difference handing, and latency adjustment equalization. The PCS receiver processor 2210 includes a PCS receiver core circuit 2212 and a PCS receiver scrambler/idle generator 2214.

The PCS receiver processor 2210 receives the received symbol (RSA, RSB, RSC, and RSD) signals from the PMD 2220; the error count reset (ERR_CNT_RESET) and the packet size (PACKET_SIZE) signals from the serial manager 2230; PCS receiver state (PHY_PCS_RSTATE), local receiver status (LRSTAT), and PHY configuration (PHY_CONFIG) signals from the PHY controller 2240; and reset and receiver clock (RCLK) signals. The PCS receiver processor 2210 generates four skew adjustment A, B, C and D (SKEW_ADJ_A, SKEW_ADJ_B, SKEW_ADJ_C, and SKEW_ADJ_D) signals to the PMD 2220; received data (RXD), received data valid (RX_DV) indication, and receive enable (RX_EN) indication signals to the receiver GMII 202R; an error count (ERR_CNT) and receiver error status (rxerror_status) to the serial manager 2230; an alignment OK (ALIGN_OK) signal to the PHY control module 2240.

The basic procedure to perform the receiver functions for acquisition and alignment is as follows.

A scrambler generator similar to the PCS transmitter 204T is used to generate the Sx, Sy, Sg, and time index n. An SC generator similar to the SC generator 1955 in the PCS transmitter 204T is used to generate the Sc information. From the Sc information, an idle generator is used to generate idle data for pairs A, B, C, and D. The objective is to generate the expected idle data for each of the pairs A, B, C, and D. The process starts by selecting one of the pairs and generating the expected data for that pair. Then, the received data is compared with the expected data of the selected pair. An error count is maintained to keep track of the number of errors of the matching. In addition to the predetermined amount for maximum number of errors, a maximum amount of time may be used for the matching. If some predetermined time threshold has been used up and the error threshold has not been reached, it may be determined that the received data matches the expected data as generated by the idle generator. Once this pair is acquired, the skew amount is determined according to the rule in the PCS transmitter. In one embodiment, pair A is selected first because, during startup, symbols received from pair A contains information about the state of the scrambler of the remote transmitter. For example, bit 0 in the remote scrambler corresponds to bit 0 on pair A. This is due to the PCS transmit encoding rules specified in the IEEE 802.3ab standard. It is noted that pair A corresponds to the channel 0 as specified in the IEEE 802.3ab standard.

In the PCS transmitter, the timing of pair A is used as the reference for the skew amount of the other pairs, e.g., pair B is one-quarter clock period from pair A, pair C is one-quarter clock period from pair B, and pair D is one-quarter clock period from pair C. Next, the polarity of the detected pair is then corrected. Another error threshold and timer amount is used to determine the correct polarity. During the cycling for polarity correction, the polarity value is complemented for changing polarity because there are only two polarities, coded as 0 and 1.

After pair A is detected and acquired, the timer count is reloaded with the maximum time, the error count is initialized to zero, a skew limit variable is used to determine the amount of skewing so that skew adjust can be found. The polarity variable is initialized, eagle to zero. The next pair is then selected.

In one embodiment, pair D is selected after pair A. The reason for this selection is that, in accordance with the encoding rules of the IEEE 802.3ab standard, symbols from pair D (which corresponds to channel 3 in the IEEE 802.3ab standard), unlike symbols from the other pairs, are devoid of effects of control signals such as loc_rcvr_status, cext_err$_n$ and cext$_n$. This makes it easier to detect pair D than pair B or C.

A skew adjust variable is used to keep track if the skew amount exceeds some predetermined skew threshold. Once the pair D is properly detected and acquired, the skew adjust variable is set to adjust the previously detected pair, in this case pair A. If the skew adjust variables for pair D and pair A exceed the respective maximum amounts, the entire process is repeated from the beginning to continue to acquire pair A.

The acquisition of pair D essentially follows the same procedure as pair A with some additional considerations. The polarity is corrected by complementing the polarity variable for pair D after each subloop. When, after the predetermined time amount, the number of errors is less than the predetermined error threshold, it is determined that pair D has been acquired and detected. The respective skew adjust variables for pairs A and D are held for the next search.

The process then continues for pairs B and pair C. If during the acquisition of these pairs and it is determined that an error has occurred, for example, an amount of errors has exceeded the predetermined threshold within the predetermined time threshold, the entire process is repeated. After all pairs have been reliably acquired, polarity corrected, and skew adjusted, the receiver sends an alignment OK signal.

The alignment function can be performed in a number of ways. Alignment can be lost due to noise at the receiver or due to shut down of the transmitter. In one embodiment, the matching of the received data is performed with idle data. Therefore, if the amount of errors exceeds the error threshold after a predetermined time threshold, a loss of alignment can be declared. In another embodiment, alignment loss can be detected by observing that idle data should be received every so often. Every packet should have some idle time. If after some time and idle data have not been detected or acquired, it is determined that alignment has been lost.

Figure 23:
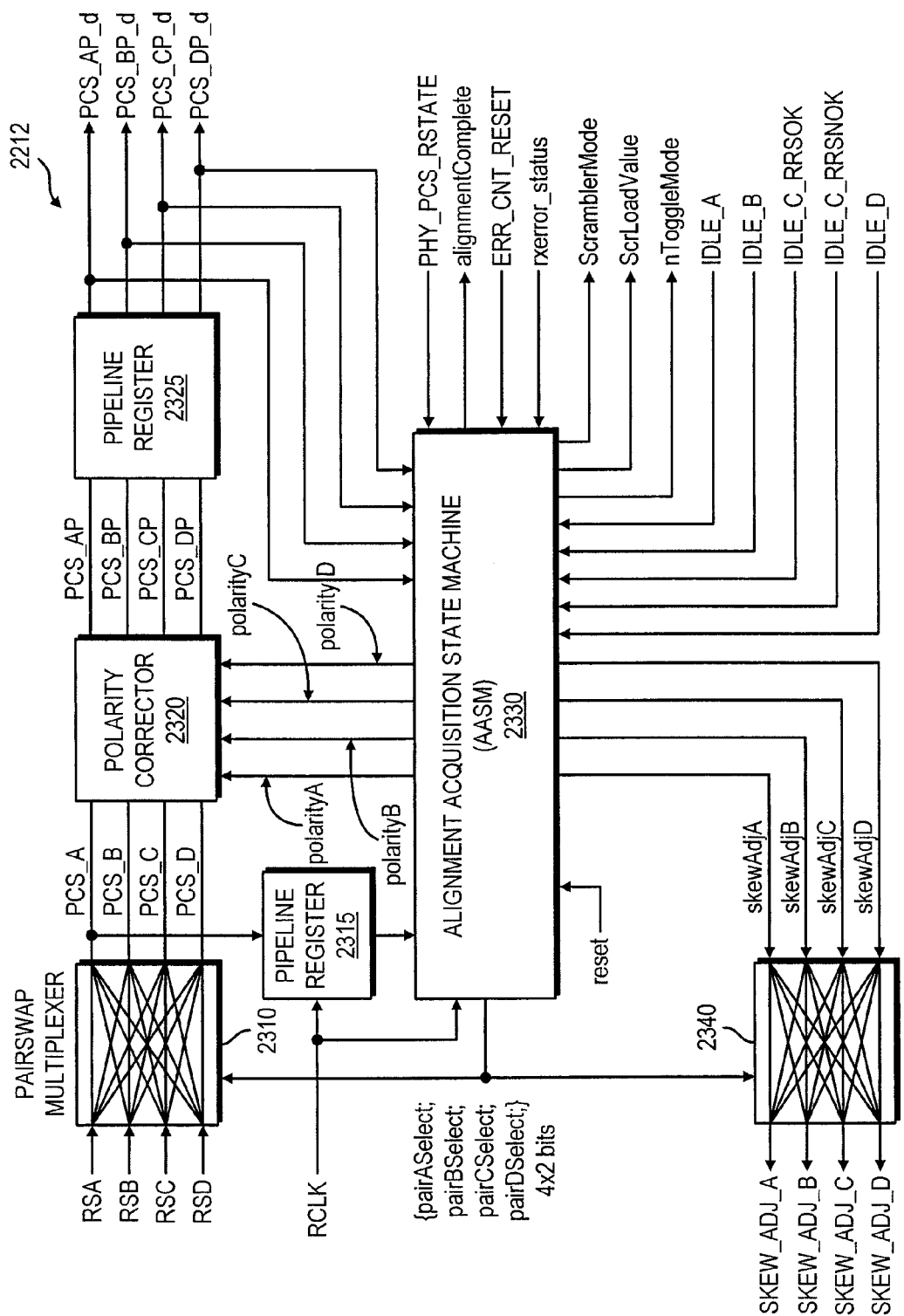
FIG. 23 shows the PCS receiver core circuit.

FIG. 23 shows the PCS receiver core circuit 2212 shown in FIG. 22. The PCS receiver core circuit 2212 includes a pair swap multiplexer 2310, pipeline registers 2315 and 2325, a polarity corrector 2320, an alignment acquisition state machine (AASM) 2330 and a skew adjust multiplexer 2340.

The pair swap multiplexer 2310 receives the RSA, RSB, RSC, and RSD signals from the PMD 2220 (FIG. 22) and the pair select signals from the AASM 2330 to generate corresponding PCS_A, PCS_B, PCS_C, and PCS_D signals to the polarity corrector 2320. The pair swap multiplexer 2310 may be implemented as a crossbar switch which connects any of the outputs to any of the inputs. In other words, any of the PCS_A, PCS_B, PCS_C, and PCS_D signals can be selected from any of the RSA, RSB, RSC, and RSD signals. The pipeline register 2315 is clocked by the RCLK signal to delay the PCS_A signal.

Figure 29:
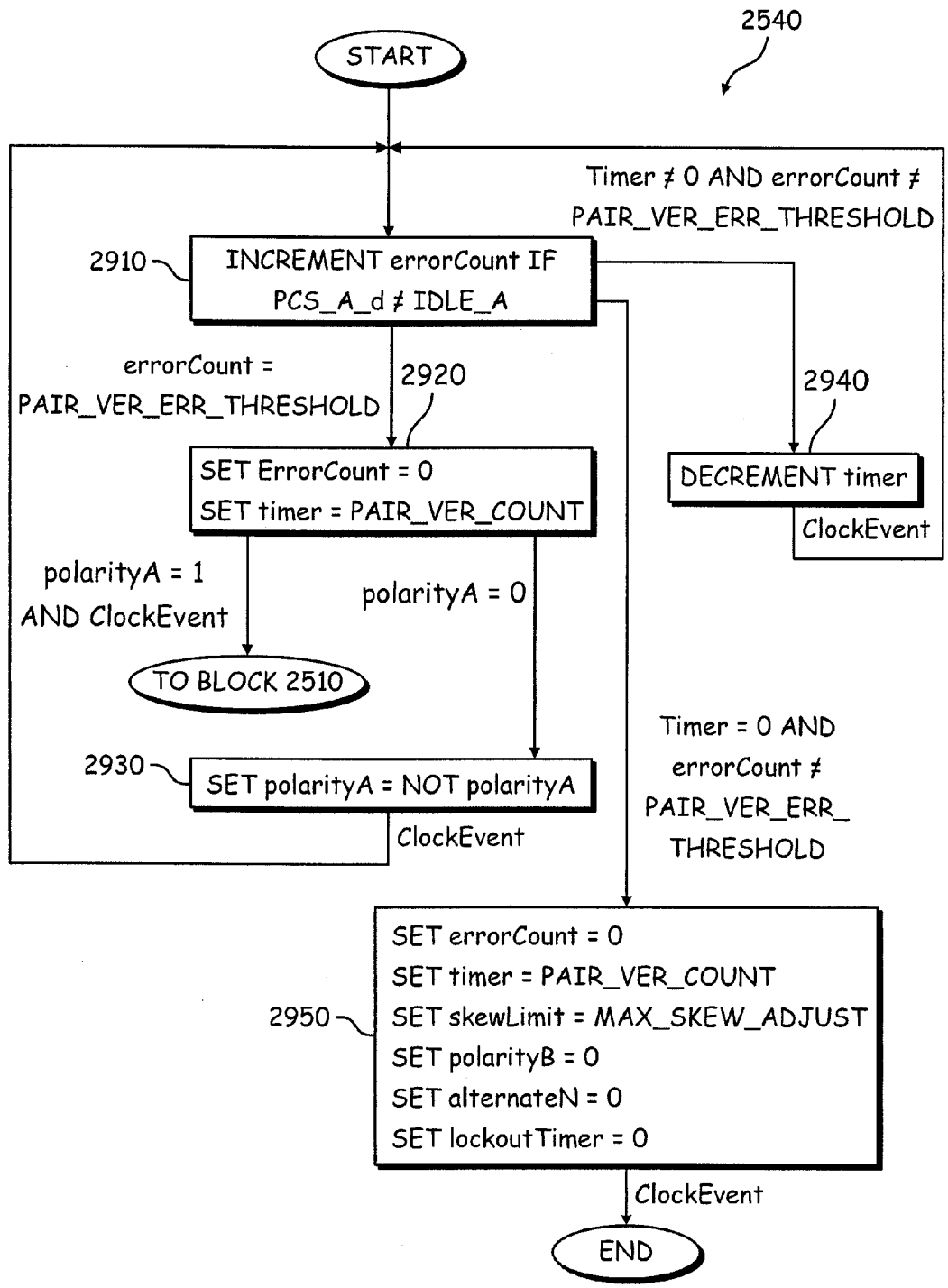
FIG. 29 shows a flowchart for the find pair A block shown in FIG. 25.

The polarity corrector 2320 receives the RSA, RSB, RSC, and RSD signals from the pair swap multiplexer 2310) polarity signals POLA, POLB, POLC, and POLD from the AASM 2330, and a Sg signal from the PCS receiver scrambler/idle generator 2214 (FIGS. 2 and 29). The polarity corrector 2320 corrects the polarity of each of the received signals to provide PCS_AP, PCS_BP, PCS_CP, and PCS_DP signals having correct polarity. The pipeline register 2325 is clocked by the RCLK and delay the PCS_AP, PCS_BP, PCS$_{CP}$, and PCS_DP signals by an appropriate amount to provide PCS_AP_d PCS_BP_d PCS_CP_d, and PCS_DP_d signals, respectively.

The AASM 2330 performs the alignment and acquisition of the received data. The AASM receives the PCS_AP_d, PCS_BP_d, PCS_CP_d, and PCS_DP_d signals from the pipeline register 2325, the idle information (IDLE_A, IDLE_B, IDLE_C_RRSOK, IDLE_C_RRSNOK, IDLE_D) from the PCS receiver scrambler/idle generator 2214 (FIGS. 2 and 29), and other control or status signals. The AASM 2330 generates the skew adjusted signals (skewAdjA, skewAdjB, skewAdjC and skewAdjD) to the skew adjust multiplexer 2340; the scrambler control (scramblerMode, scrLoadValue, and nToggleMode) signals to the PCS receiver scrambler/idle generator 2214. The procedure for the AASM 2330 to perform alignment and acquisition is described in FIG. 30.

The AASM 2330 receives the PHY_PCS_RSTATE signal from the PHY control module 2240. The PHY_PCS_RSTATE signal controls the three main states that the PCS receive function can be in. These three states are:

Do nothing. State 00. In this state, the PCS receive function is held at reset. The scrambler state and n toggle are held at a constant value. The MII signals are held at a default value and the input to the PMD is gated off so that minimal transitions are occurring in the PCS receive function.

Alignment and Acquisition. State 01. In this state, the PCS receive function attempts to acquire or reacquire the correct scrambler state, n toggle state, pair polarity, pair swap, and pair skew. The MII signals are held at a default value. When the synchronization is completed, the ALIGN_OK signal is asserted (e.g., set to 1), the idle counting is initiated and the idle/data state is tracked.

Follow. State 11. In this state, the MII signals are allowed to follow the data/idle/error indications of the received signal. The PCS receive function continually monitors the signal to determine if the PCS is still aligned correctly and if not, the ALIGN_OK signal is de-asserted (e.g., reset to 0) until the alignment is determined to be correct again. The PCS receive function may not attempt to re-align if the alignment is lost. Typically, it waits for the PHY control module 2240 to place the PCS receive into the Alignment and Acquisition state (state 01) first.

The skew adjust multiplexer 2340 provides the skew adjusted signals (SKEW_ADJ_A, SKEW_ADJ_B, SKEW_ADJ_C, and SKEW_ADJ_D) from the skewAdjA, skewAdjB, skewAdjC and skewAdjD signals under the control of the AASM 2330. The skew adjust multiplexer 2340 may be implemented in a similar manner as the pair swap multiplexer 2310. In other words, any of the SKEW_ADJ_A, SKEW_ADJ_B. SKEW_ADJ_C, and SKEW_ADJ_D signals can be selected from any of the skewAdjA, skewAdjB, skewAdjC and skewAdjD signals.

Figure 24:
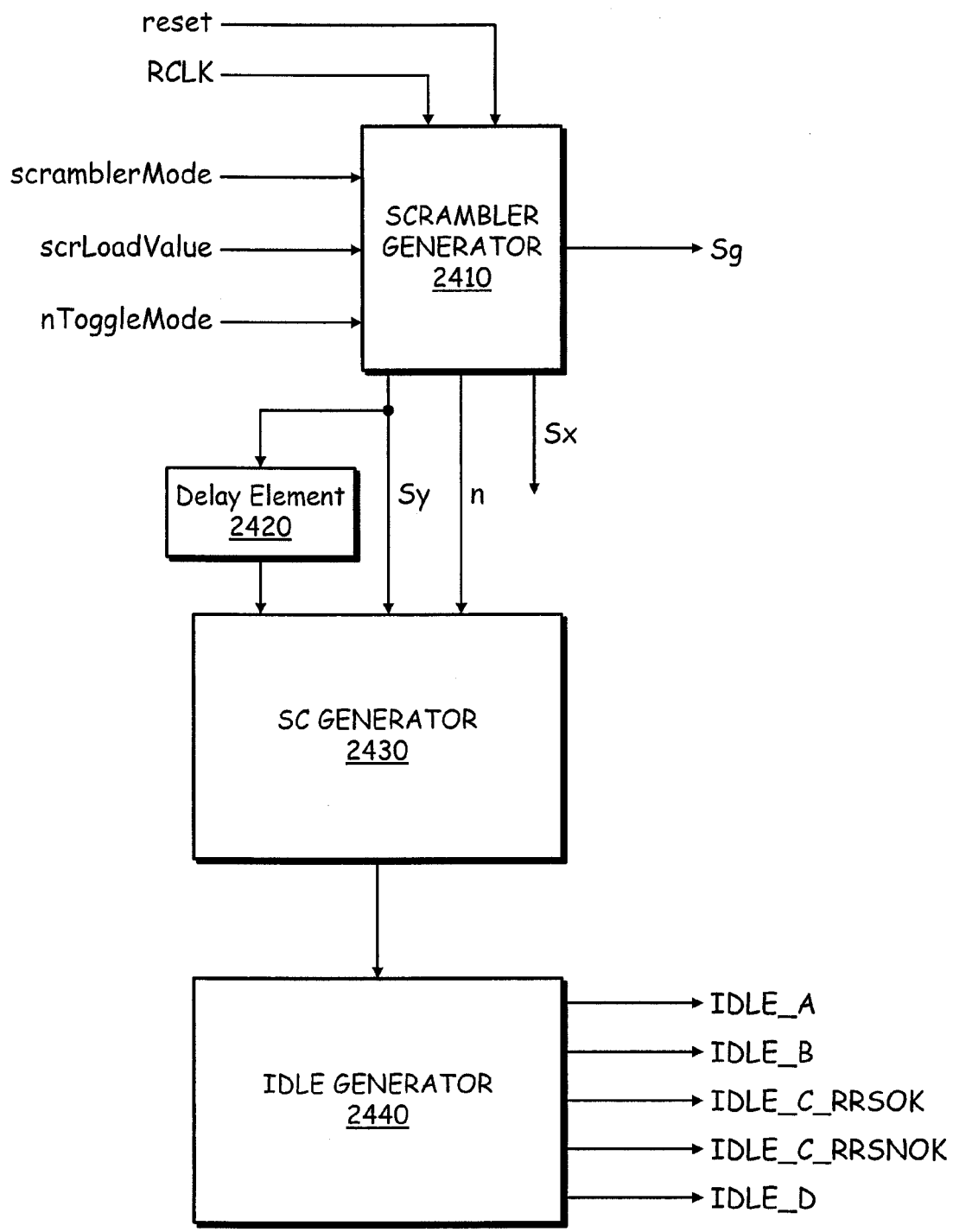
FIG. 24 shows the PCS receiver scrambler and idle generator.

FIG. 24 shows the PCS receiver scrambler and idle generator 2214 (shown in FIG. 22). The PCS receiver scrambler and idle generator 2214 includes a scrambler generator 2410, a delay element 2420, a SC generator 2430, and an idle generator 2440. Essentially the PCS receiver scrambler and idle generator 2214 regenerates the scrambler information and the Sc signal the same way as the PCS transmitter so that the correct received data can be detected and acquired.

The scrambler generator 2410 generates the Sy, Sx, Sg, and the time index n using the encoding rules for the PCS transmitter 204T as described in the IEEE standard. The scrambler generator 2410 receives the control signals scramblerMode, scrLoadValue, and nToggleMode from the AASM 2330, the RCLK and the reset signals. The delay element 2420 is clocked by the RCLK to delay the Sy signal by one clock period. The SC generator 2430 generates the Sc signal. The idle generator 2440 receives the Sc signal and generates the idle information (IDLE_A, IDLE_B, IDLE_C_RRSOK, IDLE_C_RRSNOK, IDLE_D) to the AASM 2330 (FIG. 23).

Figure 25:
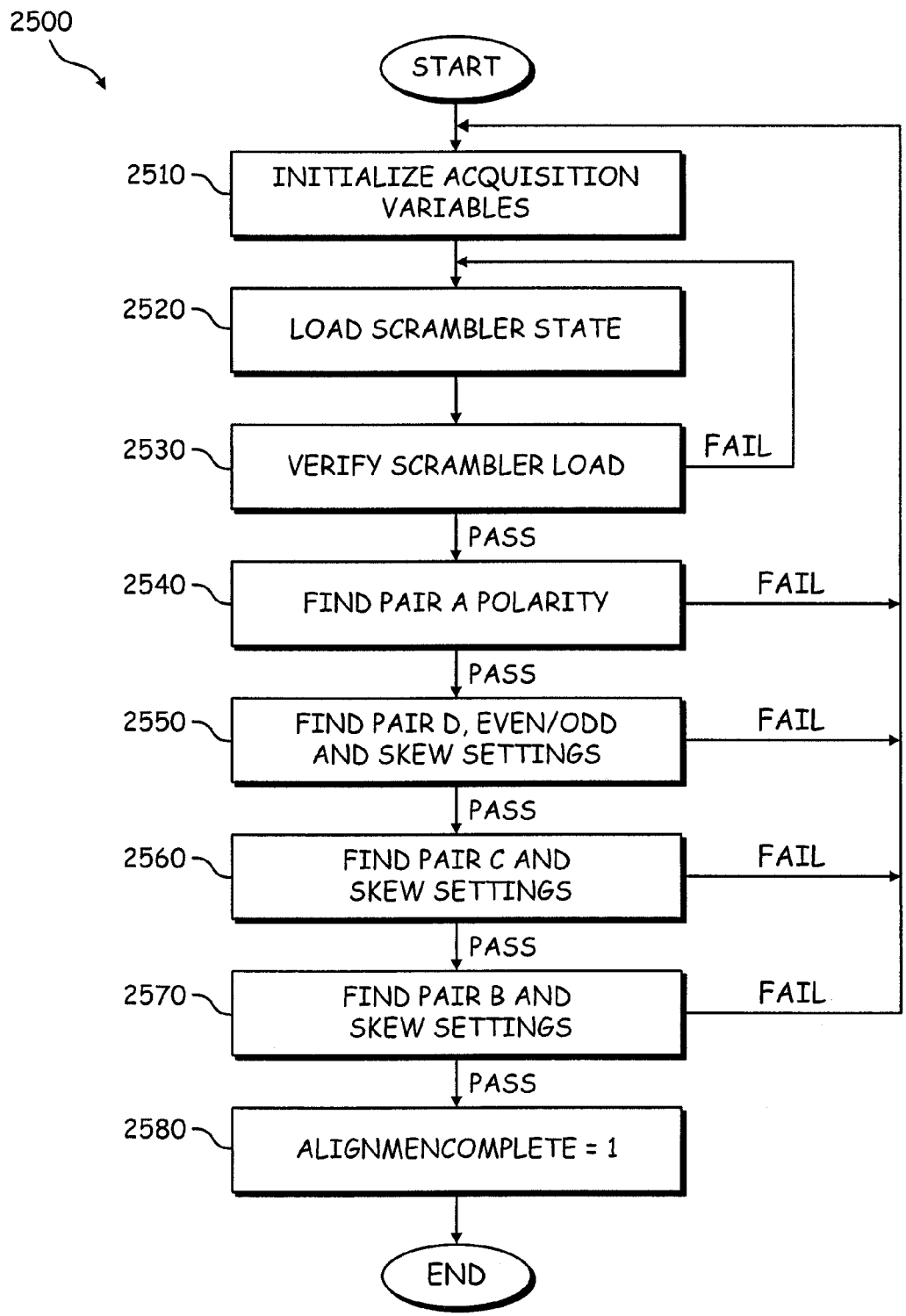
FIG. 25 shows a flowchart for the alignment acquisition procedure used in the PCS receiver.

FIG. 25 shows a flowchart for the alignment acquisition process 2500 used in the PCS receiver.

Upon START, the process 2500 initializes the acquisition variables such as the pair selection, the skew adjust and the polarity for each pair (Block 2510). Then, the process 2500 loads the scrambler state to start generating scrambler information (Block 2520). Then, the process 2500 verifies the scrambler load to determine if the loading is successful (Block 2530). If the scrambler loading fails, the process 2500 returns to block 2520. Otherwise, the process 2500 starts finding pair A and its polarity (Block 2540). If pair A cannot be found after some number of trials or after some maximum time, the process 2500 returns to block 2510 to start the entire process 2500 again. Otherwise, the process 2500 proceeds to find pair D, even/odd indicator, and skew settings (Block 2550). If pair D cannot be found and/or there is any other failure condition, the process 2500 returns to block 2510 to start the entire process 2500 again. Otherwise, the process proceeds to find pair C and the skew settings (Block 2560). If pair C cannot be found and there is any other failure condition, the process 2500 returns to block 2510 to start the entire process 2500 again. Otherwise, the process proceeds to find pair B and skew settings (Block 2570). If pair B cannot be found and/or there is any other failure condition, the process 2500 returns to block 2510 to start the entire process 2500 again. Otherwise, the process 2500 proceeds to generate the alignment complete signal (Block 2580). The process 2500 is then terminated.

Figure 26:
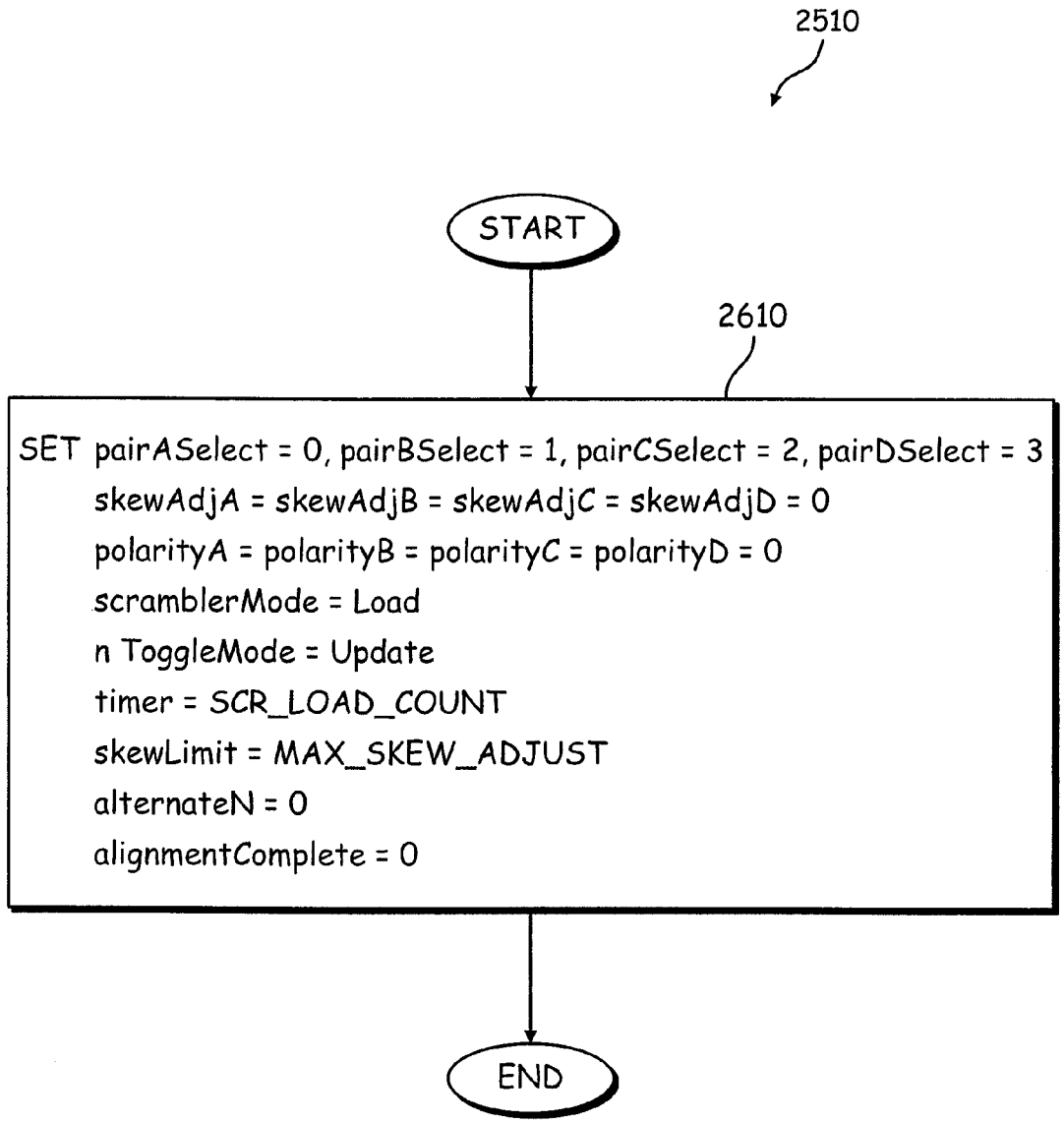
FIG. 26 shows a flowchart for the initialization block shown in FIG. 25.

FIG. 26 shows a flowchart for the process 2510 to initialize acquisition variables as shown in FIG. 25.

Upon START, the process 2510 sets the acquisition variables to their corresponding initial values (Block 2610). The process 2510 assigns the select control word to the select variables to select the received data and the generated skew adjust data (e.g., the skewAdjA, skewAdjB, skewAdjC and skewAdjD signals as shown in FIG. 23). These select control words are initialized as t0 pairASelect=0, pairBSelect=1, pairCSelect=2, and pairDSelect=3. Then, the process 2510 initializes the skew adjust variables and the polarity data to zero. These variables and data are updated in subsequent operations. Next, the process 2510 sets the scramblerMode variable to Load and the nToggleMode bit to Update. Then, the process 2510 initializes the timer, skewlimit, alternateN and alignmentComplete variables to a SCR load count (SCL_LOAD_COUNT) value, a maximum skew adjust (MAX_SKEW_ADJUST) value, zero, and zero, respectively. The process 2510 is then terminated or returns to the main process 2500.

Figure 27:
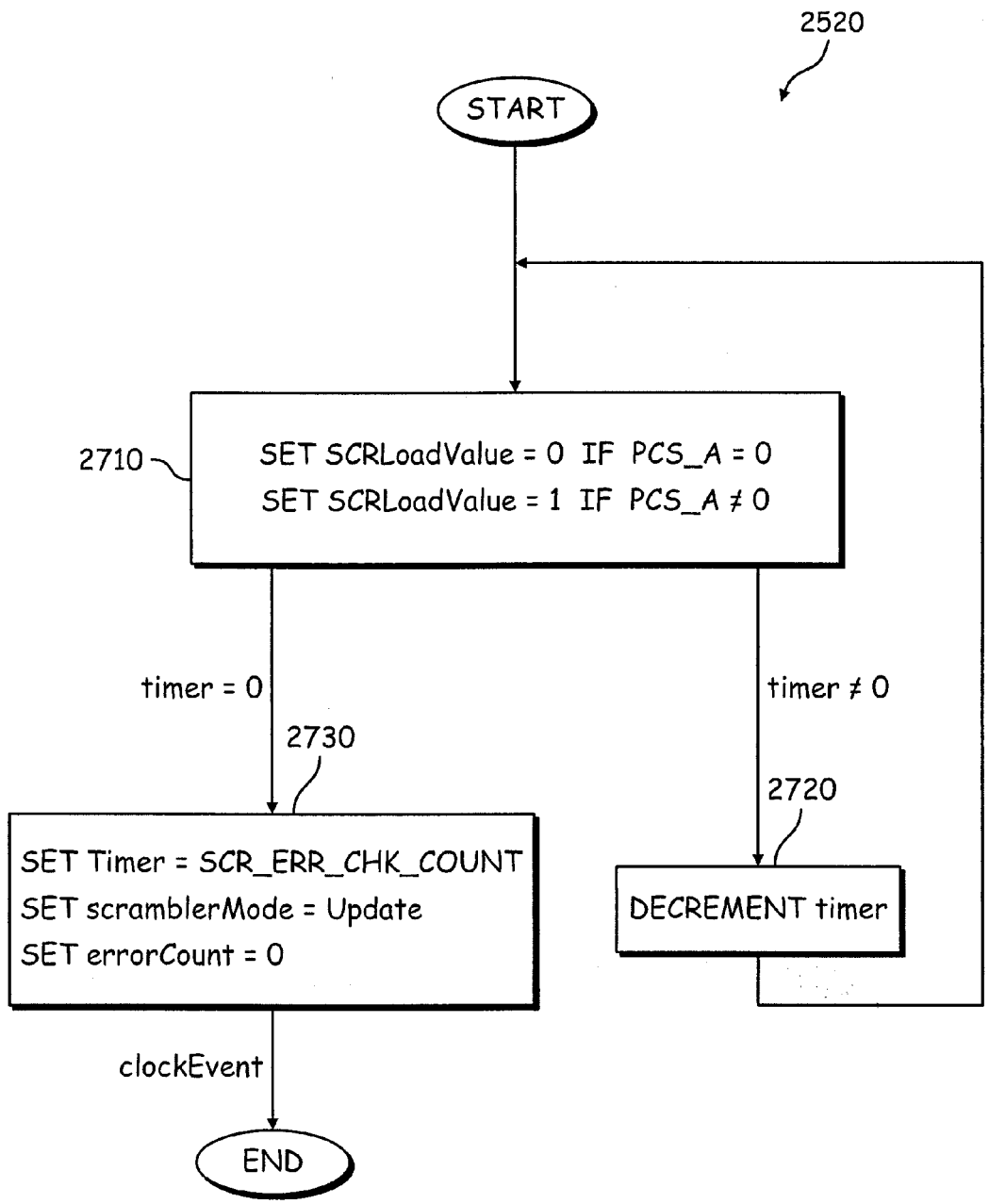
FIG. 27 shows a flowchart for the load scrambler state block shown in FIG. 25.

FIG. 27 shows a flowchart for the process 2520 (FIG. 25) to load scrambler state. The process 2520 follows the process 2510 (described in FIG. 26).

Upon START, the process 2520 loads the value scrLoadvalue into the scrambler generator 1910 as shown in FIG. 19 at each clock time (Block 2710). The process 2520 does this by determining if the PCS_A is equal to zero. If it is, the variable scrLoadValue is loaded with zero. Otherwise, scrLoadValue is loaded with 1. Then the process 2520 determines if the timer is equal to zero. If the timer is not equal to zero, the process 2520 decrements the timer by 1 (Block 2720) and returns to block 2710 in the next clock. If the timer is equal to zero, the process 2520 loads a predetermined value SCR error check count (SCR_ERR_CHK_COUNT) into the timer, sets the scramblerMode variable to Update, and initializes the errorCount variable to zero (Block 2730). The process 2520 is then terminated or returns to the main process 2500.

Figure 28:
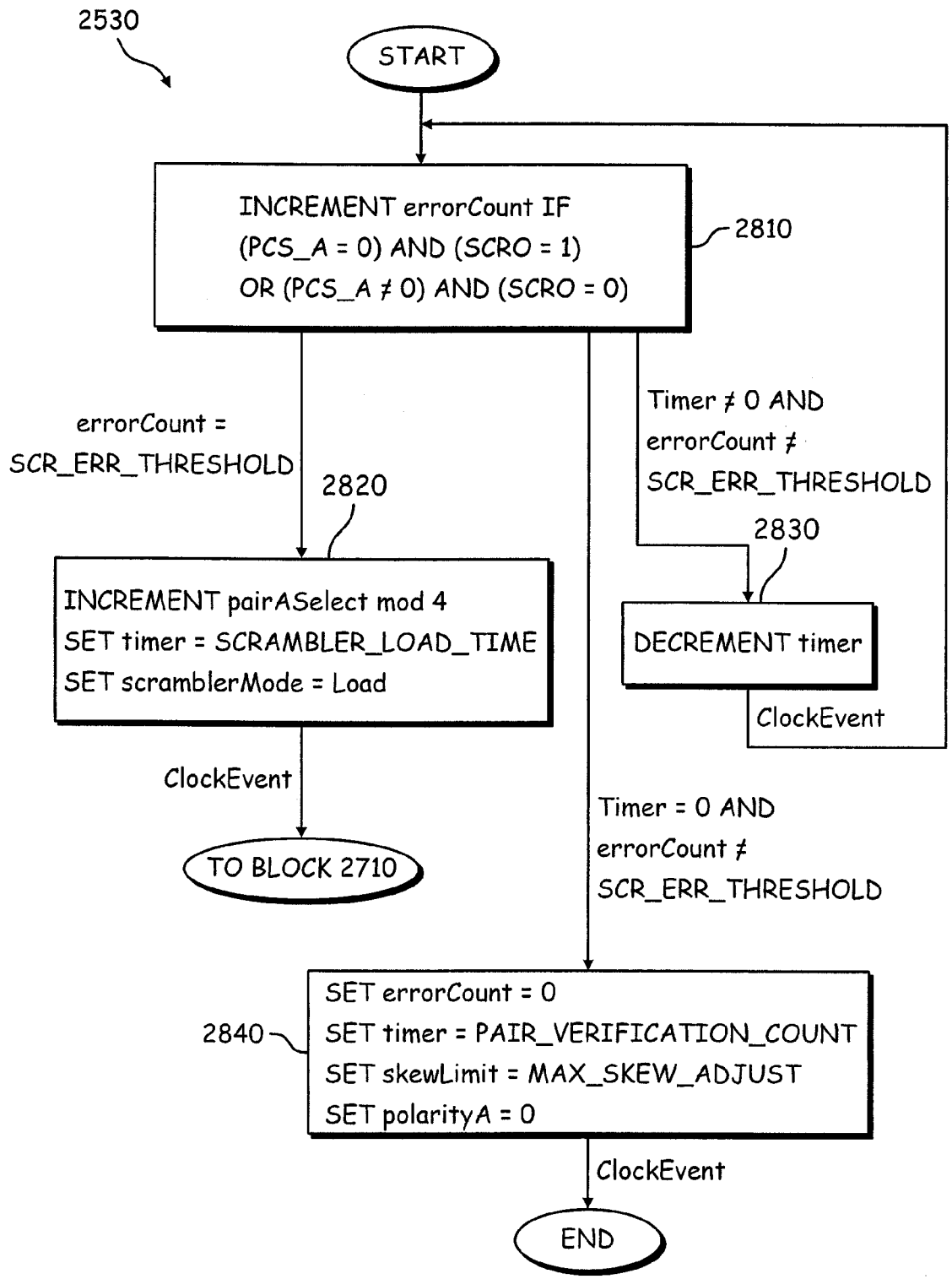
FIG. 28 shows a flowchart for the verify scrambler block shown in FIG. 25.

FIG. 28 shows a flowchart for the process 2530 (shown in FIG. 25) to verify scrambler. The process 2530 follows the process 2520 (described in FIG. 27).

Upon START, the process 2530 checks for error by verifying the loaded scrambler state values with the PCS_A value (Block 2810). If the PCS_A value and the Scr0 are not the same, then the errorCount is incremented by 1. The process 2530 then examines the errorCount and timer values.

If the errorCount is equal to a predetermined SCR error threshold (SCR_ERR_THERSHOLD), then the process 2530 increments the pairASelect by 1 mod 4, loads a predetermined scrambler load time value (SCRAMBLER_LOAD_TIME) into the timer, and sets the scramblerMode to Load (Block 2820). This is to cycle the idle generator to the next expected pair. In the next clock, the process 2530 returns back to block 2710 of process 2520 (FIG. 27) to start loading the scrambler state.

If the timer is not equal to zero, the process 2530 decrements the timer by 1 (Block 2830) and returns to block 2810 in the next clock period. If the timer is equal to zero and the errorCount is not equal to SCR_ERR_THRESHOLD, it is determined that the received data match the expected data of the selected pair, in this case pair A, the process 2530 resets the errorCount to zero, loads a predetermined pair verification count (PAIR_VERIFICATION_COUNT) value into the timer, sets a skewLimit variable to a predetermined maximum skew adjust MAX_SKEW_ADJUST) value, and resets the polarityA variable to zero (Block 2840). Then, the process 2530 is terminated or return to the main process 2500 in the next clock period.

FIG. 29 shows a flowchart for a process 2540 (FIG. 25) to find pair A. The process 2540 follows the process 2530 as shown in FIG. 28.

Upon START, the process 2540 checks for error by determining if the PCS_A_d is the same as the IDLE_A value as provided by the scrambler generator 2214 (FIG. 22). If they are not the same, the errorCount is incremented by 1 (Block 2910). Then, the process 2540 examines the errorCount and timer values.

If the errorCount is equal to a predetermined pair verification error threshold (PAIR_VER_ERR_THRESHOLD) value, the process 2540 resets the errorCount to zero and sets the timer to a predetermined pair verification count (PAIR_VER_COUNT) (Block 2920). The process 2540 then examines the polarityA variable. If the polarityA variable is equal to 1, the process 2540 goes back to block 2510 (FIG. 25) to start the entire process 2500 again. If the polarityA variable is equal to zero, the process 2540 complements the polarityA variable; in other words, polarityA is set to 1 if it is 0 and is set to 0 if it is equal to 1 (Block 2930). Then, the process 2540 returns to block 2910 in the next clock.

If the timer is not equal to zero, the process 2540 decrements the timer by 1 (Block 2940) and returns to block 2910 in the next clock.

If the timer is equal to zero and the errorCount is not equal to PAIR_VER_ERR_THRESHOLD, the process 2540 resets the errorCount to zero, sets the timer to PAIR_VER_COUNT, sets the skewLimit to MAX_SKEW_ADJUST, and sets the polarityD, alternateN, and lockoutTimer all to zero (Block 2950). Then, the process 2540 is terminated or returns to the main process 2500.

Figure 30:
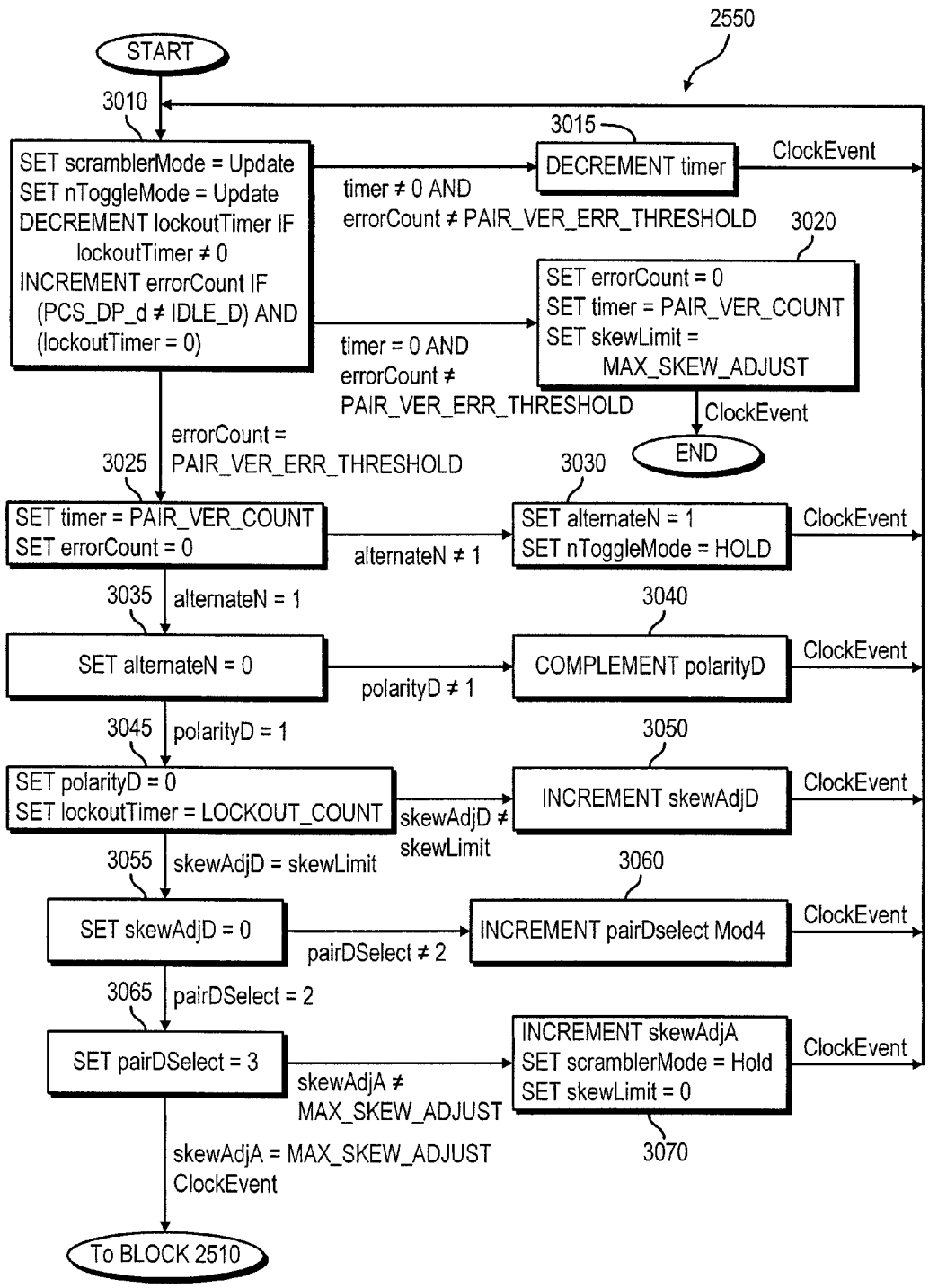
FIG. 30 shows a flowchart for the find pair D block shown in FIG. 25.

FIG. 30 shows a flowchart for a process 2550 (FIG. 25) to find pair D, even/odd and skew settings.

Upon START, the process 2550 sets scramblerMode to Update, nToggleMode to Update, checks for lockoutTimer and error (Block 3010). If lockoutTimer is not equal to zero, the process 2550 increments lockoutTimer by 1. If lockoutTimer is equal to zero and PCS_DP_d is not the same as IDLED, then the process 2550 increments errorCount by 1. Then, the process 2550 examines the timer and errorCount variables.

If errorCount is equal to PAIR_VER_ERR_THRESHOLD, the process 2550 goes to block 3025. If timer is equal to zero and errorCount is not equal to PAIR_VER_ERR_THRESHOLD, the process 2550 sets errorCount to zero, sets timer to PAIR_VER_COUNT, and sets skewLimit to MAX_SKEW_ADJUST (Block 3020) and is then terminated or returns to the main process 2500 in the next clock. If timer is not equal to zero, the process 2550 decrements timer by 1 (Block 3015) and returns to block 3010 in the next clock.

In block 3025, the process 2550 sets timer to PAIR_VER_COUNT and errorCount to zero. Then, the process 2550 examines alternateN. If alternateN is equal to zero, the process 2550 sets alternateN to 1 and nToggleMode to Hold (Block 3030). Then the process 2550 returns to block 3010 in the next clock. If alternateN is equal to 1, the process 2550 sets alternateN to zero (Block 3035). Then, the process 2550 examines polarityD.

If polarityD is equal to zero, the process 2550 complements polarityD (Block 3040). Then, the process 2550 returns to block 3010 in the next clock. If polarityD is equal to 1, the process 2550 sets polarityD to zero and lockoutTimer to LOCKOUT_COUNT (Block 3045). Then, the process 2550 examines skewAdjD.

If skewAdjD is not equal to skewlimit, the process 2550 increments skewAdjD by 1 (Block 3050). Then, the process 2550 returns to block 3010 in the next clock. If skewAdjD is equal to skewLimit, the process 2550 sets skewAdj to zero (Block 3055) and then examines pairDSelect.

If pairDSelect is not equal to 2, the process 2550 increments pairDSelect by 1 mod 4 (Block 3060) and then returns to block 3010 in the next clock. If pairD Select is equal to 2, the process sets pairDSelect to 3 (Block 3065) and then examines skewAdjA.

If skewAdjA is not equal to MAX_SEW-ADJUST, the process 2550 increments skewAdj A by 1, sets scramblerMode to Hold, and sets skewLimit to zero (Block 3070). The process 2550 then returns to block 3010 in the next clock. If skewAdjA is equal to A_SKEW_ADJUST, the process 2550 returns to block 2510 in the next clock.

Figure 31:
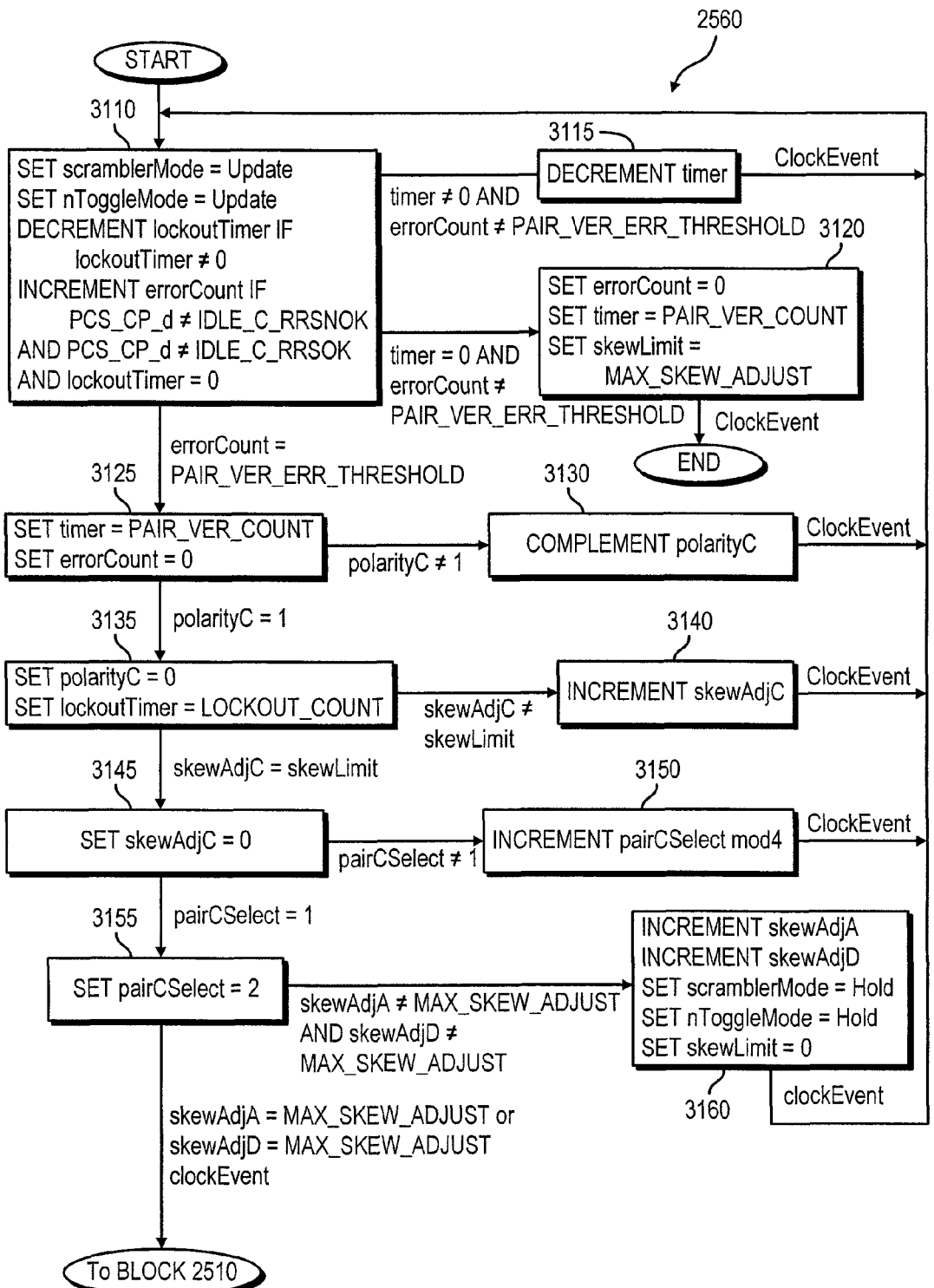
FIG. 31 shows a flowchart for the find pair C block shown in FIG. 25.

FIG. 31 shows a flowchart for a process 2560 (FIG. 25) to find pair C and skew settings. The process 2560 follows the process 2550 (shown in FIG. 30).

Upon START, the process 2560 sets scramblerMode to Update and nToggleMode to Update, and examines lockoutTimer and PCS_CP$_d$ (Block 3110). If lockoutTimer is not equal to zero, the process 2560 decrements lockoutTimer by 1. If PCS_CP_d is not equal to IDLE_C_RRSNOK and PCS_CP_d is not equal to IDLE_C_RRSOK and lockoutTimer is equal to zero, the process 2560 increments errorCount by 1. Then, the process 2560 examines errorCount and timer.

If errorCount is equal to PAIR_VER_ERR_THRESHOLD, the process 2560 goes to block 3125. If timer is equal to zero and errorCount is not equal to PAIR_VER_ERR_THRESHOLD, the process 2560 sets errorCount to zero, sets timer to PAIR_VER_COUNT, and sets skewLimit to MAX_SKEW_ADJUST (Block 3120). Then the process 2560 is terminated or returns to the main process 2500 in the next clock. If timer is not equal to zero, the process 2560 decrements timer by 1 (Block 3115) and then returns to block 3110 in the next clock.

In block 3125, the process 2560 sets timer to PAIR_VER_COUNT and errorCount to zero (Block 3125) and examines polarityC. If polarityC is equal to zero, the process 2560 complements polarityC (Block 3130) and then returns to block 3110 in the next clock. If polarityC is equal to 1, the process 2560 sets polarityC to zero and sets lockoutTimer to LOCKOUT_COUNT (Block 3135). Then, the process 2560 examines skewAdjC.

If skewAdjC is not equal to skewLimit, the process 2560 increments skewAdjC by 1 (Block 3140) and then returns to block 3110 in the next clock. If skewAdjC is equal to skewLimit, the process 2560 sets skewAdjC to zero (Block 3145) and then examines pairCSelect.

If pairCSelect is not equal to 1, the process 2560 increments pairCSelect by 1 mod 4 (Block 3150) and then returns to block 3110 in the next clock. If pairCSelect is equal to 1, the process 2560 sets pairCSelect to 2 (Block 3155) and then examines skewAdjA and skewAdjD.

If skewAdjA is not equal to MAX_SKEW_ADJUST and skewAdjD is not equal to MAX_SKEW_ADJUST, the process 2560 increments skewAdjA by 1, increments skewAdjD by 1, sets scramblerMode to Hold, sets nToggleMode to Hold, and sets skewLimit to zero (Block 3160). Then, the process 2560 returns to block 3110 in the next clock. If skewAdjA or skewAdjD is equal to MAX_SKEW_ADJUST, the process 2560 goes back to block 2510 in the main process 2500.

Figure 32:
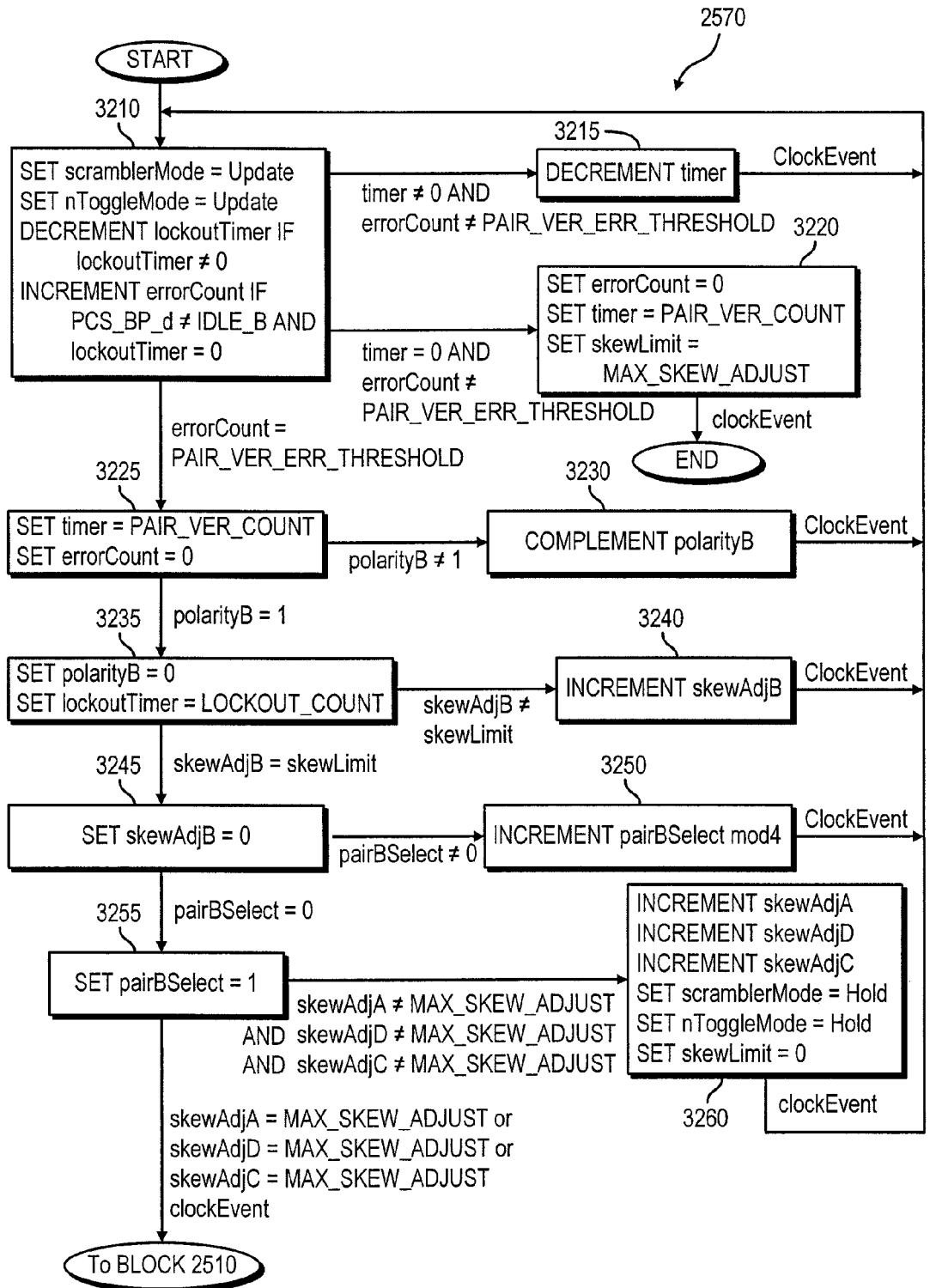
FIG. 32 shows a flowchart for the find pair B block shown in FIG. 25.

FIG. 32 shows a flowchart for a process 2570 to find pair B and skew settings as shown in FIG. 25.

Upon START, the process 2570 sets scramblerMode to Update and nToggleMode to Update, and examines lockoutTimer and PCS_CP_d (Block 3110). If lockoutTimer is not equal to zero, the process 2570 decrements lockoutTimer by 1. If PCS_BP_d is not equal to IDLE_B and lockoutTimer is equal to zero, the process 2570 increments errorCount by 1. Then, the process 2570 examines errorCount and timer.

If errorCount is equal to PAIR_VER_ERR_THRESHOLD, the process 2570 goes to block 3225. If timer is equal to zero and errorCount is not equal to PAIR_VER_ERR_THRESHOLD, the process 2570 sets errorCount to zero, sets timer to PAIR_VER_COUNT, and sets skewLimit to MAX_SKEW_ADJUST Flock 3220). Then the process 2570 is terminated or returns to the main process 2500 in the next clock. If timer is not equal to zero, the process 2570 decrements timer by 1 (Block 3215) and then returns to block 3210 in the next clock.

In block 3225, the process 2570 sets timer to PAIR_VER_COUNT and errorCount to zero (Block 3225) and examines polarityB. If polarityB is equal to zero, the process 2570 complements polarityB (Block 3230) and then returns to block 3310 in the next clock. If polarityB is equal to 1, the process 2570 sets polarityB to zero and sets lockoutTimer to LOCKOUT_COUNT (Block 3235). Then, the process 2570 examines skewAdjB.

If skewAdjB is not equal to skewLimit, the process 2570 increments skewAdjB by 1 (Block 3240) and then returns to block 3210 in the next clock. If skewAajB is equal to skewLimit, the process 2570 sets skewAdjB to zero (Block 3245) and then examines pairBSelect.

If pairBSelect is not equal to 0, the process 2570 increments pairBSelect by 1 mod 4 (Block 3250) and then returns to block 3210 in the next clock. If pairBSelect is equal to 0, the process 2570 sets pairBSelect to 1 (Block 3255) and then examines skewAdjA, skewAdjD, and skewAdjC.

If skewAdjA is not equal to MAX_SKEW_ADJUST and skewAdjD is not equal to MAX_SKEW_ADJUST, and skewAdjC is not equal to MAX_SKEW_ADJUST, the process 2570 increments skewAdjA by 1, increments skewAdjD by 1, increments skewAdjC by 1, sets scramblerMode to Hold, sets nToggleMode to Hold, and sets skewLimit to zero (lock 3260). Then, the process 2570 returns to block 3210 in the next clock. If skewAdjA or skewAdjD or skewAdjC is equal to MAX_SKEW_ADJUST, the process 2570 goes back to block 2510 in the main process 2500.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A receiver operable to receive quinary symbols encoded according to encoding parameters, the symbols being skewed with respect to each other by respective skew intervals, the receiver comprising:
   a physical coding sublayer (PCS) receiver encoder generator operable to regenerate at least a portion of the encoding parameters; and
   a PCS receiver core circuit operable to generate skew adjustment signals for adjusting the skew intervals of the quinary encoded symbols in response to at least a portion of the regenerated encoding parameters.

2. The apparatus of claim 1 wherein the PCS receiver core circuit comprises:
   a pair swap multiplexer to swap the symbols according to a pair select word; and
   an alignment and acquisition state machine (AASM) coupled to the pair swap multiplexer to acquire the swapped symbols.

3. The apparatus of claim 2 wherein the symbols include a codegroup of first, second, third, and fourth symbols, each of the symbols having a polarity and a skew setting, the skew setting corresponding to a respective one of the skew intervals.

4. The apparatus of claim 3 wherein the PCS receiver encoder generator comprises:
   a scrambler generator to generate scrambling parameters upon being loaded with a load value, the scrambler generator providing a scrambler output;
   a scrambled code (SC) generator coupled to the scrambler generator to generate an SC parameter from the scrambling parameters; and
   an idle generator coupled to the SC generator to generate idle codewords representative of the four symbols transmitted in an idle mode using the SC parameter, the idle codewords corresponding to the encoding parameters.

5. The apparatus of claim 4 wherein the AASM comprises an initialization state, a scrambler load state, a scrambler verification state, and a symbol find state.

6. The apparatus of claim 5 wherein the initialization state initializes acquisition variables.

7. The apparatus of claim 5 wherein the scrambler load state loads the load value to the scrambler generator based on one of the swapped symbols.

8. The apparatus of claim 5 wherein the scrambler verification state compares one of the swapped symbols with the scrambler output.

9. The apparatus of claim 5 wherein the symbol find state compares one of the swapped symbols with one of the idle codewords.

10. The apparatus of claim 9 wherein the symbol find state generates a failure condition if one of the swapped symbols is not matched with one of the idle codewords after a predetermined number of comparisons.

11. The apparatus of claim 10 wherein the AASM returns to the initialization state when the failure condition occurs.

12. In a receiver arranged to receive quinary symbols encoded according to encoding parameters, the symbols being skewed with respect to each other by respective skew intervals, a method comprising the operations of:
   regenerating at least a portion of the encoding parameters; and
   decoding the quinary encoded symbols in response to at least a portion of the regenerated encoding parameters.

13. The method of claim 12 wherein the operation of decoding the symbols comprises the operations of:
   swapping the symbols according to a pair select word; and
   acquiring the swapped symbols.

14. The method of claim 13 wherein the symbols include a codegroup of first, second, third, and fourth symbols, each of the symbols having a polarity and a skew setting, the skew setting corresponding to a respective one of the skew intervals.

15. The method of claim 14 wherein the operation of regenerating the encoding parameters comprises the operations of:
   generating scrambling parameters upon being loaded by a load value;
   providing a scrambler output;
   generating a scrambled code (SC) parameter from the scrambling parameters; and generating idle codewords representative of the four symbols transmitted in an idle mode using the SC parameter, the idle codewords corresponding to the encoding parameters.

16. The method of claim 15 wherein the operation of acquiring the symbols comprises the operations of:
initializing acquisition variables;
loading the load value based on one of the swapped symbols;
comparing one of the swapped symbols with the scrambler output;
comparing one of the swapped symbols with one of the idle codewords;
generating a failure condition if one of the swapped symbols is not matched with one of the idle codewords after a predetermined number of comparisons; and
returning to initializing when the failure condition occurs.

17. A system comprising:
a medium independent interface;
a communication medium including a plurality of twisted pair cables; and
a receiver coupled to the medium independent interface and the communication medium, the receiver being operable to receive quinary symbols encoded according to encoding parameters, the symbols being skewed with respect to each other by respective skew intervals, the receiver comprising:
a PCS receiver encoder generator operable to regenerate at least a portion of the encoding parameters; and
a physical coding sublayer (PCS) receiver core circuit operable to generate skew adjustment signals for adjusting the skew intervals of the quinary encoded symbols in response to at least a portion of the regenerated encoding parameters.

18. The system of claim 17 wherein the PCS receiver core circuit comprises:
a pair swap multiplexer to swap the symbols according to a pair select word; and
an alignment and acquisition state machine (AASM) coupled to the pair swap multiplexer to acquire the swapped symbols.

19. The system of claim 18 wherein the symbols include a codegroup of first, second, third, and fourth symbols, each of the symbols having a polarity and a skew setting, the skew setting corresponding to a respective one of the skew intervals.

20. The system of claim 19 wherein the PCS receiver encoder generator comprises:
a scrambler generator to generate scrambling parameters upon being loaded by a load value, the scrambler generator providing a scrambler output;
a scrambled code (SC) generator coupled to the scrambler generator to generate an SC parameter from the scrambling parameters; and
an idle generator coupled to the SC generator to generate idle codewords representative of the four symbols transmitted in an idle mode using the SC parameter, the idle codewords corresponding to the encoding parameters.

21. The system of claim 20 wherein the AASM comprises an initialization state, a scrambler load state, a scrambler verification state, and a symbol find state.

22. The system of claim 21 wherein the initialization state initializes acquisition variables.

23. The system of claim 21 wherein the scrambler load state loads the load value to the scrambler generator based on one of the swapped symbols.

24. The system of claim 21 wherein the scrambler verification state compares one of the swapped symbols with the scrambler output.

25. The system of claim 21 wherein the symbol find state compares one of the swapped symbols with one of the idle codewords.

26. The system of claim 25 wherein the symbol find state generates a failure condition if one of the swapped symbols is not matched with one of the idle codewords after a predetermined number of comparisons.

27. The system of claim 26 wherein the AASM returns to the initialization state when the failure condition occurs.

* * * * *